United States Patent [19]
Gorokhovsky

[11] Patent Number: 5,587,207
[45] Date of Patent: Dec. 24, 1996

[54] ARC ASSISTED CVD COATING AND SINTERING METHOD

[76] Inventor: Vladimir I. Gorokhovsky, 2 Laxton Avenue, Apartment 212, Toronto, Ontario, Canada, M6K 1K9

[21] Appl. No.: 518,830

[22] Filed: Aug. 24, 1995

Related U.S. Application Data

[63] Continuation-in-part of Ser. No. 338,844, Nov. 14, 1994, Pat. No. 5,478,608.

[51] Int. Cl.$^6$ ............................................. H05H 1/02
[52] U.S. Cl. ................... 427/571; 118/50; 118/719; 118/721; 118/723 E; 118/723 MA; 118/723 MW; 118/723 VE; 427/212; 427/249; 427/255.2; 427/294; 427/575; 427/577; 427/580; 427/585
[58] Field of Search .................... 427/571, 575, 427/294, 577, 580, 585, 595, 598, 249, 255.2, 212; 118/719, 721, 723 VE, 723 MW, 723 MA, 723 E, 50

[56] References Cited

U.S. PATENT DOCUMENTS

| | | | |
|---|---|---|---|
| 3,253,944 | 5/1966 | Wurster | 117/100 |
| 3,630,677 | 12/1971 | Angus | 23/209.1 |
| 4,430,184 | 2/1984 | Mularie | 204/192 |
| 4,471,003 | 9/1984 | Cann | 427/34 |
| 4,471,004 | 9/1984 | Kim | 427/88 |
| 4,487,161 | 12/1984 | Hirata et al. | 118/723 |
| 4,487,162 | 12/1984 | Cann | 118/723 |
| 4,487,163 | 12/1984 | Jobert et al. | 119/1 |
| 4,555,611 | 11/1985 | Moll | 219/121 |
| 4,682,564 | 7/1987 | Cann | 118/620 |
| 4,682,565 | 7/1987 | Carrico | 118/719 |
| 4,724,058 | 2/1988 | Morrison, Jr. | 204/192.38 |
| 4,725,447 | 2/1988 | Pfender | |
| 5,478,608 | 12/1995 | Gorokhovsky | 427/571 |

FOREIGN PATENT DOCUMENTS

| | | | |
|---|---|---|---|
| 0099724A2 | 7/1983 | European Pat. Off. | C23C 13/00 |
| 0099725A2 | 7/1983 | European Pat. Off. | C23C 13/00 |
| 0327051A1 | 2/1989 | European Pat. Off. | C23C 16/26 |
| 1-104777 | 4/1989 | European Pat. Off. | |
| 1-192794 | 8/1989 | European Pat. Off. | |
| 0478909A1 | 7/1991 | European Pat. Off. | C23C 16/26 |
| 2351051 | 10/1973 | Sweden | B01J 1/00 |
| 289458 | 6/1968 | U.S.S.R. | |

OTHER PUBLICATIONS

"The Growth of Diamond Films Using A DC–Biased Hot Filament Technique", Hou Li, et al., New Diamond Science and Technology 1991 MRS. Int. Conf. Proc. (no month available).

"Surface Morphologies and Photoluminescence of Diamond Films Deposited in a Hot Filament Reactor", T. Srivinyunon, et al., New Diamond Science and Technology 1991 MRS Int. Conf. Proc. (no month available).

(List continued on next page.)

*Primary Examiner*—Bernard Pianalto
*Attorney, Agent, or Firm*—Mark B. Eisen

[57] ABSTRACT

An improved vacuum arc coating apparatus is provided, having a tube defining reaction zone with a plasma channel defined within a series of aligned annular substrate holders, or between an outer wall of an axial chain of substrate holder blocks and the inner wall of the tube. The substrate holders thus act as a liner, confining an arc within the plasma channel. Carrier and plasma-creating gases and the reaction species are introduced into the tube, and the deposition process may be carried out at a pressure between 100 Torr and 1000 Torr. Magnetic coils may be used to create a longitudinal magnetic field which focuses the plasma column created by the arc, and to create a transverse magnetic field which is used to bias the plasma column toward the substrates. Substrates can thus be placed anywhere within the reaction zone, and the transverse magnetic field can be used to direct the plasma column toward the substrate, or the tube itself can be rotated to pass the substrate through the plasma column. In multiple-arc embodiments a plurality of substrate holders defining a plurality of arc channels may be aligned coaxially or distributed transversely about the reaction zone.

61 Claims, 43 Drawing Sheets

OTHER PUBLICATIONS

"Thermal diffusivity of diamond films synthesized from methane by arc discharge plasma jet CVD", Boudina et al., Diamond and Related Materials, 2–(1993)–852–8.

"Diamond deposition from an Ar–CC14–H2 plasma jet at 13.3 kPa", Kotaki et al., Diamond and Related Materials, 2–(1993)–342–46.

"Plasma–assisted CVD of diamond films by hollow cathode arc discharge", Stiegler et al., Diamond and Related Materials, 2–(1993)–413–16.

"Novel Synthesis Routes for Diamond Films in a Heated Flowtube", L. R. Martin et al., New Diamond Science and Technology 1991 MRS Int. Conf. Proc. (no month available).

"Thermochemical vapor deposition of diamond in a carbon–halogen–oxygen and/or sulfur atmospheric hot wall reactor", D. E. Patterson et al., Applications of Diamond Films and Related Materials, Tzeng et al, 1991. (no month available).

"Diamond coatings from a solid carbon source", Shyankay Jou, Hans J. Doerr, and Rointan F. Bunshah, Thin Solid Films 253 (1994) 95–102 (no month available).

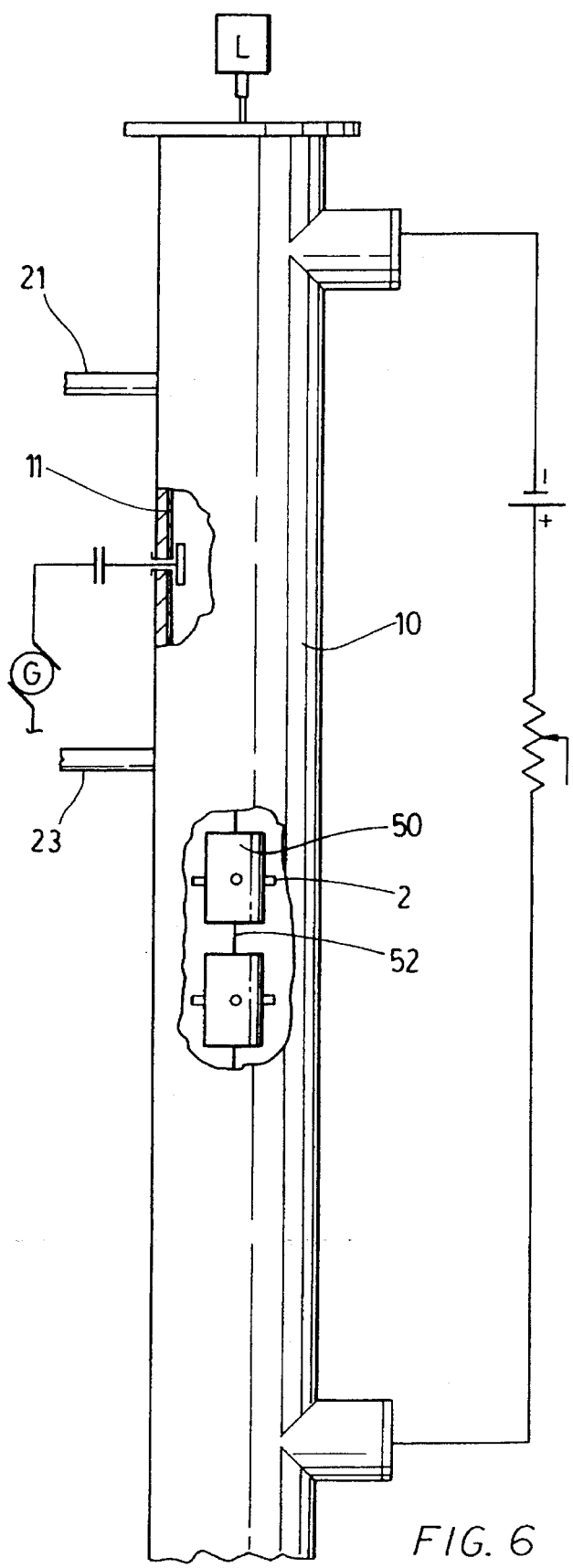
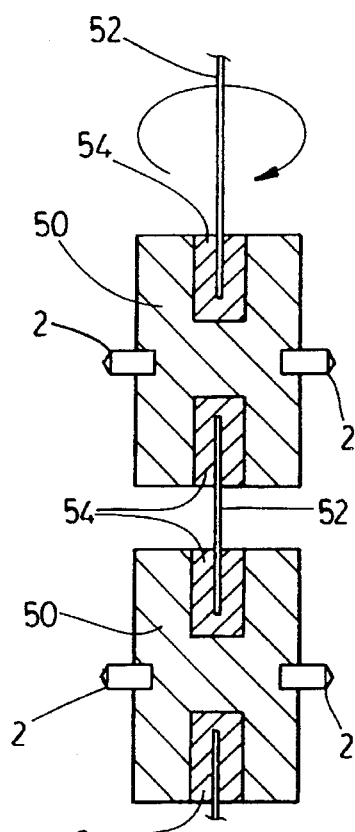
FIG. 6
FIG. 7

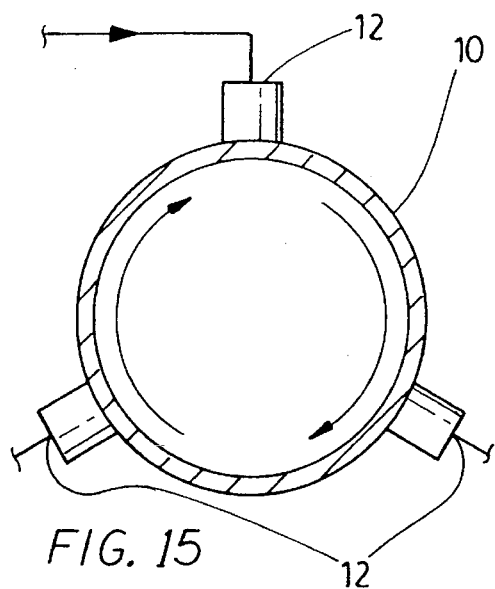
FIG. 15
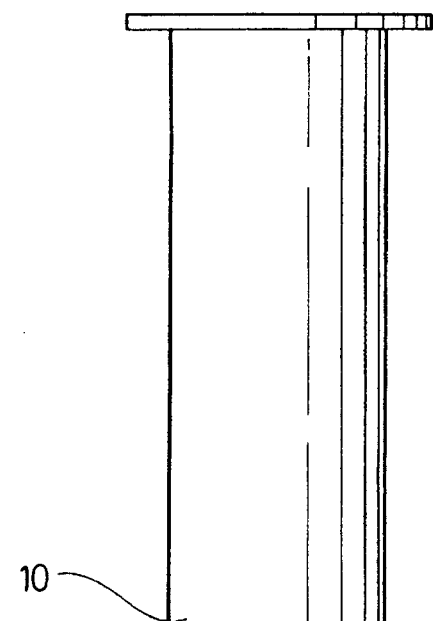
FIG. 16
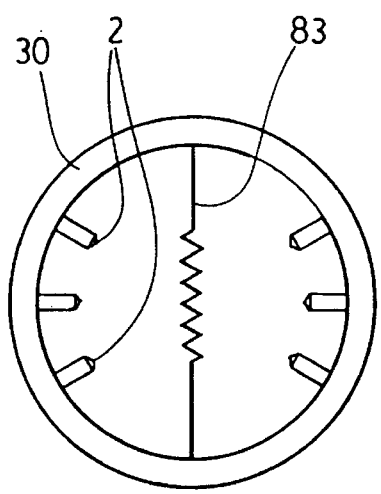
FIG. 17
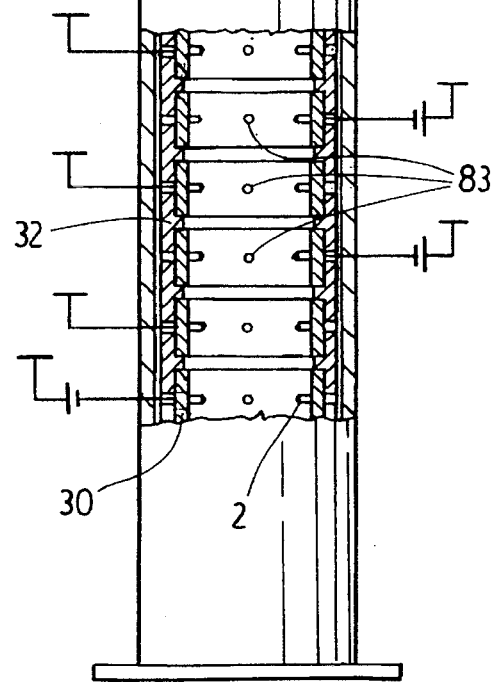

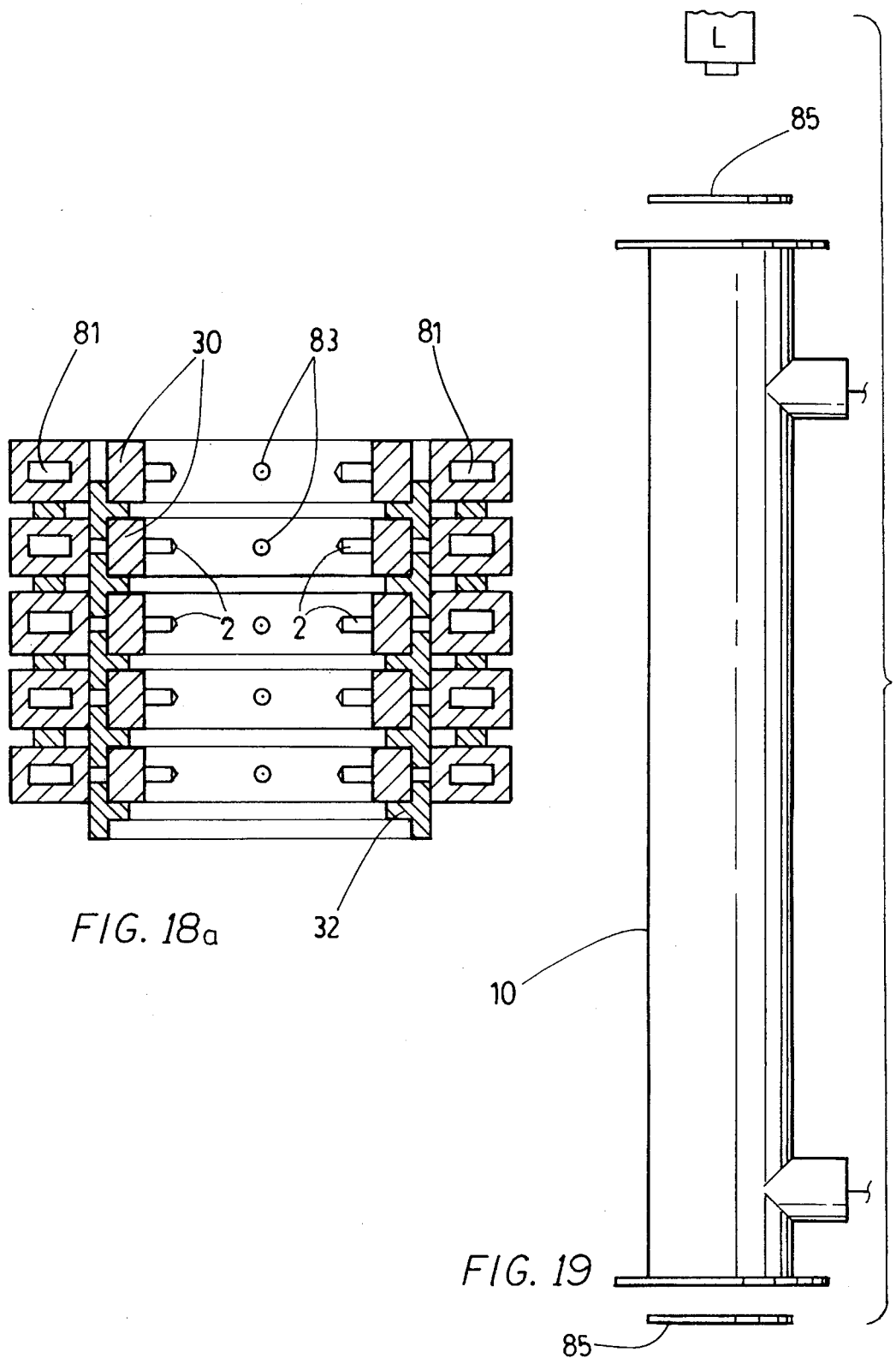

ARC ASSISTED CVD COATING AND SINTERING METHOD

This application is a continuation-in-part of U.S. patent application Ser. No. 08/338,844 filed Nov. 14, 1994, U.S. Pat. No. 5,478,608.

FIELD OF THE INVENTION

This invention relates to an arc coating apparatus. In particular, this invention relates to an arc assisted CVD coating method and apparatus especially suitable for deposition of diamond or other hard coatings or films on a substrate.

BACKGROUND OF THE INVENTION

The deposition of coatings on a substrate is conventionally accomplished using either a plasma torch which creates a plasma plume that envelopes substrates disposed on the inner wall of a tube anode, such as in the device disclosed in Moll U.S. Pat. No. 4,555,611, or an electric arc generated between a cathode and an anode which creates an ionized plasma stream in the vicinity of the substrate. Devices incorporating these methods are well known to those skilled in the art.

Disadvantages to any apparatus of this type are the lack of uniformity of plasma distribution in the anode area and the limited length of the reaction zone. In the case of for example a plasma jet or plume, the reaction zone is limited by the input power of the plasma source. For example, in the microwave tube furnace described by Martin and Hill in "Novel Synthesis Routes for Diamond Films in a Heated Flowtube", Proceedings of the Second International Conference on New Diamond Science and Technology, Sep. 23–27, 1990, pp.365–70, microwave discharge is used to improve excitation and dissociation of the reaction species in a tube furnace. The length of the reaction zone is limited by the input power of the microwave source.

In the case of an arc-generated plasma stream, such as that described in European Patent No.478,909 A1 to Balzers Aktiengesellschaft, the homogeneous reaction zone is limited to the stable portion of the arc, and the ionized plasma tends to be denser in the cathode region. In both cases this severely limits the size of the substrate that can be coated and the quality or uniformity of the coating. Additionally, because the arc is dispersed throughout the apparatus and not well confined, in order to simultaneously process multiple substrates, the deposition process must be carried out at low pressures, reducing plasma commensurately reducing the efficiency and rate of deposition.

In the case of arc jet CVD processing, as for example the apparatus and process described by Boudina et al in Thermal Diffusivity of Diamond Films Synthesized from Methane by Arc Discharge Plasma Jet CVD, Diamond and Related Materials, 2(1993) 852–858, the reaction zone is limited by the cross sectional area of the jet.

SUMMARY OF THE INVENTION

The present invention overcomes these disadvantages by providing an arc CVD coating method and an apparatus therefor having a reaction zone of virtually unlimited length. The apparatus also allows considerable flexibility in the positioning of substrates to be coated. This is accomplished in the present invention by creating a homogeneous, concentrated plasma column in a cylindrical reaction tube, configuring the substrate holders or the substrates themselves to act as a liner confining the arc in a channel containing the substrates, and in some embodiments manipulating the plasma column into contact with the substrates using a combination of longitudinal and transverse magnetic fields.

More specifically, the invention provides an arc assisted CVD coating deposition process in a DC or AC arc column generated in a cylindrical reaction zone. In a single arc-channel embodiment of the invention, substrates are positioned either along the wall of the tube, in a cylindrical channel in which the plasma column will be confined created within abutting annular substrate holders, or along the axis of the tube in an annular channel defined between a chain of substrate holder blocks and the wall of the reaction tube. In each case the substrate holders act as a "hot liner", confining the arc within the channel created either within annular substrate holders or between the axially suspended substrate holder blocks and the inner wall of the tube, which is water cooled to act as a cool liner. Abutting substrate holders are separated by insulators or narrow dielectric gaps which prevent short circuiting of the arc across conductive substrates or across the conductive surface of a film being deposited on a dielectric substrate.

The length $l_s$ of any continuous surface positioned between insulators must satisfy the formula $$E_c \times l_s < V_c + V_a$$

where
$E_c$ is the charge of the electric field created by the arc,
$l_s$ is the effective length of the substrate,
$V_c$ is the voltage of the cathode, and
$V_a$ is the voltage of the anode.

In one such embodiment the apparatus of the invention includes a stabilizing zone defined between a first inlet adjacent to the cathode, for injecting plasma-creating gases and a carrier gas into the tube tangentially to create a rotating column of gas inside the tube, and a second inlet downstream of the first inlet for injecting the reaction species. A third inlet may optionally be provided between the first and second inlets for the injection of liquid or solid reaction species. Means for reducing pressure within the tube, such as a vacuum pump, draws the plasma downstream through the reaction zone and out the anode end of the tube. This embodiment allows for effective mixing of the gases and reaction species, and for ready manipulation of the plasma column over the substrates while keeping it confined in the reaction zone to maximize the efficiency of the arc and provide a high plasma density.

In a further embodiment, groups of annular substrate holders forming self contained reaction sections are provided with openings for the injection of plasma creating and carrier gases and the reaction species, and for the removal of gases from the reaction zone. In this embodiment the cathode is built into a substrate holder at one end of the reaction section, and a conductive substrate holder at the other end of the reaction section is grounded to form an anode. The reaction zone is formed in the cylindrical channel created within each section of substrate holders. The reaction zone can be extended indefinitely by aligning groups of such reaction sections in abutting relation, each section forming its own arc.

The invention further provides multiple arc-channel embodiments of the invention, in which multiple cathodes distributed across the reactor create a plurality of transversely distributed arcs, which are directed through multiple channels to coat a large number of substrates simultaneously. In one embodiment the substrates are positioned so as to abut one another and the substrates themselves create the channels through which the multiple arcs burn.

In further embodiments using a cold cathode consumption process, the target material is formed with openings through which the arcs burn. Various means are provided for controlling the movement of one or more cathode spots across the target, including multiple linear anodes extending through the target and activated in sequence to generate a cathode spot in the vicinity of the activated anode, and closed-loop coils creating magnetic fields forming a path along which the cathode spots move.

The various embodiments of the invention provide the advantage that the CVD coating process may be carried out at relatively high pressure, between 10 Torr and 1000 Torr. As such, in one embodiment of the invention the reaction chamber can be sealed once the plasma creating and carrier gases and the reaction species have been introduced into the reaction zone, and the coating process takes place at atmospheric pressure, eliminating the need for any vacuum pumping means.

Regulation of the temperature of synthesis is accomplished by regulating the specific power per unit volume of the arc, which is the product of the arc current and the electrical charge of the plasma. Thus, the temperature of synthesis may be controlled by changing the arc current, gas composition or gas pressure within the reaction zone.

Enhancement of the deposition process can be achieved by injecting a second source of energy into the plasma, such as an oscillating electromagnetic signal, to activate the plasma and neutralize the negative charge of the substrate surface; by injecting high voltage/high frequency pulses into the arc; by applying a DC or AC bias voltage to the substrates to increase the intensity of ion bombardment of the substrate surface and improve the quality of the coating; and/or by providing a thermionic filament within the reaction zone.

The present invention thus provides an arc assisted coating apparatus comprising a tube having a reaction zone and at least one inlet for injection of a carrier gas, a plasma-creating gas and a reaction species, at least one cathode located upstream of the reaction zone, an anode located downstream of the reaction zone, and a plurality of substrate holders positioned within the reaction zone for supporting a substrate to be coated, whereby each of the plurality of substrate holders includes a wall which acts as a liner to confine an arc discharge created between a cathode and the anode.

The present invention further provides a method of depositing a coating on a substrate, comprising the steps of positioning a substrate in a cylindrical reaction zone within a tube and reducing pressure in the tube, injecting a carrier gas and a plasma-creating gas into the tube upstream of the reaction zone, injecting a reaction species into the tube upstream of the reaction zone and downstream of the injection of the carrier and plasma-creating gases, creating an electric arc between a cathode upstream of the reaction zone and an anode downstream of the reaction zone, and activating a magnetic field to bias a plasma column created by the arc toward the substrate.

BRIEF DESCRIPTION OF THE DRAWINGS

In drawings which illustrate byway of example only a preferred embodiment of the present invention.

FIG. 6 is a partially cut-away view of a still further embodiment of a single-arc discharge apparatus of the present invention;

FIG. 7 is a cross-section of the substrate holders in the embodiment of FIG. 6;

FIG. 15 is a transverse cross section of a further embodiment of a single-arc discharge apparatus of the invention which utilizes a plurality of cathode anode pairs;

FIG. 16 is a longitudinal cross section of an embodiment of a multiple-arc discharge apparatus of the invention in which a plurality of cathode/anode sections are aligned coaxially to form a liner in the reaction zone for confining a plurality of arcs;

FIG. 17 is a plan view of an embodiment of substrate holder including a thermionic cathode;

FIG. 17b is a partially cutaway elevation of an apparatus utilizing the cathode ring of FIG. 17a;

FIG. 18a is a cross section of a series of the substrate holders of FIG. 17 for a filament assisted CVD reactor embodying the invention;

FIG. 19 is an elevation of a laser assisted embodiment of the invention illustrating a preferred configuration of a laser resonator;

FIG. 28a is a schematic cross section of an embodiment in which a screen anode forms a plurality of holes and for arc plasma auxiliary anode disposed parallel to the cathode plate;

FIG. 28b is a schematic front elevation of the embodiment of FIG. 28a;

FIG. 34c is a cross sectional partial elevation of a variation of the embodiment of FIG. 34a;

DETAILED DESCRIPTION OF THE INVENTION

The invention provides an arc discharge reactor having a stabilizing zone upstream of a reaction zone in a cylindrical reaction tube in which a homogeneous, concentrated plasma column is created and in which the substrate holders or the substrates themselves are configured to act as a liner, confining the arc in a channel containing the substrates. The invention is embodied in two basic forms, a single-arc discharge reactor and a multiple-arc discharge reactor, each of which has a number of embodiments. The above-described elements are common to each embodiment of the invention, but for purposes of clarity the two basic types of reactor embodying the invention will be described separately.

Single arc-channel embodiments

Figure 1:
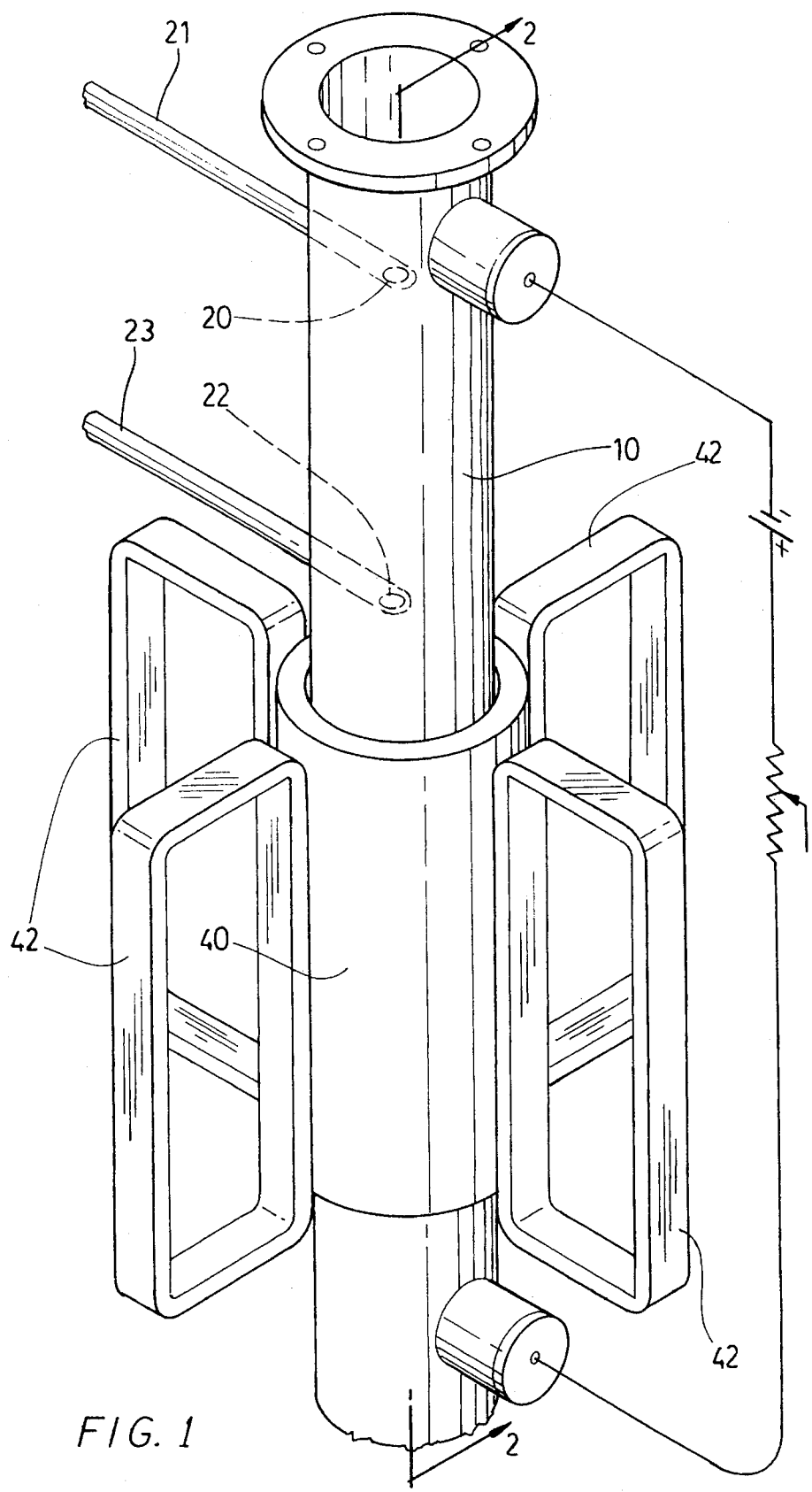
FIG. 1 is a perspective view of a preferred embodiment of a single-arc discharge apparatus of the present invention.
Figures 3, 4:
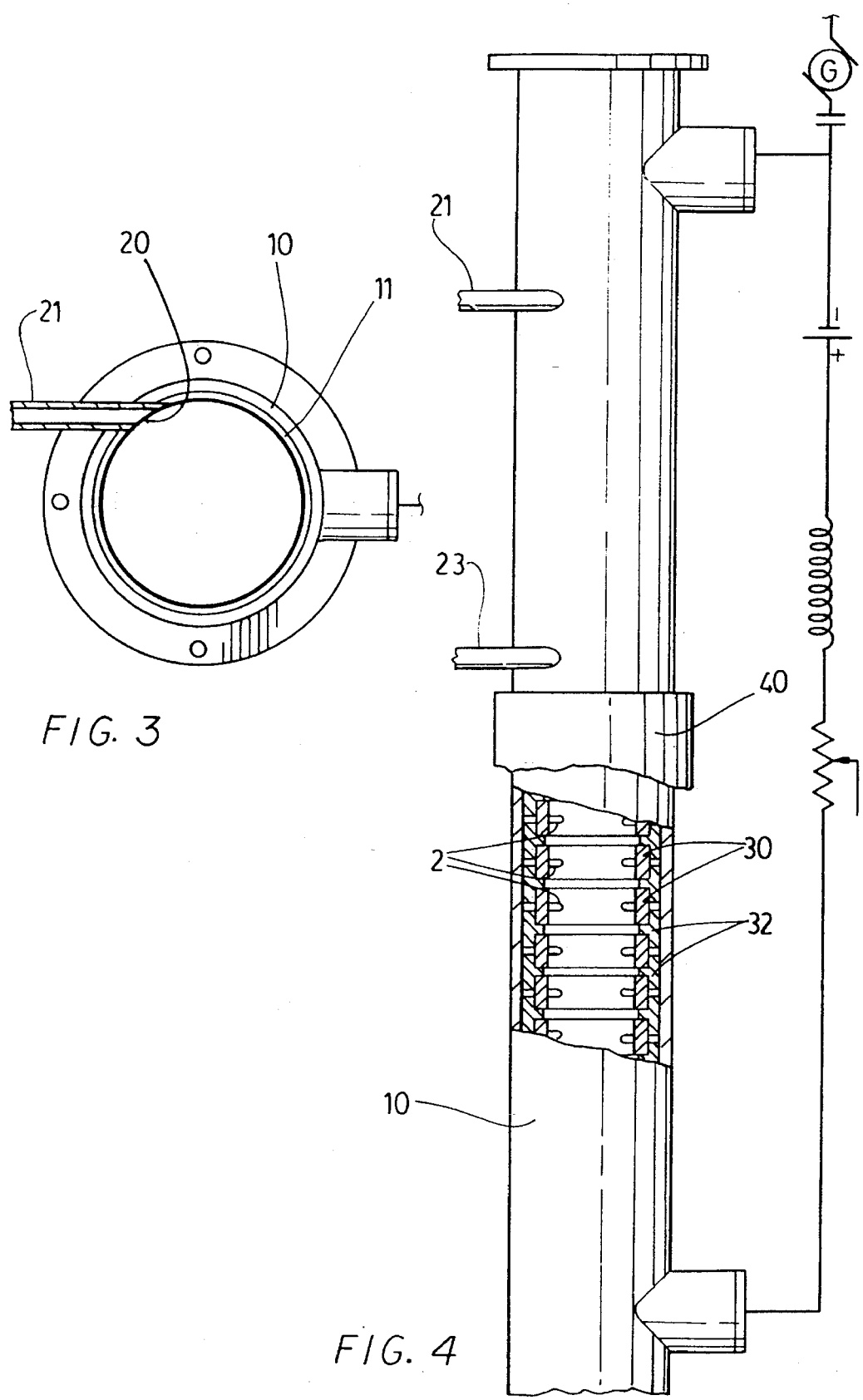
FIG. 3 is a transverse cross section of the apparatus of FIG. 1.
FIG. 4 is a partially cut-away view of a further embodiment of a single-arc discharge apparatus of the present invention.

Referring to FIG. 1, a first preferred embodiment of the apparatus of the present invention comprises an air-tight tube 10 provided with means for reducing the pressure within the tube 10 such as a conventional vacuum pump (not shown). The tube 10 is preferably formed from a dielectric material, such as alumina, or may be water-cooled and formed from a material with high thermal conductivity such as BeO, and in operation may be oriented vertically. A dielectric liner 11 is hermetically sealed within the tube 10 leaving a space for a coolant such as water, as seen in FIG. 3.

Figure 2A:
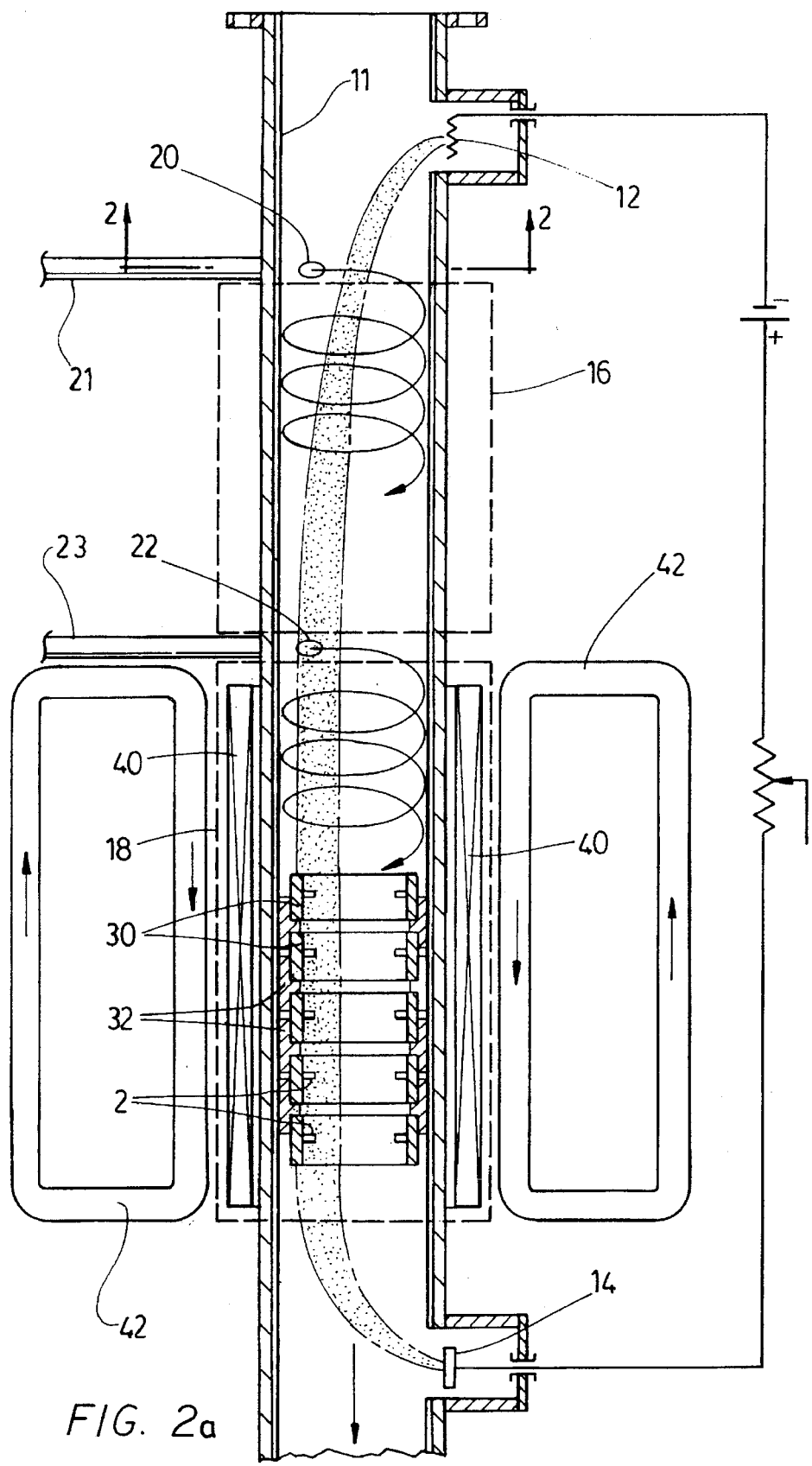
FIG. 2a is a longitudinal cross-section of the apparatus of FIG. 1.

As seen in FIG. 2a, the apparatus further comprises a cathode 12 and an anode 14 disposed at upstream and downstream ends of the tube 10, respectively; a stabilizing zone 16 located downstream of the cathode 12; and a cylindrical reaction zone 18 in which the substrates 2 are mounted, located downstream of the stabilizing zone 16.

An inlet tube 21 is in communication with a first inlet 20 for injection of the carrier gas, for example argon, and a plasma-creating gas such as hydrogen, located immediately downstream of the cathode 12. The stabilizing zone 16 consists of the region of the tube 10 between the first inlet 20 and a second inlet 22 downstream thereof fed by a second inlet tube 23, for injection of the reaction species, which in the case of diamond deposition may be methane. It will be appreciated that the carrier, plasma-creating and reaction gases referred to herein are mentioned by way of example only, and the invention is in no way limited to these particular examples.

The stabilizing zone 16 serves a number of purposes: it allows a rotating plasma column to form before the reaction species is introduced; it protects the cathode 12 from deterioration by species dissociation products; and it allows for solid particles to be extracted from the plasma upstream of the reaction zone 18 (i.e. before deposition). The length of the stabilizing zone 16 should thus be at least equal to the diameter of the tube 10, but to be economically viable the length should not exceed ten tube diameters.

Figure 2B:
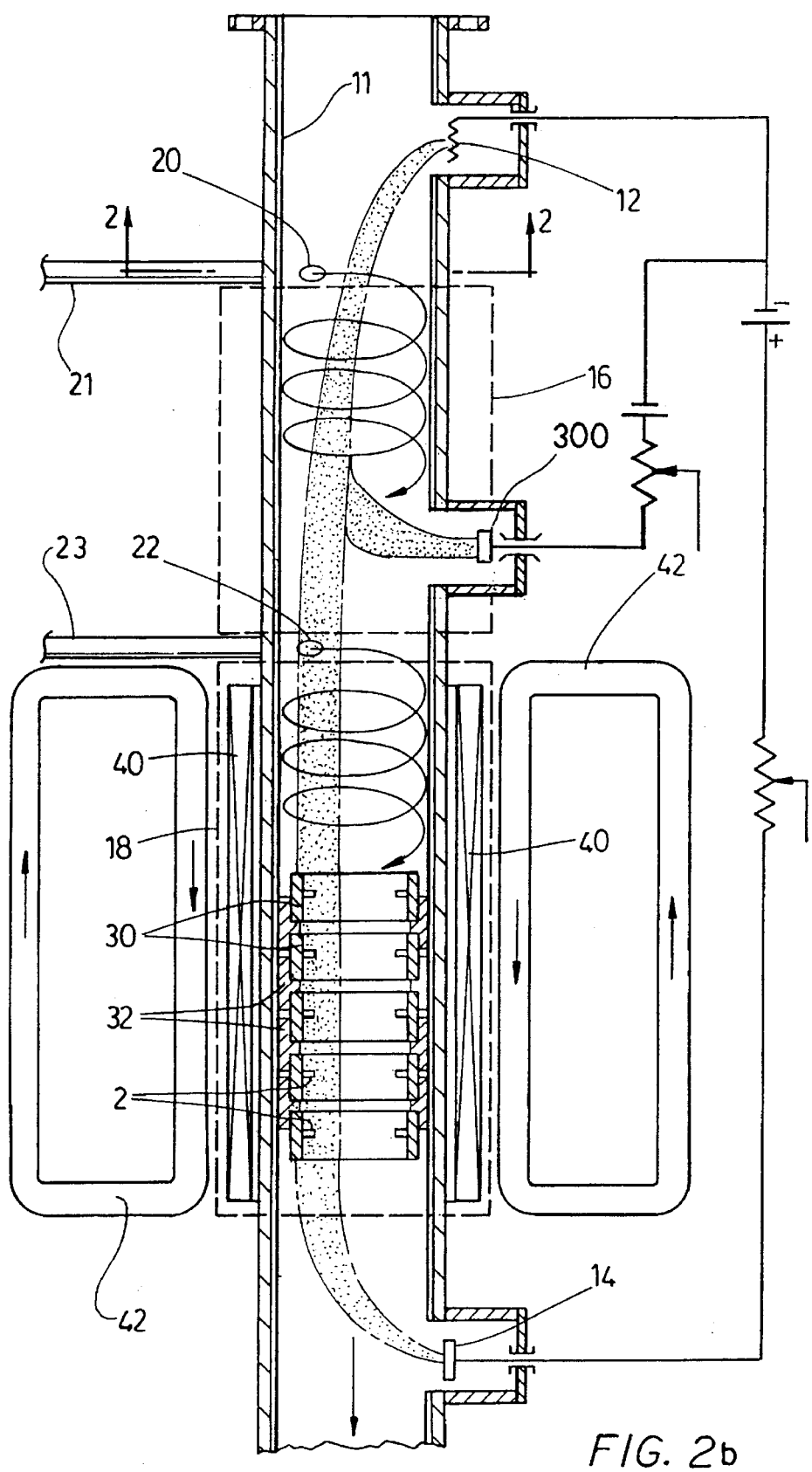
FIG. 2b is a longitudinal cross-section of a variation of the apparatus of FIG. 1.
Figure 2C:
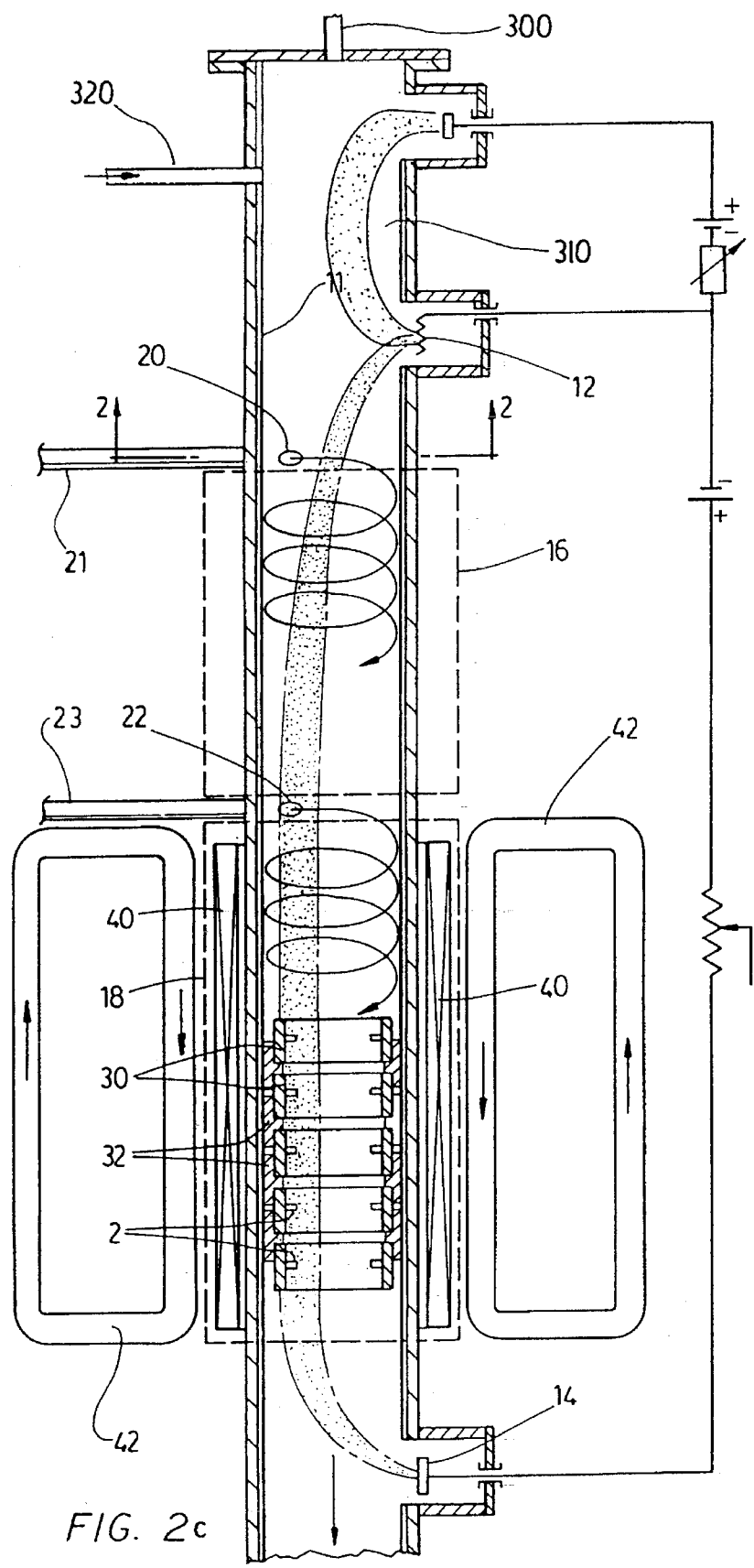
FIG. 2c is a longitudinal cross-section of a further variation of the apparatus of FIG. 1.

In addition, it is possible to improve stabilisation of the arc discharge by creating an auxiliary arc discharge between the cathode 12 and an auxiliary anode 300 disposed in the stabilizing zone 16, as shown in FIG. 2b. The auxiliary arc discharge improves stability of main arc by increasing the level of plasma ionization in the vicinity of the cathode 12. Another way of accomplishing this is shown in FIG. 2c in which the auxiliary anode 300 is disposed upstream of the cathode 12 to create an auxiliary channel 310 with a gas inlet 320 and a gas outlet 330 connected to the means for reducing pressure within the tube 10 (not shown). This system can support an auxiliary arc discharge at the cathode 12 even if the main arc discharge is extinguished.

In each of FIGS. 2a, 2b and 2c rotation of the gases within the tube 10 helps to stabilize the plasma column and render the plasma more homogeneous in the reaction zone 18. Thus, the inlets 20,22 are preferably configured to inject gas into the tube 10 generally tangentially, as illustrated in FIG. 3, which results in a rotating mass of gas within the tube 10 (shown by the helical arrow in FIGS. 2a, 2b and 2c). Means for reducing pressure (not shown) draws gases from the tube 10 downstream of the reaction zone 18.

The reaction zone 18 consists of the region of the tube 10 between the second inlet 22 and the anode 14. The reaction zone 18 is cylindrical, for reasons which will be described below. The reaction zone 18 may be formed within annular substrate holders 30 arranged along the inner wall of the tube 10, as in the embodiments of FIGS. 2 to 5, or substrate holders 50 may be suspended along the axis of the tube 10, as in the embodiment of FIG. 6, in which case the reaction zone 18 will be annular, defined between the walls of the substrate holders 50 and the water cooled inner wall of the tube 10. Preferably the diameter of the reaction zone 18 is in the range of 10 mm to 100 mm; less than 10 mm is not efficient from a productivity standpoint, and greater than 100 mm can result in instability of the arc. The current required to sustain the deposition reaction increases with the diameter of the reaction zone 18.

Figure 8:
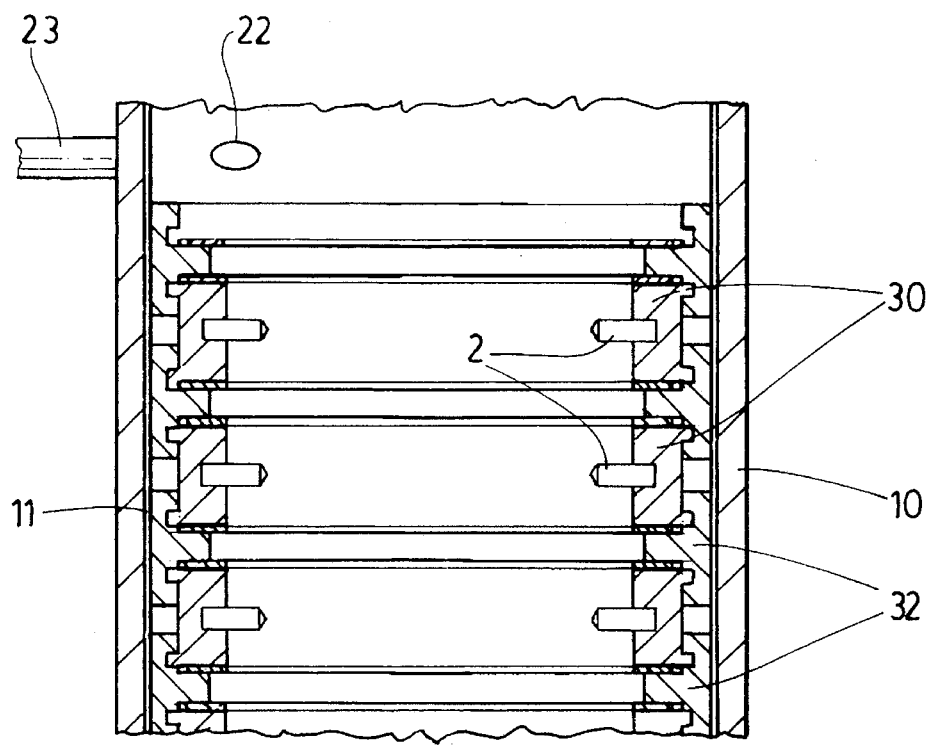
FIG. 8 is a cross-section of the substrate holders in the embodiment of FIG. 1.

In the embodiments of FIGS. 2 to 5 the substrate holders 30 are preferably electrically conductive annular rings, seen in detail in FIG. 8. A dielectric spacer 32 separates adjacent substrate holders 30, to prevent short circuiting of the electric arc. In this embodiment the substrate holders 30 are stationary within the tube 10, and the dielectric spacers 32 may be affixed to the inner wall of the tube 10 to retain the substrate holders 30. The series of substrate holders 30 thereby forms a "hot liner" which protects the wall of the tube 10 in the vicinity of the reaction zone 18 and confines the arc in the cylindrical plasma channel created within the substrate holders 30.

In this embodiment the substrate holders 30 may also be formed from a dielectric material, but it is preferred that the substrate holders 30 be electrically conductive, and be separated by dielectric spacers 32 as shown. This allows a bias potential to be applied to the substrate holders 30, which enhances the deposition process as described below. In either case, however, the axial length of the substrate holders 30 must be selected carefully.

If the substrate 2 is electrically conductive, or if the substrate 2 is dielectric but the coating at any stage of the deposition process is electrically conductive (for example, a very thin film of diamond tends to be conductive due to polarization of the molecules in the film by the ionized plasma), the electric arc can be extinguished in the reaction zone 18 as it permeates the conductive material. In other words, if the voltage drop across the substrate 2 at any time exceeds the voltage drop across the portion of the arc along the length of the substrate 2, the arc will be short circuited through the substrate 2. To avoid this phenomenon, the substrate holders 30 are designed according to the formula $$E_c \times l_s < V_c + V_a + I_c \times r_s \times l_s$$

where
$E_c$ is the charge of the electric field created in the arc column,
$l_s$ is the axial length of the substrate holder 30,
$V_c$ is the voltage of the cathode,
$V_a$ is the voltage of the anode,
$I_c$ is the current in the arc column, and
$r_s$ is the specific resistivity of the substrates along the arc axis.

In the case of electrically conductive substrates the specific resistivity $r_s$ of the substrate is very small, so that the voltage drop across the substrate (represented by $I_c \times r_s \times l_s$) is very small in comparison to the sum of the cathode and anode voltages. Thus, for a conductive substrate this formula can for practical purposes be written as $$E_c \times l_s < V_c + V_a$$

This formula can also be expressed in terms of the critical length $l_c$ of the substrate holder 30, which is equal to the sum of the cathode and anode voltages (plus the voltage drop of the substrate 2 if the arc current is short circuited by a substrate) divided by the charge of the electric field in the reaction zone, or $$l_c = (V_c + V_a)/E_c$$

At and beyond this critical length $l_c$ the arc would be short circuited through the substrate holder 30 and would burn the substrate 2. The provision of dielectric spacers 32 between adjacent substrate holders 30 ensures that adjacent substrates 2 do not combine to exceed the critical length $l_c$.

Figure 18B:
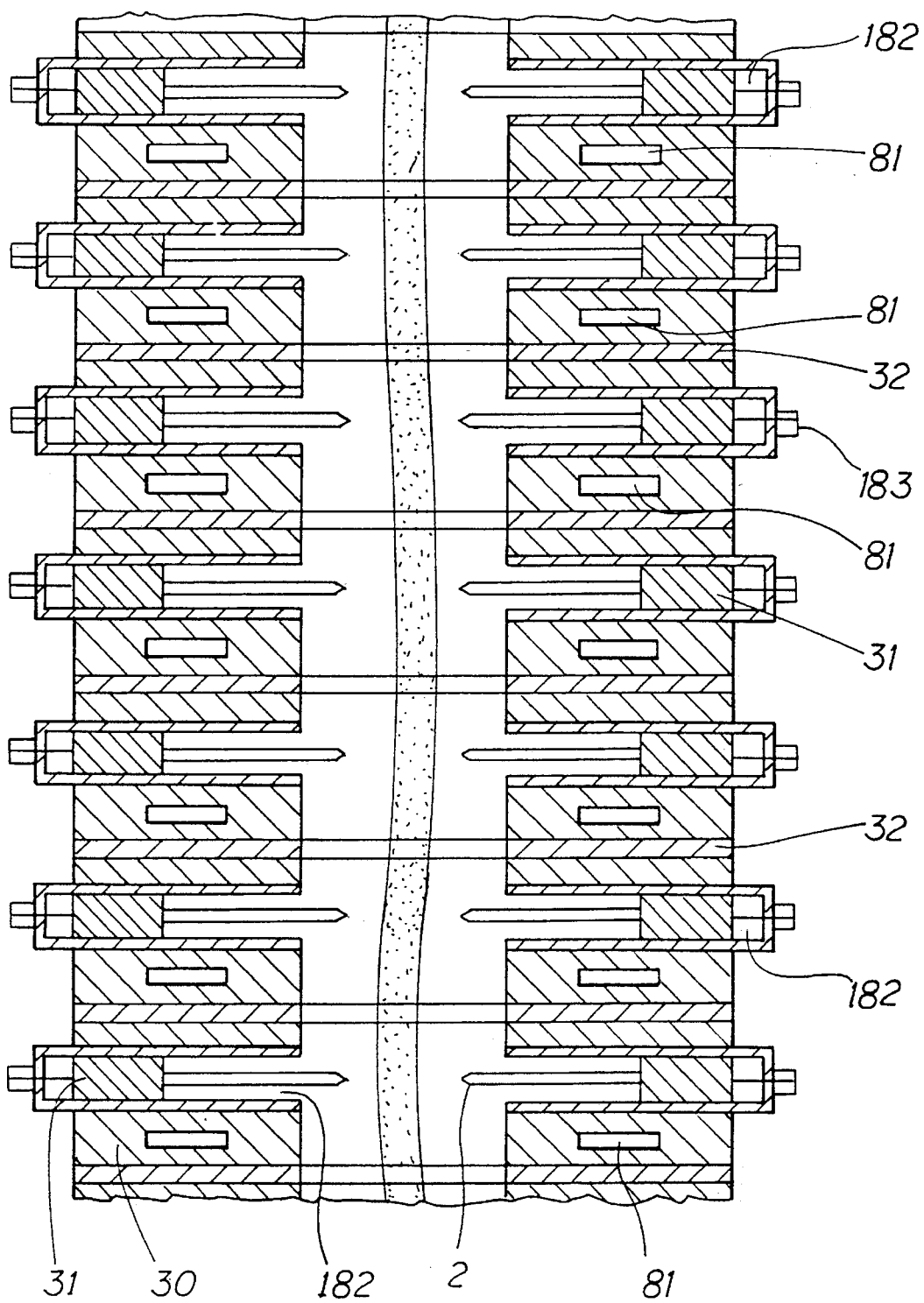
FIG. 18b is a cross section of a variation of the substrate holders of FIG. 17.

The substrate holders 30 protect the inner wall of the tube 10 from species dissociation products, and as such it is advantageous to align the substrate holders 30 and the dielectric spacers 32 immediately adjacent to one another (i.e. without gaps between substrate holders 30). As noted above, the substrate holders 30 in these embodiments effectively form a "hot liner", and the arc is confined within the cylindrical plasma channel created through the abutting substrate holders 30. A variation of the substrate holders 30, illustrated in FIG. 18a, converts the series of substrate holders 30 into a "cool liner" by providing a coolant channel 162 within each substrate holder 30. As shown in FIG. 18b, in this embodiment the substrates 2 are disposed in the openings in the water-cooled substrate holder sections.

FIG. 18b illustrates a further variation of the substrate holders 30 in which openings 182 are provided transversely through the walls of the substrate holders 30. Supports 31 extending through seals 183 support the substrates 2 in the reaction zone 18. Substrate holders 30 so equipped and hermetiacally installed may be used to form a reactor without any outer tube 10 or liner 11.

The substrate holders 30 are deliberately provided with sharp edges, which makes deposition difficult, and the substrate holders 30 thereby tend to resist coating to some degree during the deposition process. Where multiple substrates 2 are being coated, it is advantageous to position all substrates 2 the same distance from the wall of the tube 10, to ensure a consistent coating over all substrates 2.

Figure 2D:
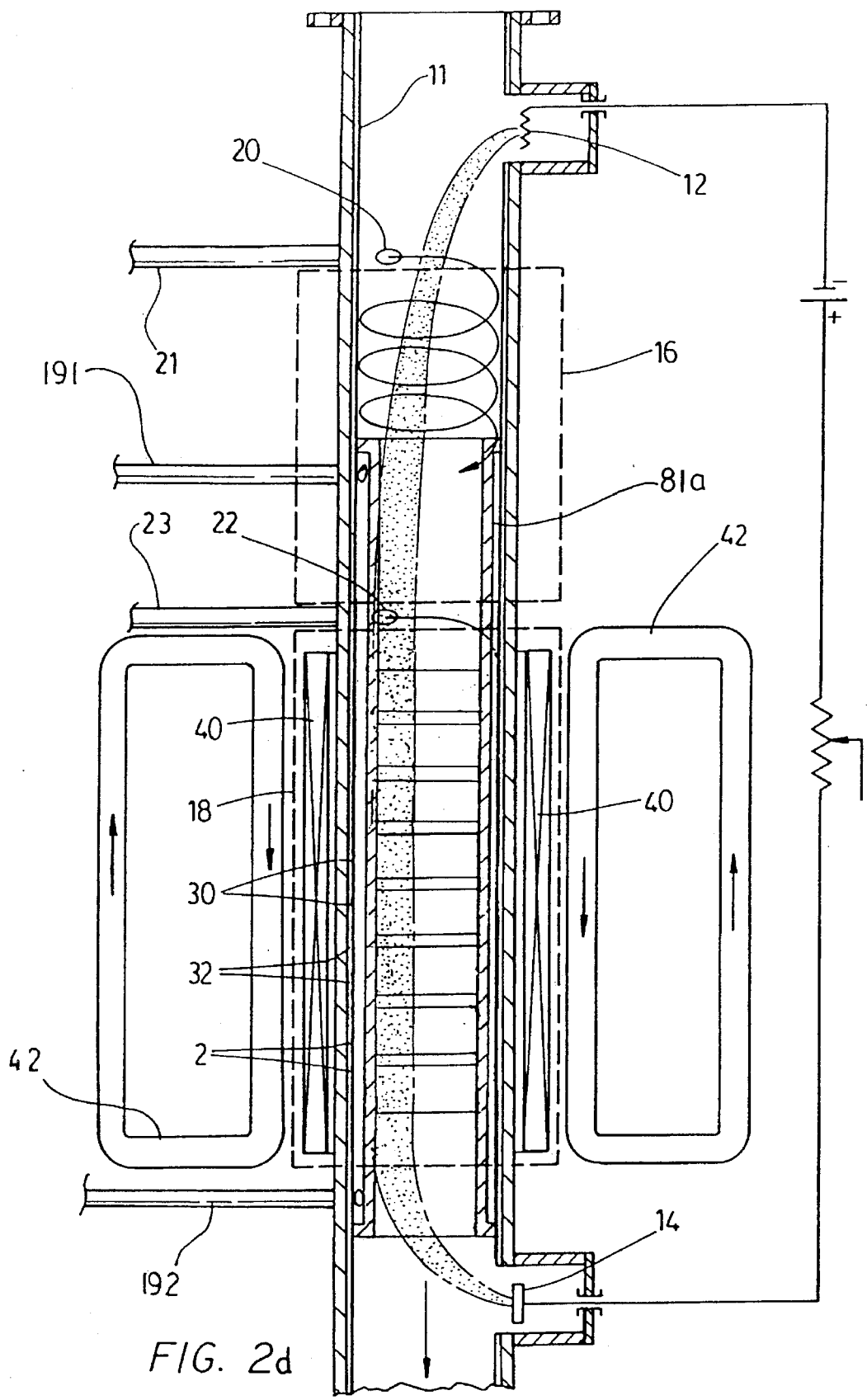
FIG. 2d is a longitudinal cross section of the embodiment of FIG. 2a including a gap between the tube wall and the liner.

In FIG. 2d, between the water cooling liner 81 and a "hot liner" formed by the outer wall of the substrate holders 30 (with spacers 32) there is a gap 81a, provided with an inlet for gas injection 191 and an outlet 192 for a conventional pumping system (not shown). The operating pressure within the reaction zone 18 should be maintained higher than the pressure in the gap 81a between the liner 81 and substrate holders, to protect the reaction zone 18 against gas leaks from within the gap 81a. To maximize the effect of this embodiment a gaseous species associated with a high breakdown voltage and a high arc voltage (for example hydrogen) should be injected into the gap 81a.

In the embodiments of FIGS. 2 to 5, magnetic fields are employed to guide the plasma column within the reaction zone 18. A longitudinal magnetic coil 40 disposed uniformly about the tube 10 in the region of the reaction zone 18 creates a longitudinal magnetic field which increases plasma activity and focuses the plasma column into a relatively narrow stream. A plurality of transverse magnetic coils 42 are positioned uniformly around the tube 10 along the reaction zone 18 to create a transverse magnetic field which controls the radial positioning of the plasma column within the reaction zone 18 and thus directs the plasma toward the substrates 2. An electric current is applied through all of the transverse coils 42 in the same direction, as indicated by the arrows in FIG. 2, or AC currents with shifted phases to create a rotating transverse magnetic field in the reaction zone 18.

In operation, the substrates 2 to be coated, drill bits in the embodiments shown, are mounted through openings in the substrate holders 30 as best seen in FIG. 8. A high-current, low voltage DC power source 8 is activated to create a voltage between the cathode 12 and the anode 14, and the carrier and plasma-creating gases are injected into the first inlet 20. An arc forms between the cathode 12 and the anode 14, which ionizes the rotating plasma gas.

The reaction species is then injected into the tube through the second inlet 22, and dissociation occurs as the species encounters the rotating plasma. At this stage the plasma is just entering the reaction zone 18, and the longitudinal magnetic coil 40 has concentrated the plasma into a tight column.

The pressure within the tube may be maintained between 10 Torr and 1000 Torr. A pressure greater than 1000 Torr will result in an unstable arc, whereas a pressure less than 10 Torr is uneconomical in an apparatus of this configuration.

In the embodiments in which the substrate holders 30 are arranged around the periphery of the reaction zone 18, as shown in FIGS. 2 to 5, the transverse magnetic coils 42 are activated to establish a transverse magnetic field biased toward the wall of the tube 10, thereby directing the plasma column into contact with the substrates 2. This embodiment provides the additional advantage that substrates 2 need not be located only along one portion of the reaction zone 18, as in a conventional arc coating apparatus where the substrates are all located on a single planar surface (e.g. the floor). The substrates 2 may be positioned anywhere around the inner wall of the series of substrate holders 30, which forms the cylindrical plasma channel and in these embodiments defines the periphery of the reaction zone 18.

The transverse magnetic field created by the transverse magnetic coils 42 can be cycled or rotated around the reaction zone 18 by varying the intensity of the magnetic field generated by each coil 42 with time, causing the plasma column to periodically circle the inner wall of the series of substrate holders 30 over a selected period. Alternatively, the transverse magnetic field can be kept stable, maintaining the plasma column stationary along any desired portion of the reaction zone 18, and the entire tube 10 or the substrate holders 30 can be rotated so that the substrates 2 each, in turn, pass through the plasma and are thereby coated. In either case, this significantly increases the available deposition area by many times beyond that in the reaction chamber of a conventional arc coating apparatus.

Figure 9:
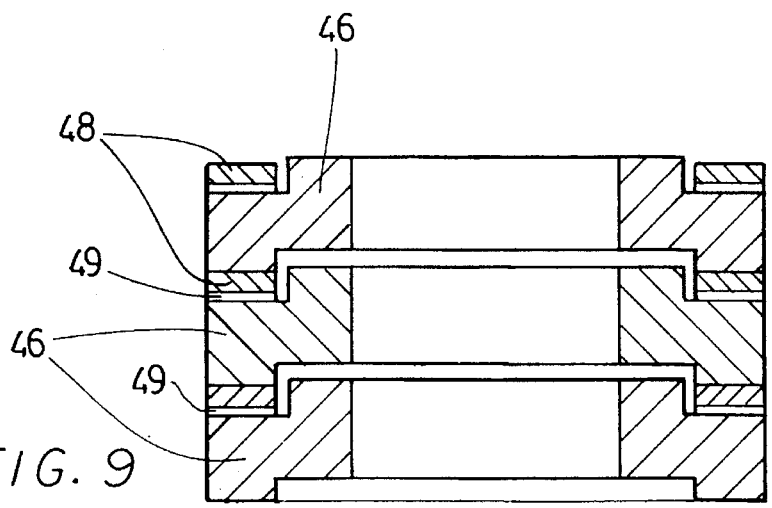
FIG. 9 is a cross-section of a variation of the substrate holders illustrated in FIG. 8.

An alternative configuration for the substrate holders for the embodiments of FIGS. 2 to 5 is illustrated in FIG. 9, which shows a series of electrically conductive substrate holders 46 separated by dielectric spacers 48. In this embodiment, small gaps 49 are provided to help species dissociation products to escape from the column of substrate holders 48 during the deposition process. Dissociation products are drawn out through the downstream end of the tube 10 by the vacuum pump.

In a further embodiment of the invention, illustrated in FIG. 6, electrically conductive substrate holders 50 are suspended along the axis of the reaction zone 18 by a dielectric filament 52. Each substrate holder 50, shown in FIG. 7, is a solid block of conductive material provided with side openings into which the substrates 2 are mounted, and end openings filled with a dielectric material 54 such as alumina into which the dielectric filaments 52 are embedded. The substrate holders 50 have an axial length less than the critical length lc referred to above, and it is essential that the filaments 52 joining the substrate holders 50 be dielectric so that the substrate holders 50 in the chain do not combine to exceed the critical length lc. The topmost filament 52 is connected to rotating means such as a conventional electric motor, which rotates the chain of substrate holders 50 during the deposition process.

In this embodiment the transverse magnetic coils 42 are used to establish a transverse magnetic field about the reaction zone 18 which keeps the plasma column generally centred between the wall of the tube 10 and the substrate holders 50. The substrates 2 are thereby coated as the plasma column flows through the reaction zone 18, i.e. the annular plasma channel defined between the inner wall of the tube 10 and the outer walls of the substrate holders 50, and rotating the substrate holders 50 ensures a thorough, uniform coating or film over the substrates 2. The water cooled inner wall of the tube 10 in this embodiment acts as a "cool liner" while the chain of substrate holders 50 acts as a "hot liner", and the plasma column is confined therebetween.

This embodiment of the invention may be particularly suitable for use in a microgravity environment, for example for coating articles in outer space. The substrate holders 50 and filaments 52 would be unnecessary, as the substrates 2 could be permitted to float freely within the reaction zone 18. A uniform coating will result providing that the plasma column occupies substantially the entire diameter of the reaction zone 18.

In a further embodiment of the invention, a thermionic filament 83 composed of a refractory material, such as tungsten, is mounted across the interior of each substrate holder, as shown in FIG. 17. The filament 83 can be a cathode, if connected to the negative pole of a power source; an anode, if connected to the positive pole of a power source (which may be grounded); or at floating potential, in which situation the filament 83 is neither a cathode nor an anode. The filament 83 becomes hot under the influence of the arc, and thus serves as a surface for catalytic reactions, facilitating creation of the reaction species near the substrate 2 without having to heat the substrate 2 to temperatures which could destroy the deposited coating (for example, a tungsten filament can heat up to around 2300 C. under the influence of the arc). By applying a voltage to heat the filament 83, the hot filament 83 also becomes a source of electrons, which increases the ionization of the plasma in the immediate vicinity of the substrates 2, and thus increases the deposition rate. This embodiment is shown in cross section in FIG. 18a, with water cooling channels 162 surrounding the substrate holders 30. This variation is applicable to both the embodiment illustrated in FIG. 5, with annular substrate holders 30, and the embodiment illustrated in FIG. 6, with axial substrate holders 50.

It will be apparent that the apparatus of the present invention is especially suitable for coating a fibre or filament, because of the cylindrical geometry and relatively long length of, and the uniform plasma density in, the reaction zone 18. This provides very uniform conditions for deposition of a coating on a fibre or filament.

Figure 13:
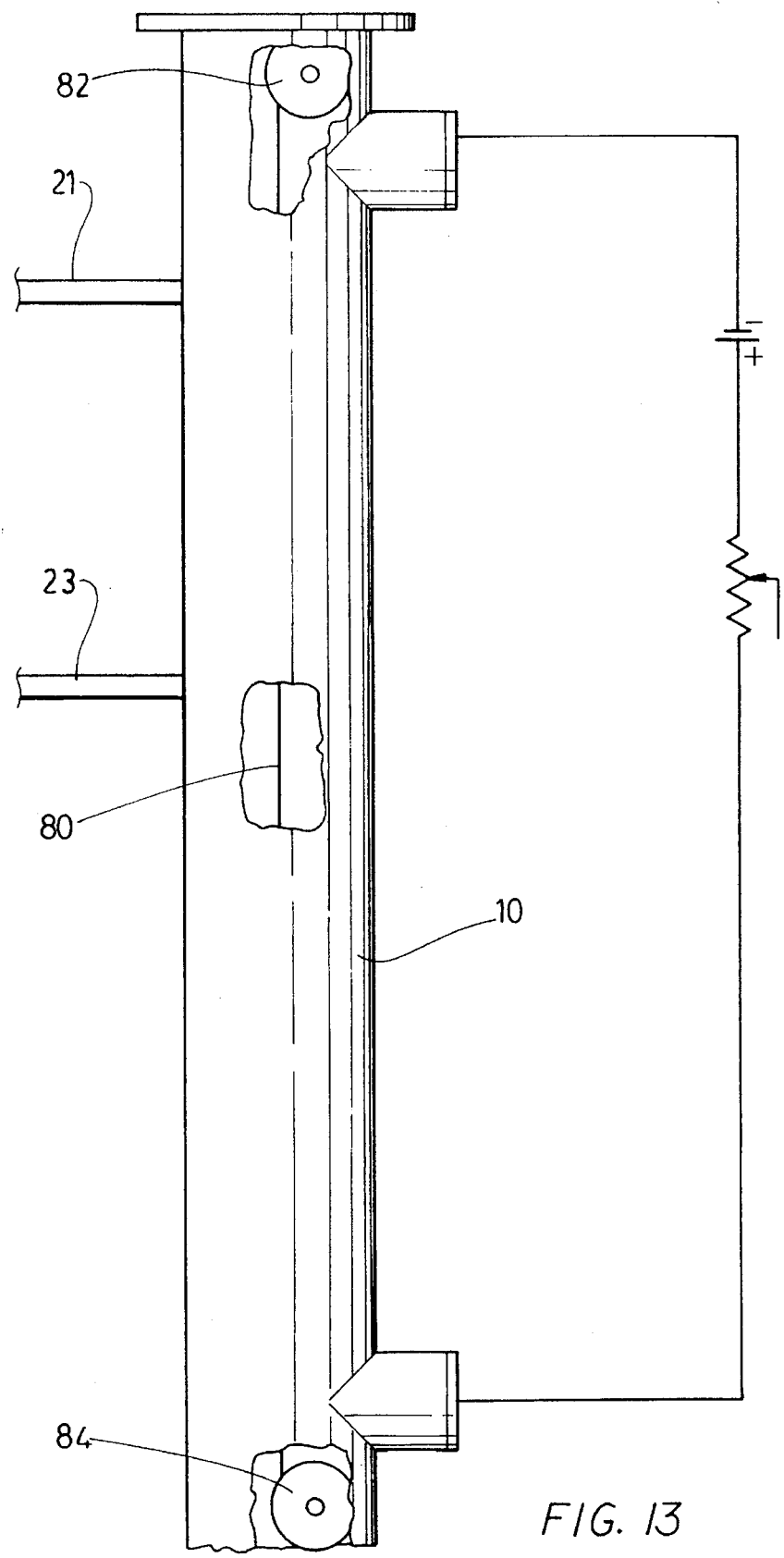
FIG. 13 is a cross sectional partial elevation of a single-arc discharge embodiment of the invention adapted for deposition on a filament.

An embodiment of the invention adapted for coating a filament is illustrated in FIG. 13. A dielectric filament 80 is wound around a spool 82 positioned within the tube 10 upstream of the cathode 12. A motor driven take up spool 84 is positioned within the tube 10 downstream of the anode 14. Both spools 82, 84 are arranged so that the filament 80 is pulled through the axial centre of the reaction zone 18. This embodiment is otherwise configured as in the embodiment of FIG. 6, with the liner 11 extending along the length of the tube 10 between the cathode 12 and the anode 14.

The length of the filament 80 is the same as the length of the arc, and is thus necessarily longer than the critical length $l_c$, discussed above. A conductive filament therefore cannot be used in the deposition process of the invention. However, the formula $$E_c \times l_s < V_c + V_a + I_c \times r_s \times l_s$$

still applies where a thick coating is applied to the filament 80, because the specific conductivity of the filament 80 increases in direct proportion to the thickness of the coating. At the beginning of the coating process the specific resistivity $r_s$ is very large for a dielectric filament 80. As the coating process proceeds $r_s$ decreases and the specific conductivity $\sigma_s$ increases. Although this is characteristic of metallic and other conductive coating deposition, it also applies to dielectric coatings in the initial stages of deposition before stechiometric composition has been achieved. For example, in the case of diamond coatings the first stage of the coating process is the creation of a diamond-like or amorphous carbon film which usually has a conductivity many times greater than pure diamond.

To ensure that the filament 80 is not burned by short circuiting of the arc through the filament 80, the voltage drop across the filament 80 must always be greater than the voltage drop across the arc. The coated portion of the filament 80 must therefore be removed from the reaction zone 18 before the specific resistivity of the filament plus coating exceeds the specific resistivity of the plasma. The rate at which the filament 80 is drawn through the reaction zone, which determines the thickness of the deposited coating, must take this into account.

Figure 20A:
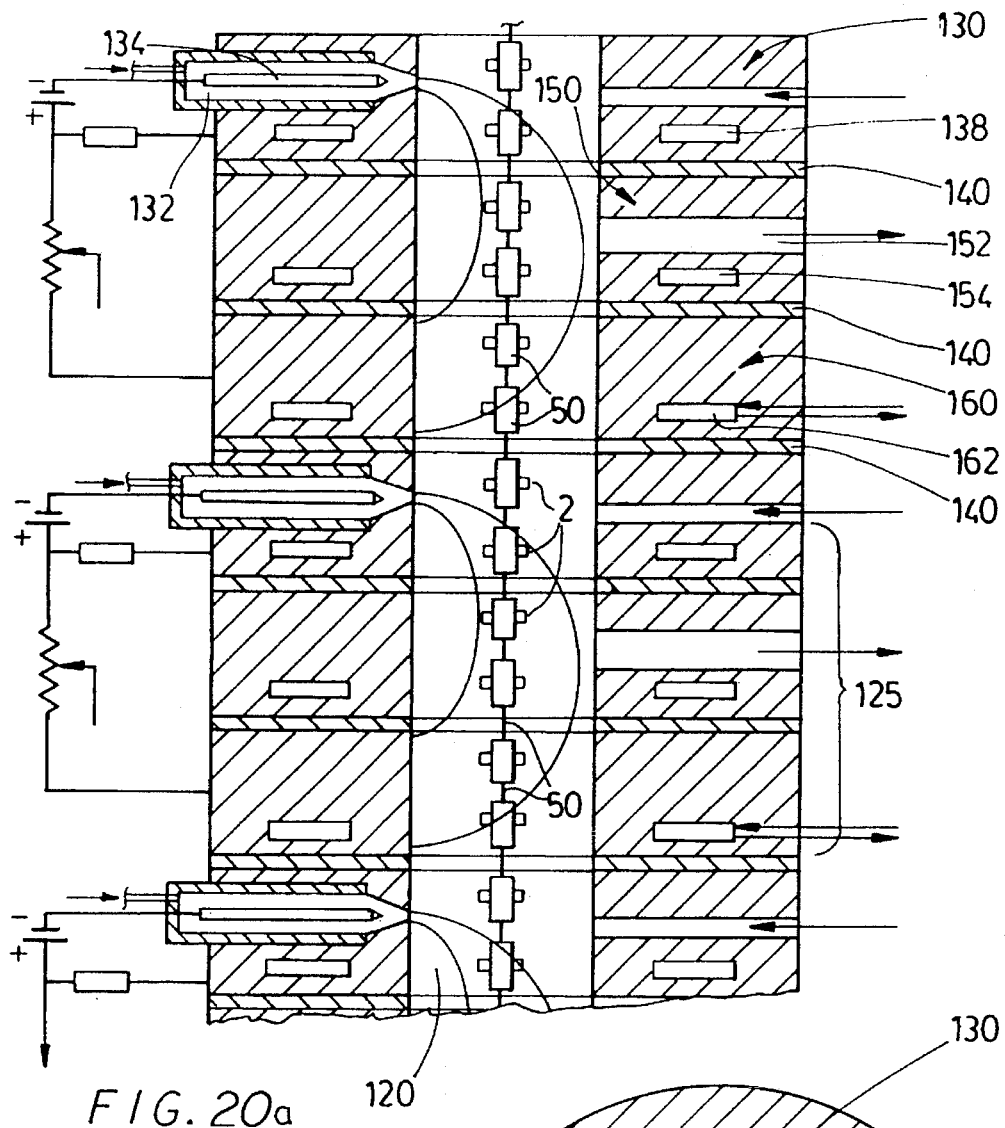
FIG. 20a is a cross section of a further multiple-discharge embodiment of the invention in which multiple cathode/ anode sections aligned coaxially form the apparatus.
Figure 21:
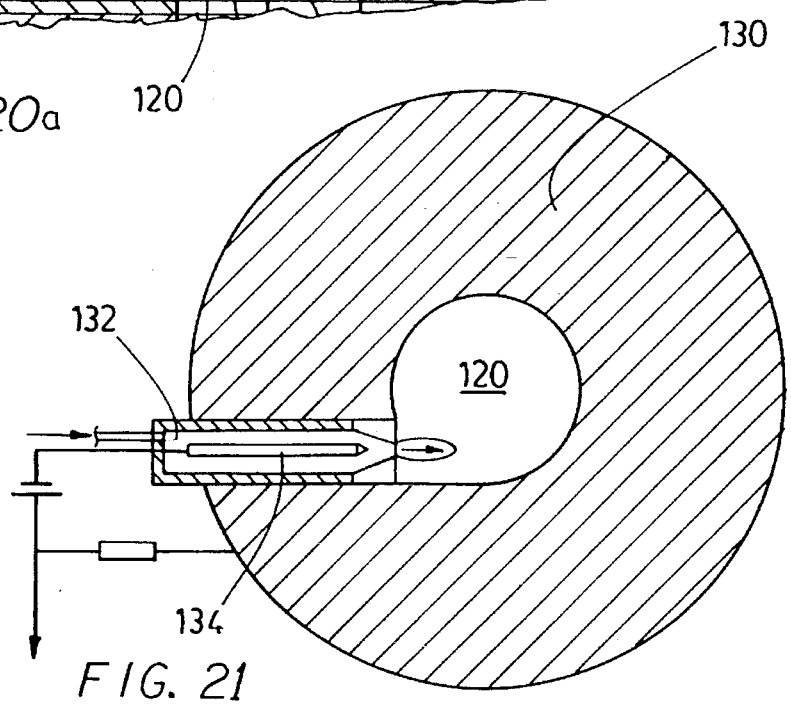
FIG. 21 is a top plan view of the embodiment illustrated in FIG. 20.

In a further embodiment of the invention, illustrated in FIGS. 20 and 21, a self contained reaction section 125 is formed from a series of three annular disks 130, 150 and 160, aligned to create a cylindrical plasma channel 120 running therethrough. Disk 130 is provided with a chamber 132 which contains a cathode 134 preferably comprising a tungsten or graphite rod. An inlet 136 for the injection of the carrier gas, plasma creating gas and reaction species is provided opposite the cathode 134. A channel 138 allows water to circulate around the disk 130, to cool the disk 130 during the coating process. A second annular disk 150, spaced from the disk 130 by an annular insulating spacer 140, is provided with an outlet 152 connected to the means for reducing pressure within the channel 120. The disk 150 is provided with a channel 154 for the circulation of a coolant such as water, to cool the disk 150 during the coating process. Separated from the disk 150 by an annular spacer 140 is a third disk 160 which contains a coolant channel 162 for circulating a coolant, to cool the disk 160 during the coating process. The disk 160 acts as an anode.

Successive series of self contained reaction sections 125 comprising disks 130, 150 and 160 are illustrated in FIG. 20a. A series of substrate holders 50 are suspended in the plasma channel 120 by dielectric fibres 52, as in the embodiment of FIG. 6. Any number of such self contained reaction sections 125 may be adjoined, separated by annular spacers 140, and each section itself constitutes a linear CVD arc coating apparatus. This embodiment, utilizing self contained reaction sections 125, can also utilize the disks 130, 150 and 160 as substrate holders instead of the axial substrate holders 50 illustrated in FIG. 20a.

Figure 20B:
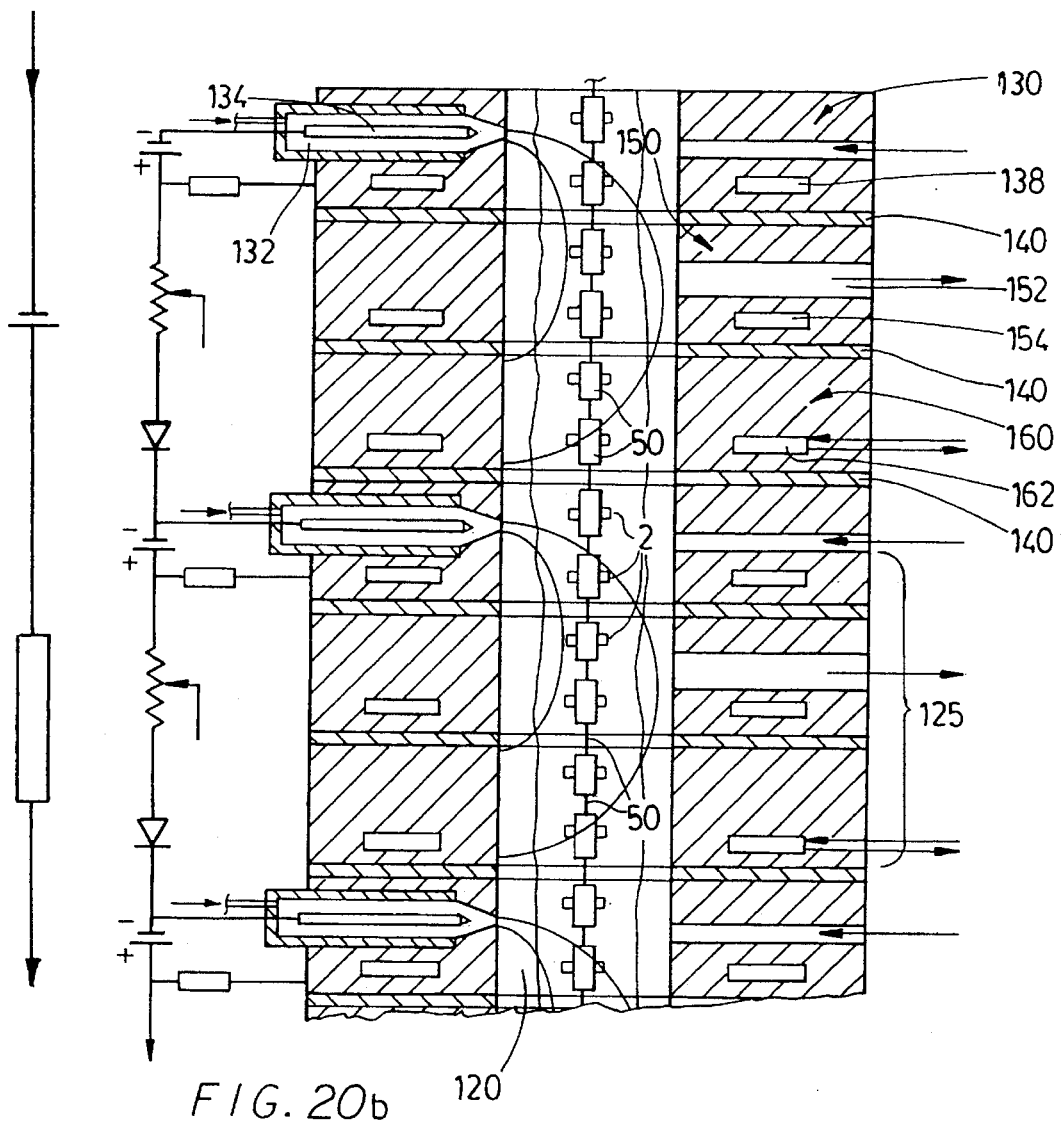
FIG. 20b is a variation of the apparatus of FIG. 20 in which a main discharge is also present in the reaction zone.

A variation of this embodiment is illustrated in FIG. 20b, identical to the embodiment of FIG. 20a except for the presence of a main arc discharge in addition to the multiple discharges within the self contained reaction sections.

In operation, a potential difference between the cathode 134 and the anode disk 160 causes an arc to burn in the tubular channel 120. The carrier gas, plasma creating gas and reaction species are injected into the inlet 136, and the coating process occurs as in the previous embodiments. This configuration provides the advantage that the length of the reaction zone 18 (and thus the length of the plasma channel 120) can be varied to suit the number of substrates 2 to be coated, while a uniform coating is obtained as between reaction sections 125 because the length of the arc (i.e. the distance from the cathode 134 to the anode disk 160) is similar in each section.

Variations in the arrangement of the cathode 12 and anode 14 are available. For example, FIG. 15 illustrates an embodiment of the invention in which a plurality of cathodes 12, three in the embodiment shown, and one or more anodes 14, are distributed around the circumference of the tube 10. This increases the durability of the apparatus. Further, by phase shifting the signal applied to each respective cathode, the arc forms between each cathode anode pair in turn, effectively creating an arc which rotates around the inner wall of the tube 10.

Figure 17A:
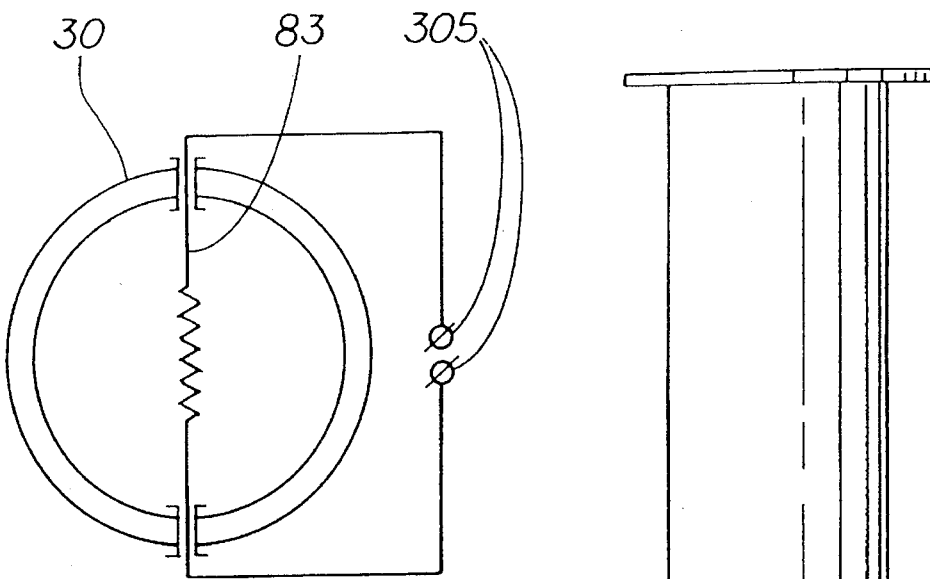
FIG. 17a is a plan view of a cathode ring including a thermionic cathode.

FIGS. 16 to 18 illustrate a further embodiment of the invention having a plurality of cathode anode pairs aligned coaxially. In this embodiment, annular rings 304a similar in structure to the substrate holders 30 are provided with a thermionic filament 83, best seen in FIG. 17a, which acts as a thermionic cathode. Interspersed between the filament-supporting rings 304a, and grounded annular rings 304b each of which acts as an anode, are substrate holders 30 for supporting the substrates. When a voltage is applied an arc is created within each cathode/anode section formed by the cathode rings 304a, the anode rings 304b and the substrate holders 30 in between. In this "active wall" embodiment, because the arc columns are so short, there is no possibility of arc breakdown, i.e. short circuiting of the arc through the substrates 2. This embodiment may therefore have particular utility in the case of conductive substrates which exceed the "critical length" referred to above. The water cooled substrate holders 30 illustrated in FIGS. 18a and 18b may be advantageously used in this embodiment. The cathode/anode sections may be utilized as self-contained reactors, in which case the anodes may be grounded or at a floating potential. If the cathode/anode sections are used in an arc furnace which has a main cathode 12 and a main anode 14, the anodes 304b of the cathode/anode sections must be at floating potential, ie. not be grounded, or the main arc discharge will be short circuited through the cathode/anode section nearest to the main cathode 12.

Figure 17B:
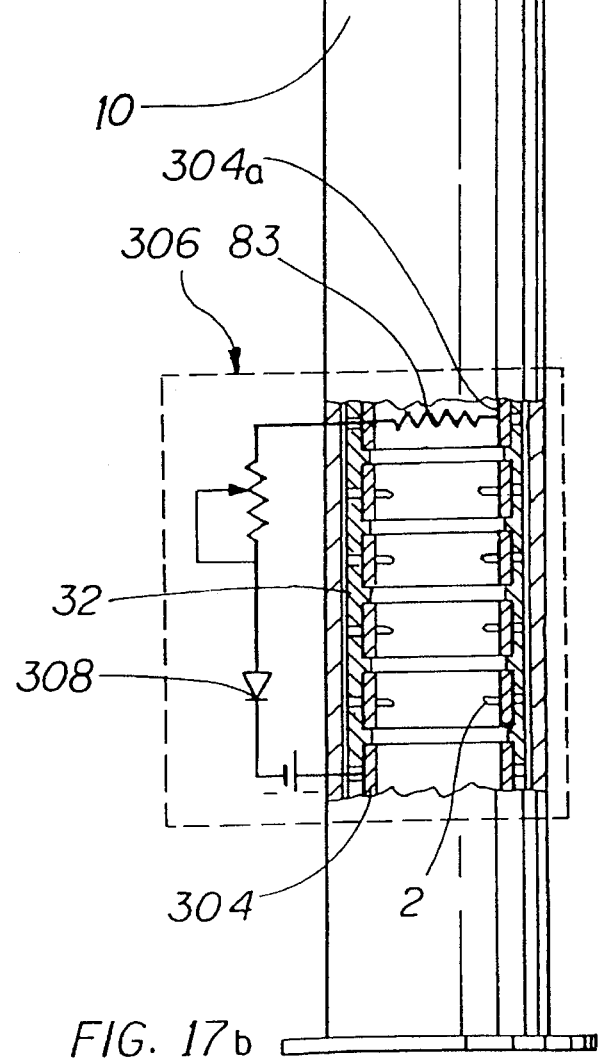
Figure 17C:
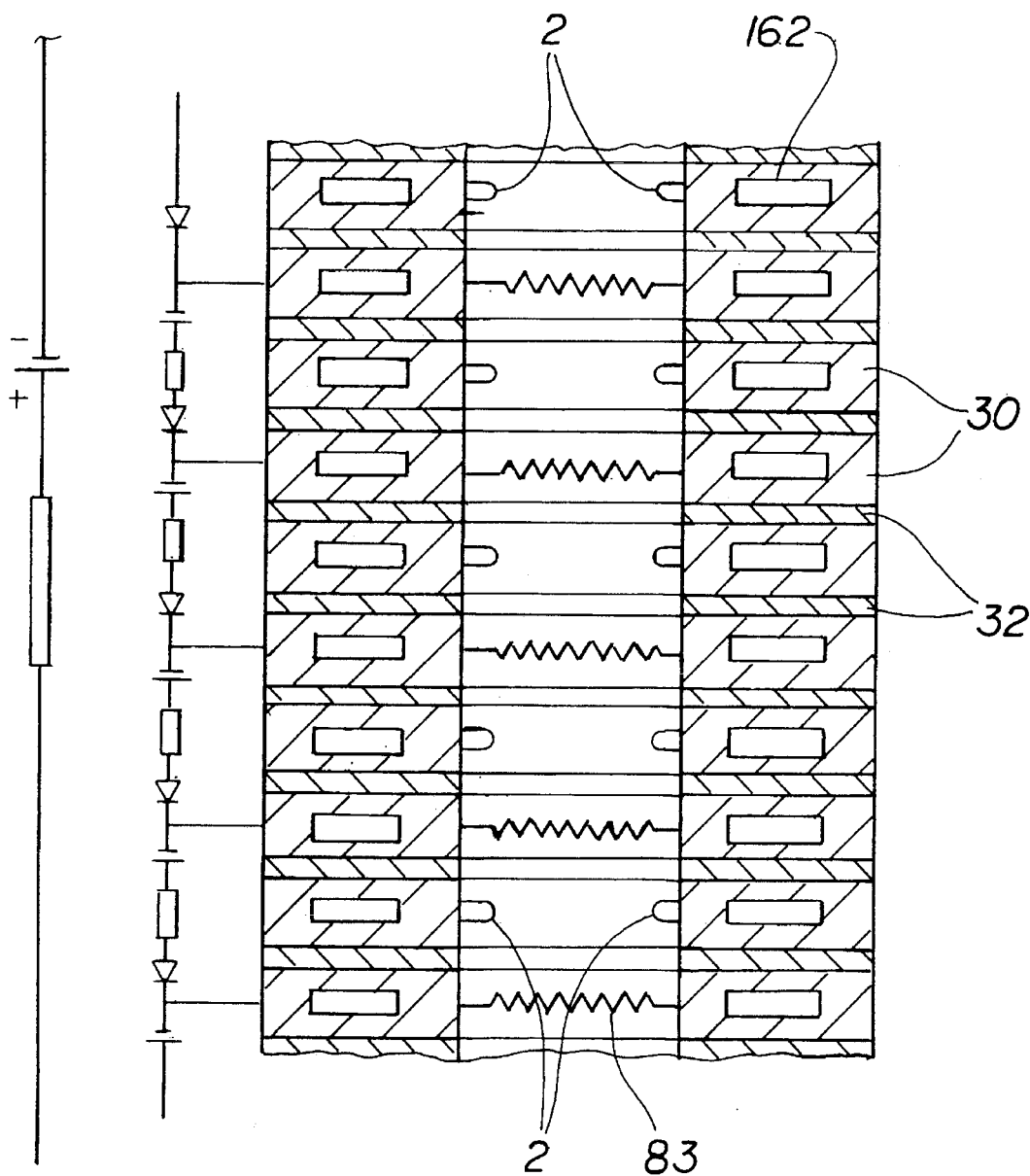
FIG. 17c is a plan view of an embodiment of anode ring including a thermionic cathode.

It is in fact possible to combine the functions of the cathode and anode rings, essentially by providing a cathode filament 83 within an anode ring 304b, provided that the anode rings are maintained at a graduating (floating) potential (increasing in the downstream direction), as in FIG. 17c.

In the above-mentioned embodiments the temperature and emissivity of the thermionic filament is dependent upon plasma conditions. For independent control of the temperature and emissivity of thermionic filament additional power supplies 305 may be connected for heating the thermionic filaments. In this embodiment auxiliary arc discharges burn between each hot filament and the corresponding substrate holder 304 (anode) disposed in the plasma flow downstream in the section, as shown in FIGS. 17a and 17b. In this embodiment the arc voltage in each thermionic filament/auxiliary anode section 306 is created either by exposure to the main discharge (there being an inherent voltage drop along the arc) or by separate DC or AC power supplies 307 connected between each hot filament 83 and the corresponding anode. In this embodiment it is important to provide a semiconductor element such as a diode 308 in each electric circuit connecting the hot filament 83 and the substrate holder 304 (anode), and to maintain the substrate holder 304 (anode) at a floating potential, in order to prevent short circuiting of the main arc discharge through the conductive path formed by the filament-anode circuit.

Figure 35:
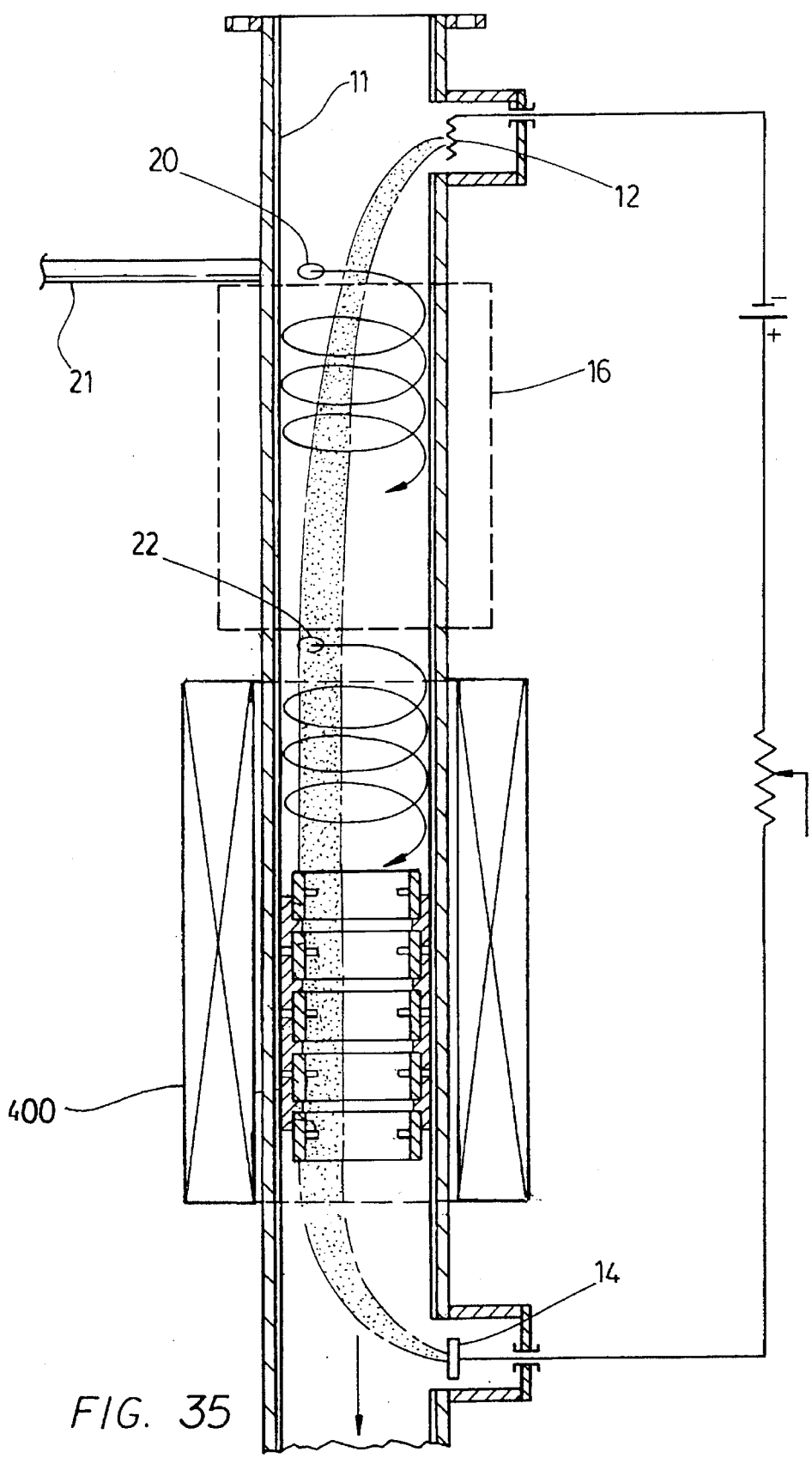
FIG. 35 is a longitudinal cross section of an embodiment of the invention in which a furnace surrounds the reaction zone.

In the all above mentioned embodiments of the invention the heating of substrates 2 depends upon plasma parameters. For independent control of the substrate temperature it is possible to immerse the entire reaction zone in a conventional furnace 400, as shown in FIG. 35. In this case a DC, AC or pulse arc is used for ionization and activation of the reaction gases, but the temperature of the substrates 2 is controlled by additional heat flow from the furnace 400.

Multiple arc-channel embodiments

It is possible to provide increased productivity in the reactor of the invention by creating a multiple-channel arc.

Figure 23:
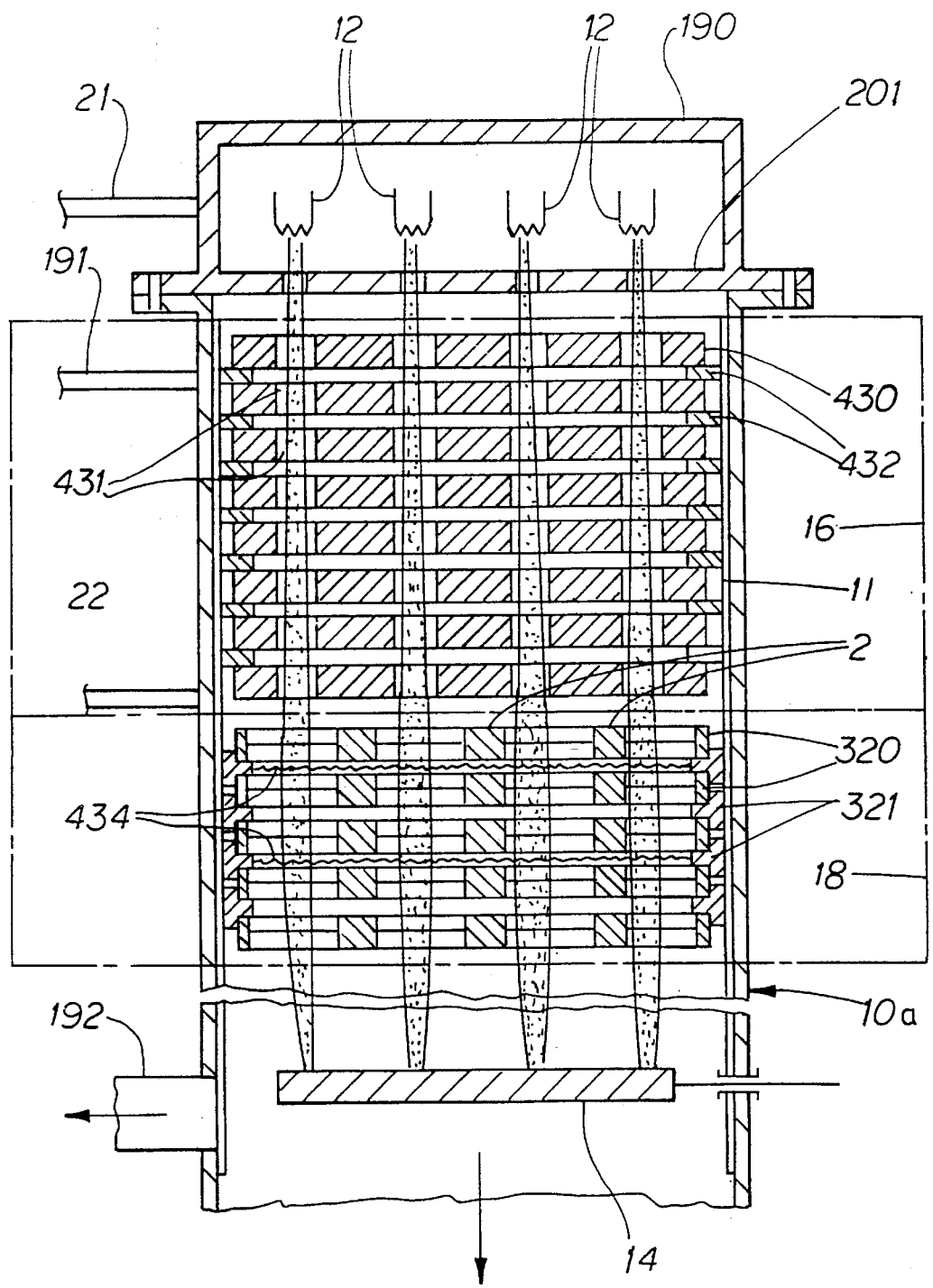
FIG. 23 is a longitudinal cross section of a further multiple-discharge embodiment of the invention in which a plurality of thermionic cathodes creates multiple arcs distributed transversely about the reaction zone.

FIG. 23 illustrates a preferred embodiment of such a reactor which has a cathode member 190 including a plurality of thermionic cathodes 12. In this embodiment the substrates 2 must be distributed such that a gap created between adjacent substrates 2 is in alignment with the thermionic cathodes 12. In this configuration the substrate holders 320, separated by spacers 321, form a plurality of liners which define the arc channels, distributed transversely about the reaction zone 18, which confine the multiple arcs to their respective arc channels. For this purpose the distance between adjacent substrates 2 should be in the range of 1 to 10 diameters of the arc column.

The plurality of cathodes 12 are disposed at regular intervals covering the cathode area, preferably in the pattern of a 3, 4, 5, or 6 sided regular polygon, to create plurality of arc columns with axes distributed in a complimentary configuration. Successive layers of substrates are aligned with one another in the reaction zone 18 so that the arc channels extend continuously throughout the layers of substrates 2, and the plurality of arcs are sustained between the cathodes 12 and the anode 14 along each arc channel thus formed. In this embodiment it is preferable to provide layers of diaphragms 430 separated by dielectric spacers 432 in the stabilizing zone 16, the diaphragms 430 having openings 431 aligned with the cathodes 12, which prevents the plasma columns from dispersing into plumes in the stabilizing zone 16. It is also possible to intersperse heating elements 434 between the substrate layers in the reaction zone 18, to allow for control of the substrate temperature independently of the arc discharge.

Figure 24:
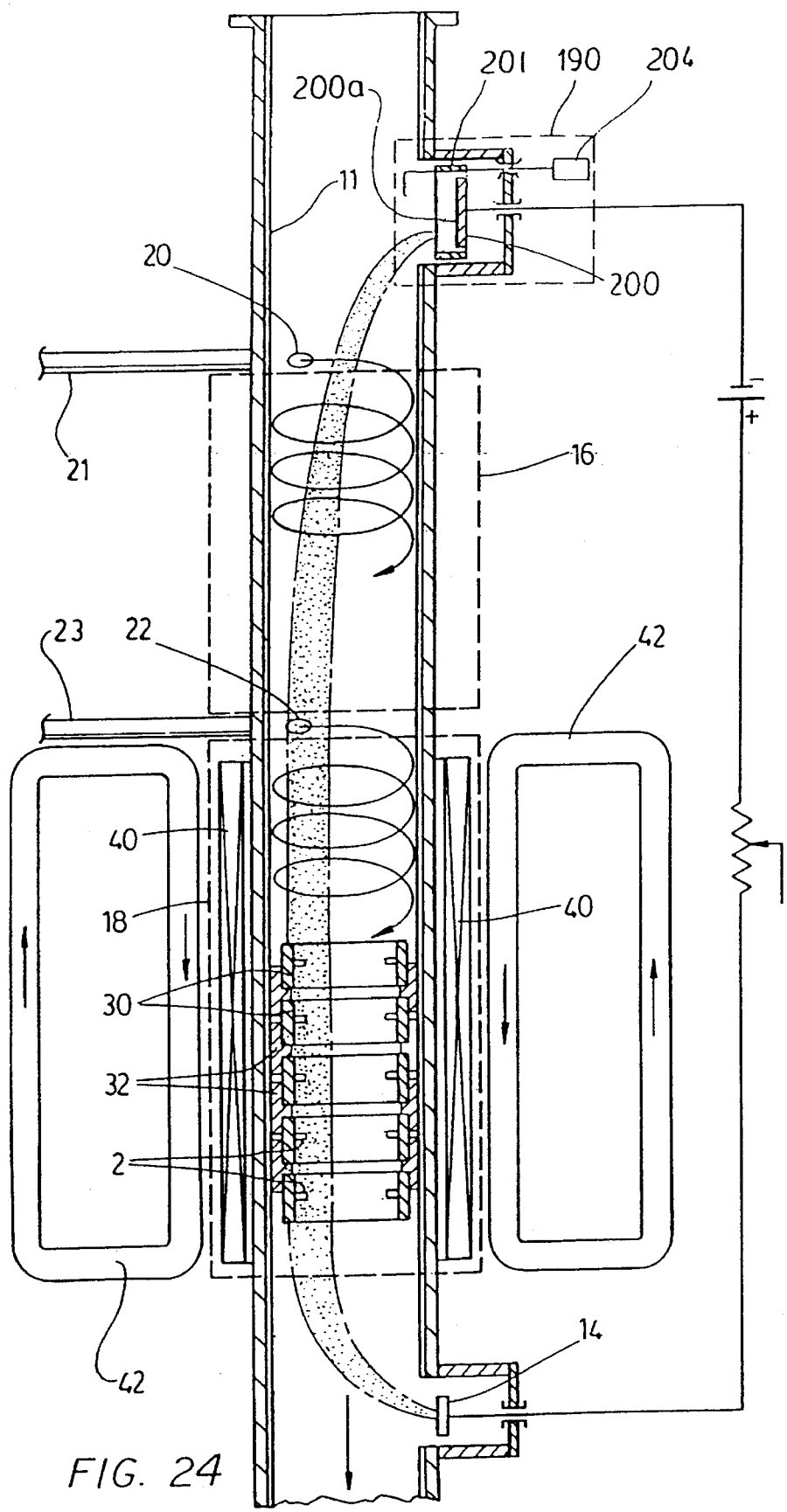
FIG. 24 is a longitudinal cross section of a further multiple-discharge embodiment of the invention utilizing a cold cathode.
Figure 25:
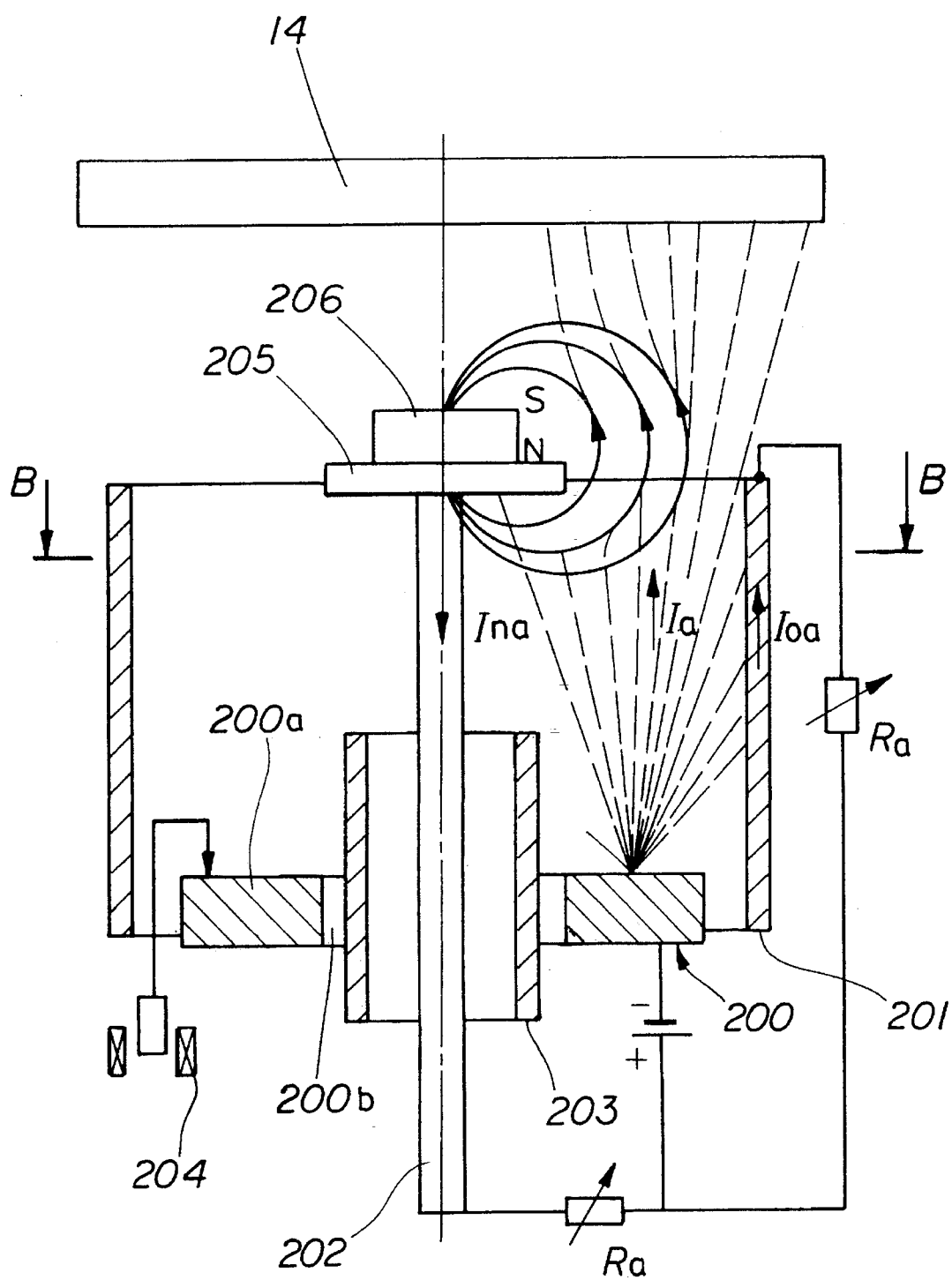
FIG. 25 is diagrammatic representation illustrating the operating principle of the cold cathode arc, as in the embodiment of FIG. 24, in which $I_a$ is the arc current, $I_{la}$ is the linear anode current, and $I_{sa}$ is the screen anode current.
Figure 26:
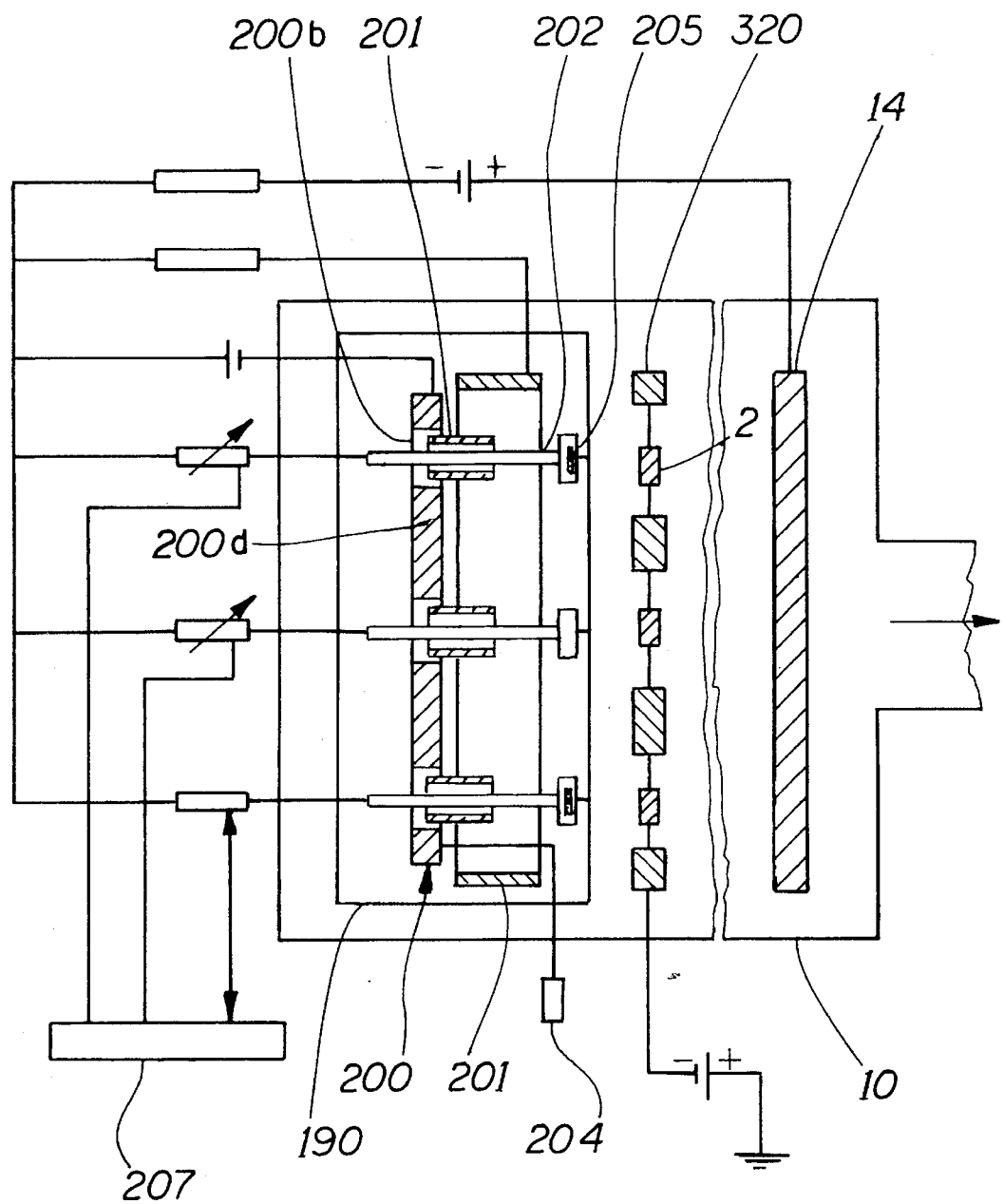
FIG. 26 is a schematic cross section of a further embodiment of the invention which utilizes a linear auxiliary anode disposed perpendicular to the working face of a cold cathode plate.

FIG. 24 illustrates a further multiple-arc embodiment of the invention which utilizes a cold consumable cathode, similar to the cathode described for example in Mularie U.S. Pat. No. 4,430,184, which is incorporated herein by reference. The cathode member 190 includes a target 200 of material to be evaporated having a working surface 200a; means comprising an igniter 204 for establishing an arc forming a cathode spot on the target working surface 200a for evaporating the target material, the arc in this embodiment being characterized by the presence of charged particles and a cathode spot which tends to randomly migrate over the working surface 200a of the target surface 200. The target 200 is surrounded by a screen 201 to prevent the migration of cathode spots out of the periphery of the target surface 200a. The screen 201 can have a floating or auxiliary anode potential; in the latter case the screen 201 will serve as a screen anode supporting the subsistence of the arc discharge. As illustrated in FIGS. 25 and 26, the screen anode circuit is connected to the remote (relative to the target 200) edge of the screen 201 to induce a closing anode current with the direction of the cathode spot current, for repelling cathode spots from the periphery of the target 200.

On occasion it may be necessary to protect the substrates 2 from penetration of target material vapour, in which case the cold cathode member 190 is preferably disposed on the wall of the tube 10, as in FIG. 24, so that the substrates 2 are out of alignment from the target working face 200a, for example in the manner described in Gorokhovsky U.S. Pat. No. 5,435,900 issued Jul. 25, 1995. It will be apparent that in this case the target 200 can be cylindrical and can circumscribe the wall tube 10.

Movement of the cathode spot can be controlled in a number of ways. Where there is a large distance between cathode target 200 and the main anode 14, at least one auxiliary linear anode 202 disposed perpendicular to the target working surface 200a is used to improve the stability of arc discharge. This embodiment is illustrated in FIGS. 25 to 27. As shown in FIG. 25 the auxiliary arc burns between the cathode target 200 and both the screen anode 201 and the linear anode 202, which is disposed through a hole 200b in the target 200 and is isolated from the target 200 by an insulator 203.

The igniter 204 is activated to initiate a cathode spot on the target working surface 200a. A baffle 205 positioned at the end of the linear anode 202 which projects into the reaction zone 18, can be used (optionally with a magnet 206)

to protect the reaction zone 18 from penetration of the vapour from the target material. The closing current in the linear anode 202 has an opposite direction relative to the cathode spot current, to attract cathode spots in the vicinity of the linear anode.

This embodiment is particularly suitable for a reactor with a channel of large diameter. The reactor in this embodiment is still be cylindrical and must still have a stabilizing zone 16 upstream of a reaction zone 18, as in the single arc-channel embodiments described above.

Figures 27A, 27B, 27C:
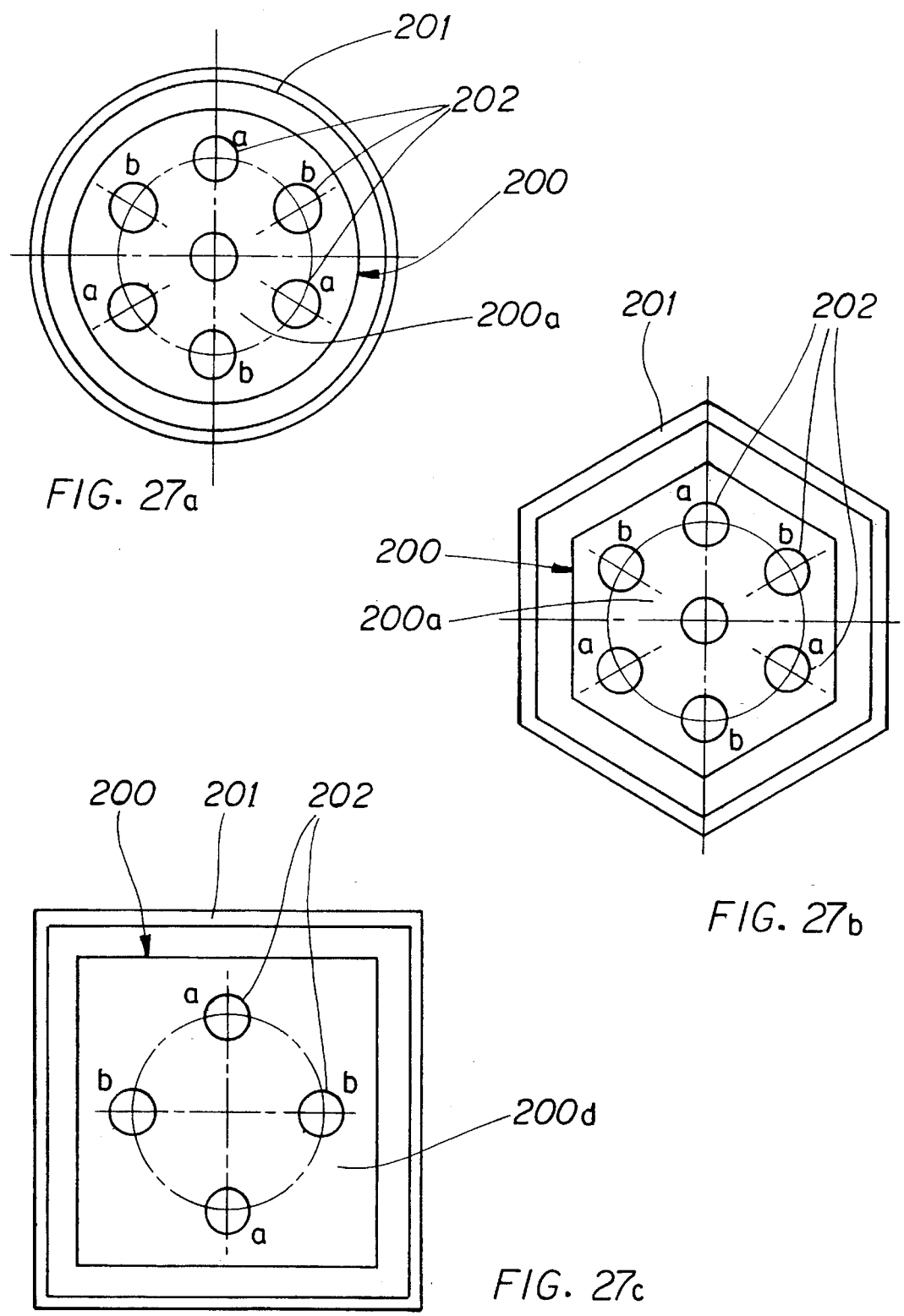
FIGS. 27a, 27b and 27c are schematic top views showing preferred distributions of linear anodes over the working face of the cathode plate of FIG. 26.

In FIG. 26, a multiple-arc channel embodiment suitable for use with a large target 200 is shown in transverse cross section. The reactor is provided with a cold cathode member 190, and plurality of linear anodes 202 which are switched on in sequence by sequencing switch 207. Cathode spots will be generated in the vicinity of whichever linear anode 202 is switched on at any given moment. As the current is sequenced through the linear anodes 202, the cathode spots scan over the working face 200a of the target 200 and the arc follows this movement, parallel to the axis of the reactor, and is thus brought into contact with the substrates 2 distributed transversely about the reaction zone 18. FIGS. 27a, 27b and 27c illustrate preferred configurations for the distribution of linear anodes 202 over the target working surface 200a, to direct the arc most uniformly about the cross section of the reaction zone 18.

Figures 28A, 28B:
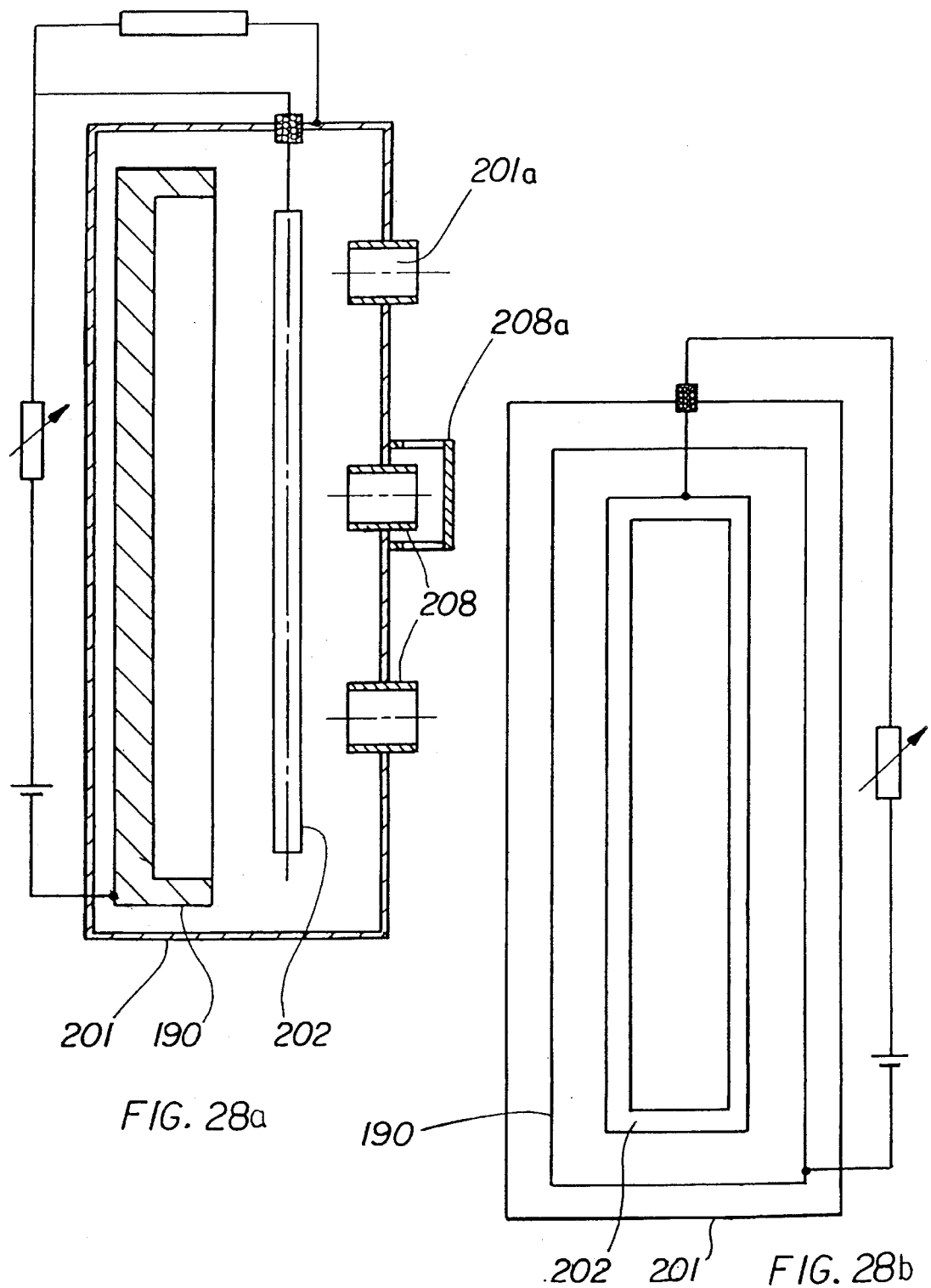

A further embodiment of a reactor incorporating a cold cathode member 190, in which the linear anode 202 is parallel to working surface 200a of the target 200 to guide the movement of the cathode spot(s), is shown in FIGS. 28a and 28b. In this embodiment the linear anode 202 forms a closed loop to create a closed path for cathode spots under the linear anode 202. The screen 201 forms a diaphragm with multiple openings 201a, as shown in FIG. 28b, which separates the cathode target 200 from the reaction zone 18 to protect the substrates 2 against penetration of vapour from the target material. The diaphragm openings 201a allow a passage through which the arc current is directed from the cathode member 190 toward the anode 202, downstream of the openings 201a.

The openings 201a are each provided with a cylindrical screen 208 upon which the target material vapour may condense. To prevent short circuiting of the arc, the axial length $l_s$ of the cylindrical screens 208 must satisfy the formula $$E_c \times l_s < V_c + V_a$$

where $E_c$ is the charge of the electric field created by the arc, $l_s$ is the effective length of the cylindrical screen 208, and $V_c$ and $V_a$ are the cathode and anode voltage drops, respectively.

Another way to protect the substrates 2 from the target material vapour is to provide a shield 208a over the openings 201a in the screen 201, as shown in FIG. 28a. As a result the substrates 2 will be out of alignment from the cathode target working face 200a. The above condition which limits the length of channel for arc current penetration must remain satisfied in this embodiment.

To confine the multiple arc columns and to channel them through the liners created by substrates 2, a plurality of diaphragms 430 are disposed in the stabilizing zone 16. As is shown in FIG. 23, the openings in the diaphragms 430 are distributed to correspond with the distribution of substrates 2, forming a multiple channel liner for confinement the arcs.

Figure 29:
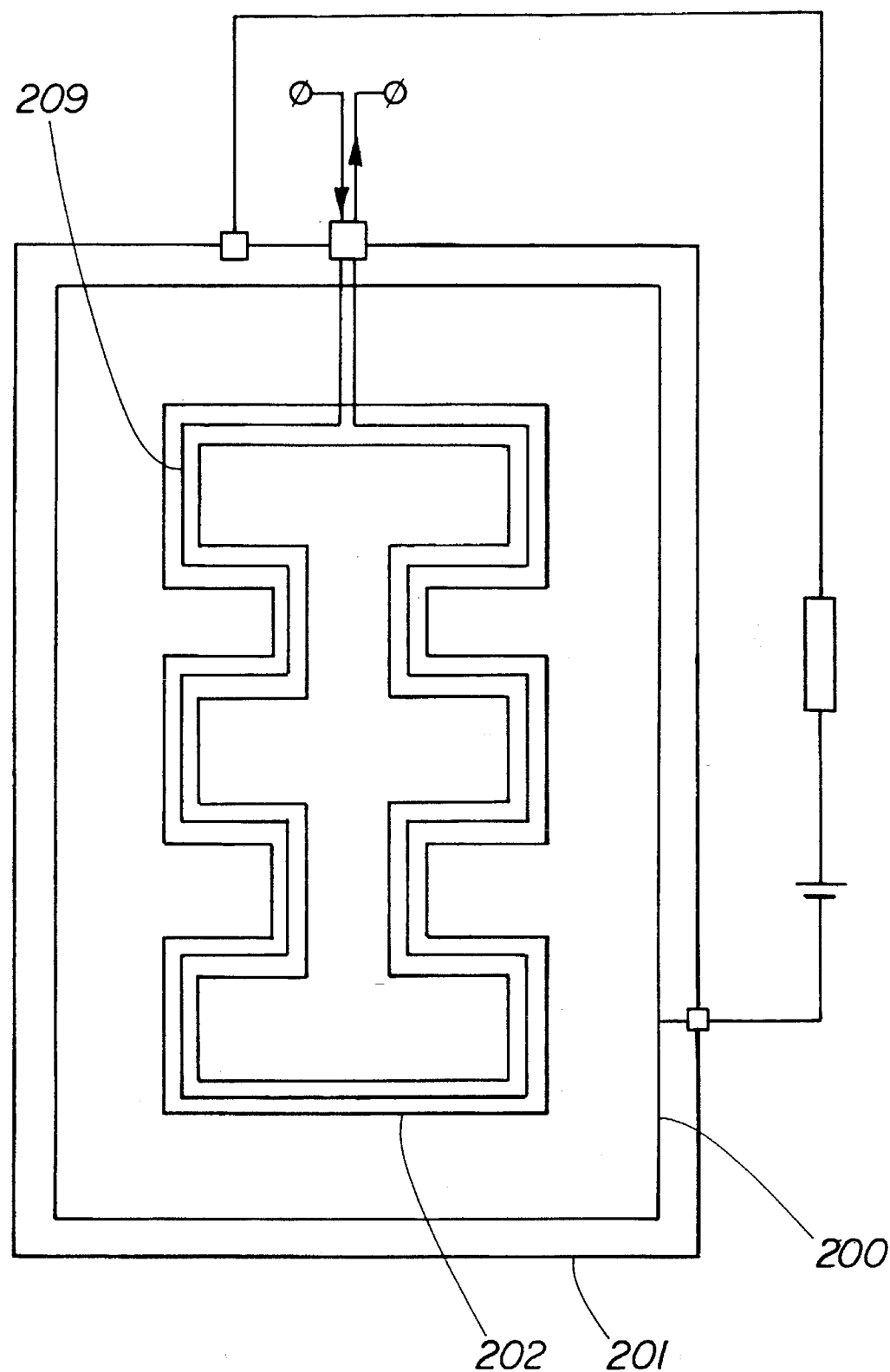
FIG. 29 is a schematic top view of an embodiment of the invention utilizing a cold cathode in which a linear anode encloses linear conductors to create closed-loop magnetic coil.
Figure 30:
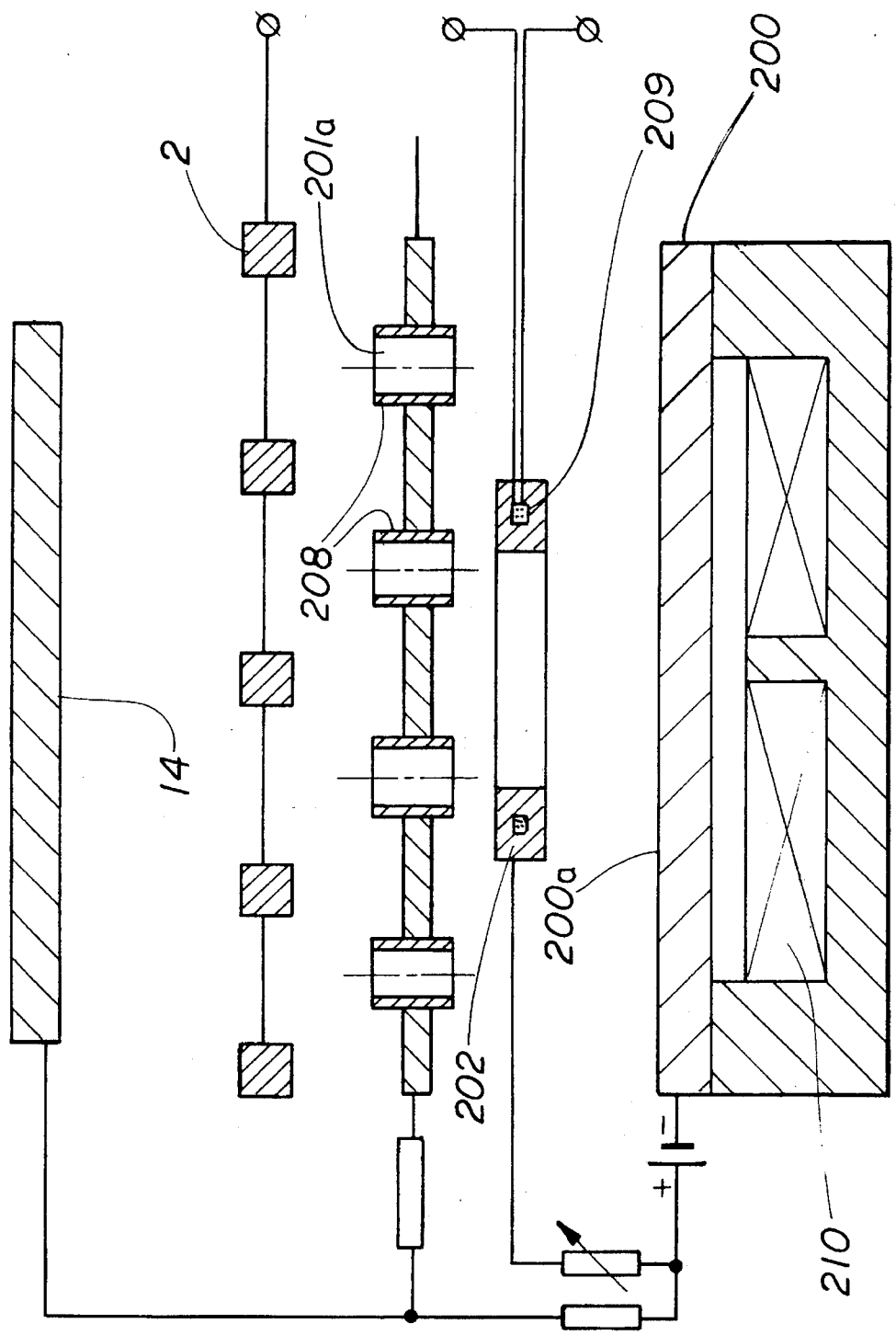
FIG. 30 is schematic cross section of an embodiment of the invention utilizing a cold cathode including magnetic field source means for establishing a closed loop path on the working surface of cathode target for guiding the movement of the cathode spot(s)

The ability to control the pattern of movement of cathode spots can be enhanced by providing a closed-loop magnetic coil 210 disposed under the working face 200a of the target 200, opposite to the linear anode 202 as seen in FIG. 30, in a manner similar to that described in Morrison U.S. Pat. No. 4,724,058, which is incorporated herein by reference. In the present invention the effect of cathode spot confinement under a closed-loop type linear anode 202 can be enhanced by a linear conductor which encases the linear anode 202 to form a closed loop magnetic coil 209, as shown in FIGS. 29 and 30, with the magnetic field lines oriented in the direction shown by the arrows in FIG. 29. Simultaneous use of both the closed-loop magnetic coil 210 under the target 200 and a closed-loop linear anode 202 above the working face 200a (with or without the enclosed magnetic coil 209) results in the synergistic improvement of arc discharge stability and thus cathode spot motion. The anode 202 can be configured in any desired pattern, limited only by the periphery of the target 200.

Figure 31:
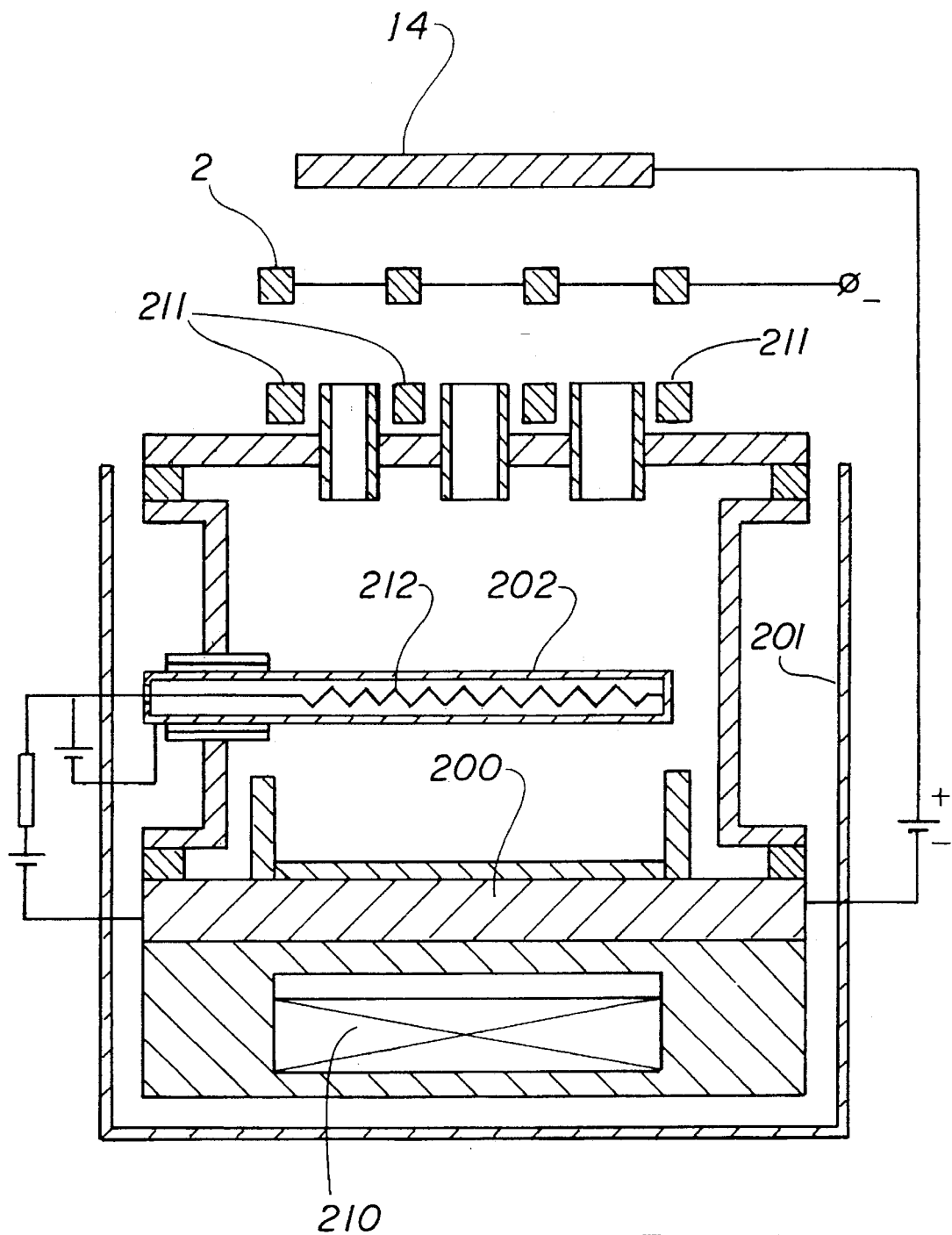
FIG. 31 is a schematic cross section of an embodiment of the invention utilizing a cold cathode including a magnetic field source disposed under the target and means for heating both the screen anode diaphragm and a linear auxiliary anode.

The effective life of a cold cathode target 200 is limited by its store of evaporating material. The effective life of the target 200 can be increased by coating the target 200 with metals having a high vapor-saturating pressure, such as Bi, Ba, Cd, Ca, Yb, Sm, Se, Sb, and the like. In this case all internal surfaces of the cathode member 190 except for the water cooled cathode target 200 must have a temperature greater than boiling temperature of the selected metal for the operating pressure of the reactor, as proposed in U.S.S.R. Inventor's Certificate No. 289458 to Donin. In this way the target vapours cannot condense anywhere except on the cathode target 200. In the Donin invention the diaphragm has only one hole, which is heated to the required temperature by the plasma. However, according to his method independent control of plasma parameters and diaphragm temperature is not possible. In the present invention the diaphragm 201 (formed from a refractory material) and the linear anode 202 are provided with heaters 211, 212 positioned as shown in FIG. 31, thus allowing independent control of the diaphragm 201 and linear anode 202 temperature.

Figure 32:
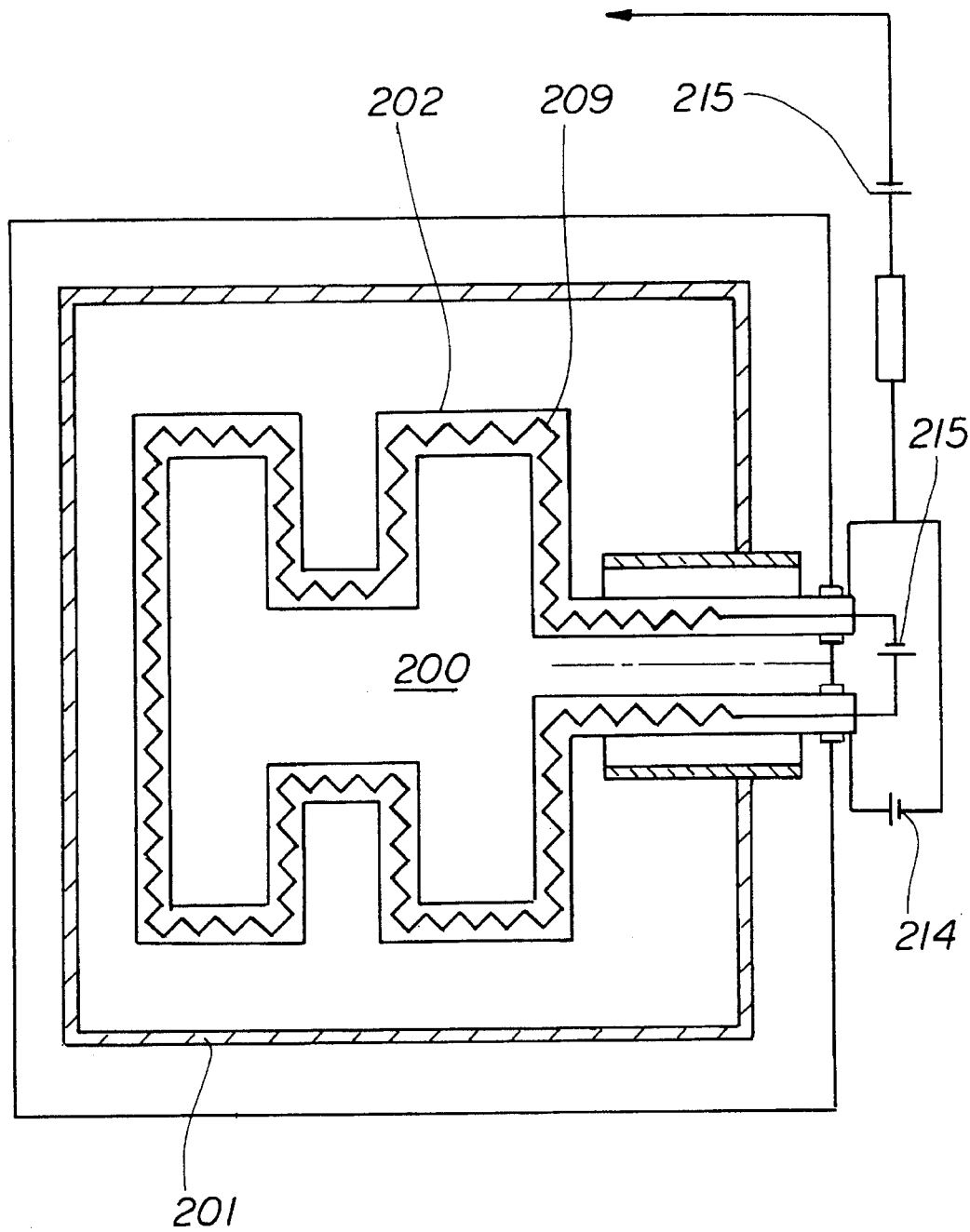
FIG. 32 is a schematic top view of a linear anode encased in linear conductors to create closed loop magnetic coil and heater.

An elevation of a closed-loop linear anode 202 with heaters 211 and a separate power supply 216 to create circuit means for the closed-loop magnetic coil 209 is shown in FIG. 32. The linear anode 202 itself forms a closed-loop magnetic coil, to guide the movement of the cathode spot, energized by a power source 214 which may be connected in series to the power supply 215 generating the arc discharge.

For independent control of the substrate temperature it is possible to dispose a set of conventional heaters 434 in the reaction zone 18, as shown in FIG. 23. In this case the DC, AC or pulse arc is used for ionization and activation of the reaction gases, but the temperature of substrates is controlled by additional heat flow from the heaters 434. To prevent short circuiting of the arc, the axial length $l_s$ of the heaters 434 must satisfy the formula $$E_c \times l_s < V_c + V_a$$

where $E_c$ is the charge of the electric field created by the arc, $l_s$ is the effective length of the heaters 434 along the axis of the reactor, and $V_c$ and $V_a$ are the cathode and anode voltage drops, respectively.

The Method of Coating Deposition

As is known, the temperature of synthesis determines both the deposition rate and the quality of the coating. In the case of certain coatings, such as diamond, the structure of the coating (e.g. crystalline or amorphic) is also determined by the temperature of synthesis. Under arc plasma conditions the precursor species transfers from the plasma flow to the substrate throughout the intermediate layer by diffusion. In general the density of flow of any neutral particles from (for example) high ionized Ar—$H_2$—$CH_4$ arc column plasma throughout the intermediate layer to the surface of the substrate would be governed by the formula:

$$j_m = -(c^2/\rho) M_m M_{Ar} D_m [\nabla x_m + k_T \nabla \ln T_g],$$

where
$x_m$ is the mole fraction of species m,
c is the total molar concentration,
$\rho$ is the plasma density,
$M_m$ is the molecular weight of m,
$T_g$ is the gas temperature,
$k_T$ is the thermal diffusion ratio,
$D_m$ is the molecular diffusion coefficient of given species in Ar (assuming that partial concentrations of $H_2$ and $CH_4$ are much less than the concentration of Ar)

As is shown by T. DebRoy et al in J.Appl.Phys., 68(5), 2424 (1990), for diamond CVD conditions both members in the above formula have a similar order. Thus, on the basis of the above formula it is possible to estimate the density of neutral species flow from plasma to the substrate as:

$$j_{TM} = -(c^2/\rho) M_m M_{Ar} D_m k_T (P_s/\lambda T_p),$$

where $\lambda$ is the thermal conductivity of plasma and $P_s$ is the density of thermal flow from the plasma to the substrates 2 (in W/cm$^2$), flowing laterally toward side surfaces of the substrates 2, according to the following equation:

$$P_s = (I_c \times E_c)/\pi D_c \propto \lambda_p \nabla T_p,$$

where
$D_c$ is the inner diameter of the hot liner formed by the treated substrates 2,
$I_c$ is the arc current,
$E_c$ is the electrical charge of the arc,
$T_p$ is plasma temperature, and
$\lambda_p$ is the plasma thermal conductivity.

These formulae show that the flow of neutral reaction species from plasma to substrate is proportional to the thermal flow from plasma to substrate.

In a highly ionized, non-isothermic plasma the temperature gradient follows the flow of charged particles. In this case the flow density of charged particles is:

$$j_i = -D_a \nabla n_e,$$

where $D_a = D_i(1 + T_e/T_g)$ is the ambipolar diffusion coefficient, and $n_e$ is the electron density. For a plasma in local thermodynamic equilibrium with a relatively low plasma temperature it is possible to state (on the basis of the Saha formula):

$$n_e \propto \exp(-E_{ion}/2kT_e)$$

where $E_{ion}$ is the ionization potential of an atomic particle. Taking this value of $n_e$ for $j_i$ yields:

$$j_i \propto -D_a n_e (-E_{ion}/T_e^2) \nabla T_e \propto D_a (E_{ion}/T_e^2) \exp(-E_{ion}/2kT_e) \nabla T_e$$

Thus, taking this as the density of thermal flow from plasma to substrates $P_s$ the density of ionized reaction species flow from plasma to substrate can be estimated as:

$$j_i \propto D_a (E_{ion}/T_e^2) \exp(-E_{ion}/2kT_e) P_s/\lambda_p$$

In this case ionized atoms and molecules move from plasma to substrate by diffusion. On the surface of the substrate they recombine, partially transform into a coating and partially return to the plasma as a neutral particles. It follows from above formulae that this recycling of ionized reaction species becomes more intense as plasma density and electron temperature increases. As is known, these magnitudes increase with the specific power of the unit plasma volume.

Thus, for enhancement of both concentration of the excited species in the vicinity of the substrate surface and the flow of excited species from plasma to substrate it is necessary to increase the specific power contributed to the unit plasma volume. In this manner the temperature of synthesis is determined by the "specific power" per unit volume of arc $P_C$ (in W/cm$^3$), which is governed by the formula $$P_c = I_c \times E_c / A_{channel},$$

where $I_c$ is the arc current, $E_c$ is the electrical charge of the arc, which is a function of the gas composition and pressure within the tube 10, and $A_{channel}$ is the cross sectional area of the arc-confining channel in the reaction zone 18.

Figure 10:
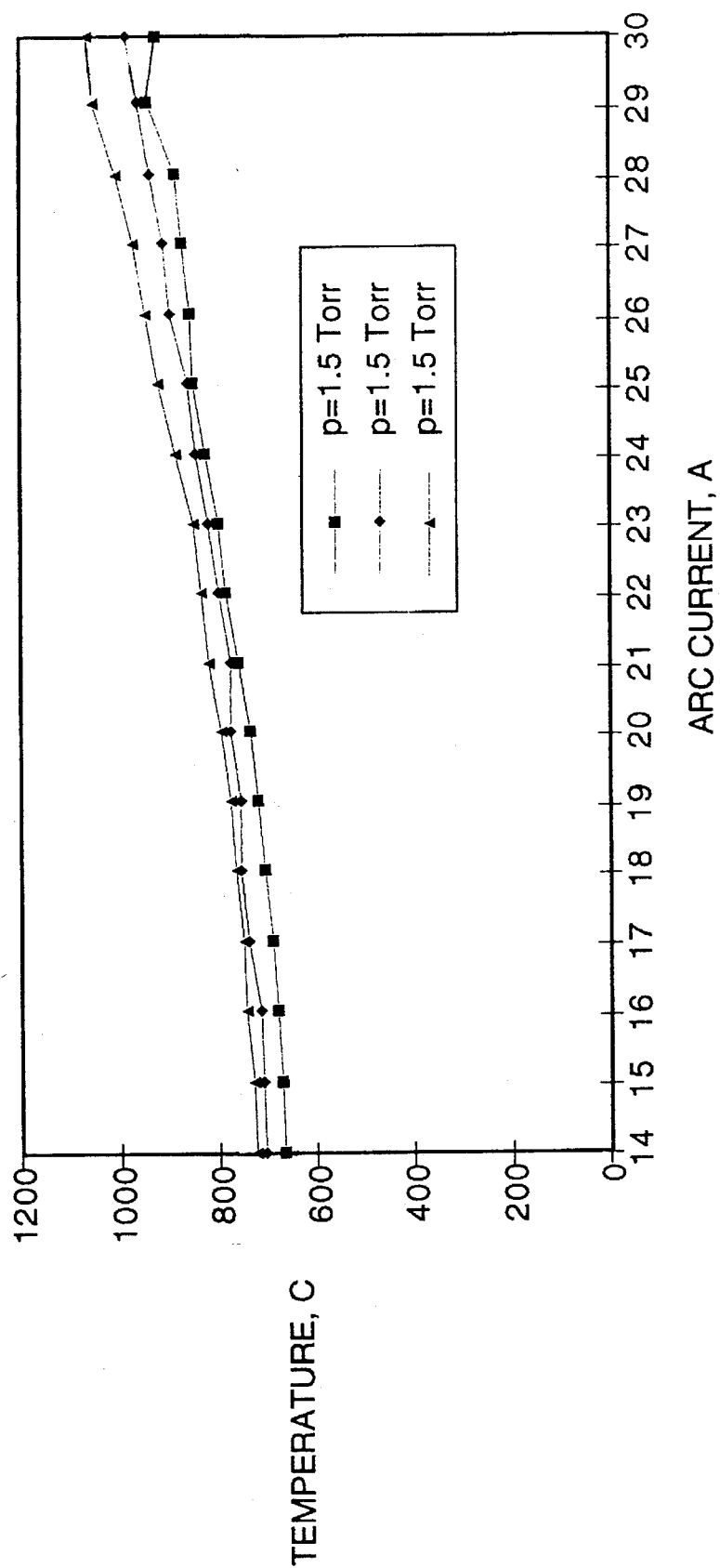
FIG. 10 is a graph showing the relationship between arc current and substrate temperature with other parameters maintained constant.

If oscillating electromagnetic energy is injected into the arc column the value ($I_c \times E_c$) used to resolve this formula is an average value which sums both the constant power and the oscillating power. Thus, the temperature of synthesis may be regulated by changing the arc current, keeping the plasma density and pressure constant, or by changing the plasma density and/or pressure. FIG. 10 illustrates the relationship between the arc current and the substrate temperature, assuming all other factors remain constant.

Preferably for depositing diamond the carrier gas will be argon or another inert gas, and the reaction species will include hydrogen plus a chemical species including carbon, such as $C_nH_m$, $C_nH_mO_p$, etc. To create a cubic boron nitride film, the reaction species will include hydrogen plus a chemical species including boron, such as $B_nH_m$ and $N_2$. The pressure within the tube 10 is reduced to the range of 10 to 1000 Torr, and the specific power of the electric arc should be in the range between 0.1 W/cm$^3$ and 50 W/cm$^3$. If the arc power is below this range the chemical species will not decompose and the substrate temperature will be too low to allow satisfactory bonding between the film and the substrate 2. If the arc power is above this range, the substrates 2 will overheat and burn.

As well as the specific power per unit volume $P_c$ an important parameter which determines the rate of deposition is the ratio between the diameter of the arc channel and the characteristic distance $D_c$ between substrates 2. As an approximation, the diameter of the arc channel d* could be taken as the diameter of an arc column zone in which the temperature is equal to one-half of maximum the temperature of plasma $d_{1/2}$ (which decreases from the centre of the channel to the periphery) such that $d^* = d_{1/2}/D_c \leq 1$. When $d^* < 0.1$ the flow of excited species and the rate of deposition from arc to plasma is too small; thus d* should be in the range between 0.1 and 1.0. For multiple-channel arc embodiments the characteristic diameter $D_1$ of the liners formed by the substrates 2 should be taken as the diameter of the arc confinement channel: $D_1 = D_c$.

It also follows from above formulae that another parameter which determines the rate of deposition is the specific side power $P_s$ (ie. the power transferred from the plasma to the substrate). When $P_s$ is too large the substrate will be overheated; when too small the thermal flow will not be sufficient for heating the substrates and the temperature of substrates will be less than temperature of the synthesized coating. To enhance the diffusion flow of reaction species from the plasma to the substrate requires increasing the gradient of the plasma temperature near the substrate; but to prevent overheating of the substrate this parameter must be limited. Optimally the maximum value of $j_i$ for given $P_s$=const should be determined by thermal condition of the substrate. As follows from above formulae, to satisfy these conditions one must either improve the electron temperature $T_e$ or to reduce the ionization potential of the plasma.

There are numerous ways to achieve this these purposes. One is to inject a species with a low ionization potential such as alkali metals into the plasma. Another is by heating the electron component of the plasma by injection of an oscillating electromagnetic signal into the plasma. In addition, it is possible to reduce the ionization potential of the reaction species by selective excitation of electrons of reaction species atoms using coherent laser radiation.

A high rate of deposition and quality of coating will be achieved when a high flow of power from the plasma to the substrate surface and a corresponding high diffusion flow of excited species combines with intensive cooling of the substrate. For deposition of diamond and related materials the specific side power $P_s$ should be in a range between 0.5 W/cm² and 100 W/cm². The upper limit of $P_s$ is determined by the limit of the substrate temperature. The lower limit of $P_s$ is determined by a negligible rate of deposition.

Thus, in the case of diamond coating deposition on the WC-Co cemented carbide cutting tools (inserts, drills, etc.) the temperature of the substrates 2 must be in the range of 800° to 900° C. The substrate surface must be protected against the creation of cobalt, which eliminates diamond nucleation centres. (Cobalt penetrates from bulk carbide to the substrate surface by diffusion at a temperature greater than 950° C.). However, it is necessary to retain a high density of power flow ($P_s$) from the plasma to the coated substrate to achieve a high rate of deposition. An embodiment of the invention which is able to satisfy these mutually contradictory requirements is shown in FIG. 2d. In this case metal rings of aluminium or copper having large ratio between outside $R_s$ and inside $R_c$ radius ($R_s/R_c$=3–10) serve as substrate holders 30 for the substrates 2. These rings 30 are separated by dielectric spacers 32 and suspended along the axis of the water cooled liner 81 to create a "gas cooled" liner for confinement of the arc column. The difference between the reactor of FIG. 18a and that of FIG. 2d resides in the gap 81a between substrate holder "liner" and the water cooled liner 81. As shown in FIG. 2d the gap 81a is injected with additional gas flow through inlet and outlet 191,192, respectively, for enhancement the cooling of the substrate holder "liner". This requires a gas with a high arc voltage and a high breakdown voltage as well as efficient thermal transfer properties. In the case of diamond and related materials coating deposition, hydrogen is suitable as a cooling gas. Because the gap 81a between the liner 81 and the substrate holder 30 is much smaller than the substrate holder outside radius $R_s$ ($\delta_g \ll R_s$), and the temperature of the liner 81 is close to the cooling water temperature $T_w$, it is possible to state for the temperature of the inside surface of the substrate holder 30:

$$T_c - T_w = (I_c E_c/2\pi)[(1/\lambda_s)\ln(R_c/R_s) + 1/(R_s\alpha)],$$

where $E_c$ is the charge of the electric field created in the arc column by the arc with an arc current $I_c$, $T_c$ is the temperature of the inner face of the substrate holder 30, $\lambda_s$ is thermal conductivity of substrate holder material, and $\alpha$ is the thermal transfer coefficient for gas cooling of the substrate holder 30.

For characteristic parameters $I_c E_c = 3 \times 10^4$ W/m, the flow rate of hydrogen in the gap 81a between the substrate holder 30 and the liner 81 $G_H$=5 slm, pressure p=250 Torr, $R_s/R_c$=4, $\lambda_s$=200 W/m·deg C(for an aluminium substrate holder 30), $\alpha$=150(W/m²·degC) (for a hydrogen laminar flow in the gap 81a between the substrate holder 30 and the liner 81), $R_s$=0.1 m and $\delta_g$=0.004 m, the above formula yields $T_c$<300° C. These conditions provide the necessary cooling of substrates suitable for diamond coating deposition (the substrate temperature was measured at less than 800° C.) simultaneously with a relatively high density of side flow of power from plasma to substrate ($P_s \geq 30$ W/cm²).

To further improve the deposition rate of diamond and related materials in the coating process it is possible to use halogen compounds with alkali metals such as Li, K, Na, Cs, Fr. The alkali metals have a low ionization potential and when these compounds are injected into the arc column the arc voltage reduction results in a corresponding reduction of substrate temperature and expansion of the diameter of the arc column, enabling the distribution of a greater number of substrates 2 in the reaction zone 18. At the same time, some of these metals, as for example Li, are catalytic substances for diamond film deposition, as described in Angus U.S. Pat. No. 3,630,677.

To improve the cooling of substrates 2 in the deposition process, the substrates 2 may be disposed through openings in water-cooled "liner" substrate sections 30, as in the embodiment of FIG. 18b. In the embodiment of FIG. 2d, fins provided along the outer walls of the substrate holders 30 will improve gas cooling.

Methods of Enhancing Deposition

The deposition process can be enhanced by utilizing a separate source of power, in a number of ways.

One manner of enhancing deposition by a separate power source is by injecting into the plasma an oscillating electromagnetic signal in the range of 10 Hz to 1 GHz, using a suitable RF or LF generator G, from either the upstream end or the downstream end of the tube 10, or both. This embodiment is illustrated in FIGS. 4 and 6. Local concentrations of electrons in the vicinity of the substrate 2 tend to cause a voltage drop in the deposited film, which inhibits further deposition and can destroy the film. The injected oscillating electromagnetic field heats the plasma and disperses local concentrations of electrons, thus reducing this effect. In addition, the oscillating electromagnetic field in the vicinity of the substrates 2 will neutralize the surface charge of the dielectric films and thus protect the coatings from breaking down. Alternatively, the longitudinal magnetic field established in the reaction zone 18 by the magnetic coil 40 can be made to oscillate, which will reduce local concentrations of electrons with the same results.

Another way of enhancing deposition is by periodically injecting into the arc column high voltage and high frequency pulses, with period frequency in the range of 10 Hz–10 kHz and pulse signal frequency in the range of 10 kHz–1 GHz. The voltage amplitude of these pulses should be in the range between the arc voltage and three times the breakdown voltage in the gaseous gap between the cathode 12 and the anode 14. To achieve the optimal conditions for coating in this embodiment for diamond and related materials, the gas temperature $T_g$ should range between one and ten times the substrate temperature, and the electron temperature $T_e$ should range from 1 to 100 eV. These conditions allow for a relatively low substrate and gas temperature with a high concentration of dissociated and excited species.

Figure 5:
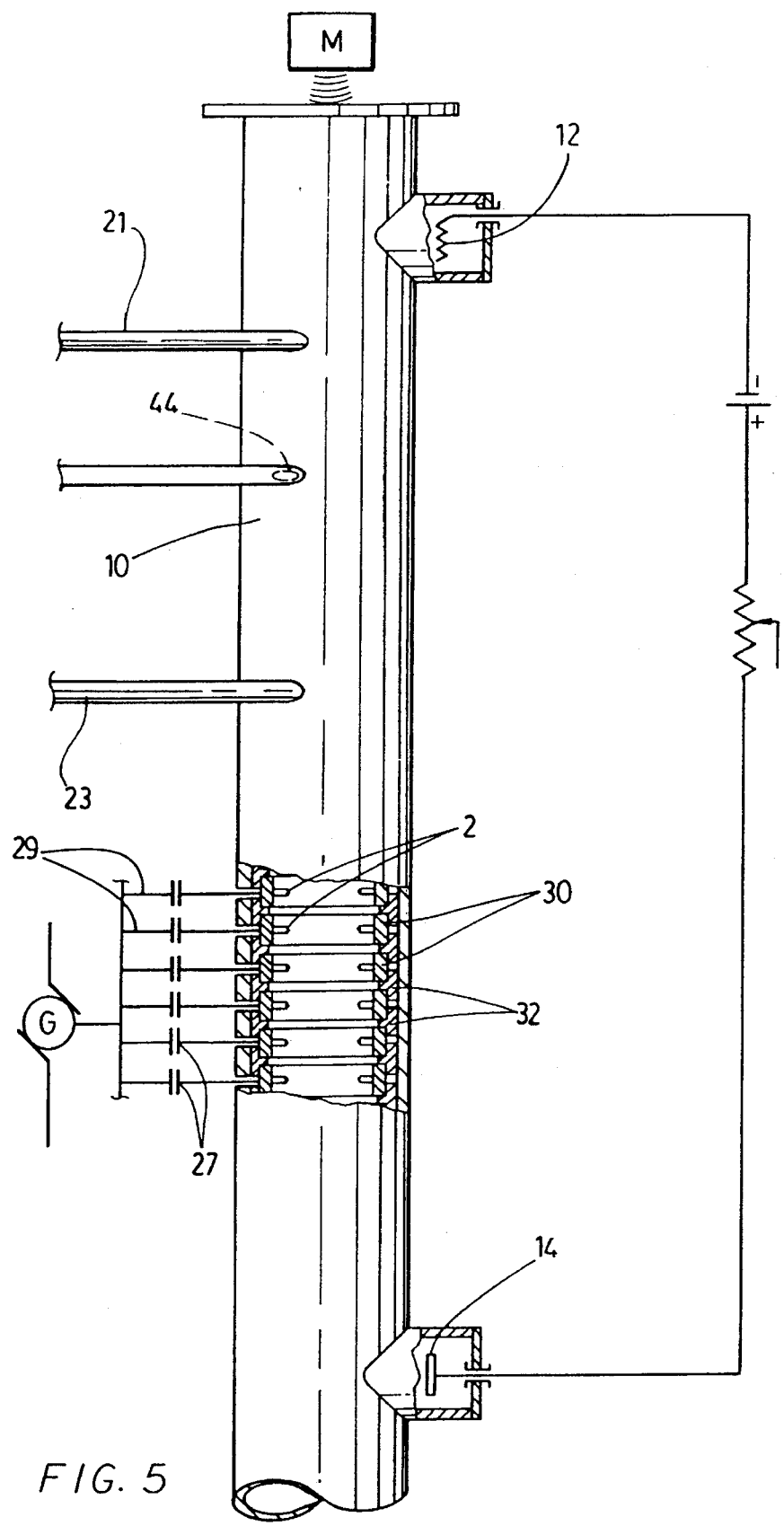
FIG. 5 is a partially cut-away view of a still further embodiment of a single-arc discharge apparatus of the present invention.

The deposition process can also be enhanced by applying a bias voltage to the substrates 2, by connecting an AC, DC or pulse generator G to the substrate holders 30 through conductors 29 passing through the wall of the tube 10, as shown in FIG. 5. The bias voltage should be applied in the form of negative and/or positive periodic pulses. Diamond, for example, has a low deposition rate but a very low etching rate. Graphite, on the other hand, has a high deposition rate but a very high etching rate. Diamond film deposition occurs effectively where the etching rate of graphite is greater than its deposition rate and the deposition rate of diamond is greater than its etching rate. The etching rate of graphite is increased by applying a negative bias voltage to the substrates 2, which improves ion bombardment of the substrate 2 and results in an increased coating adhesion and compensation of the surface charge on the substrate 2. As shown in the SIMS chart of FIG. 14b the ion bombardment of growing diamond films on a negative-biased molybdenum substrate results in up to a five-fold improvement in the width of the intermediate layer. Positive voltage pulses improve electron bombardment of the substrate resulting in multiplication of nucleation centres and thus improvement of the deposition rate, and an increased purity of the coating through annealing of defects as they form in a crystalline film. Either a DC or a low frequency AC voltage can be applied, so long as the bias voltage satisfies the condition $$V_{bs} - V_p < 10 \, V_c$$

where $V_{bs}$ is the bias potential on the substrates,
$V_p$ is the plasma potential near the substrates 2, and
$V_c$ is the voltage drop on the cathode.

A difference between $V_{bs}$ and $V_p$ exceeding $10 \, V_c$ will lead to electrical breakdown between the surface of the substrate 2 and the arc column.

Figure 18C:
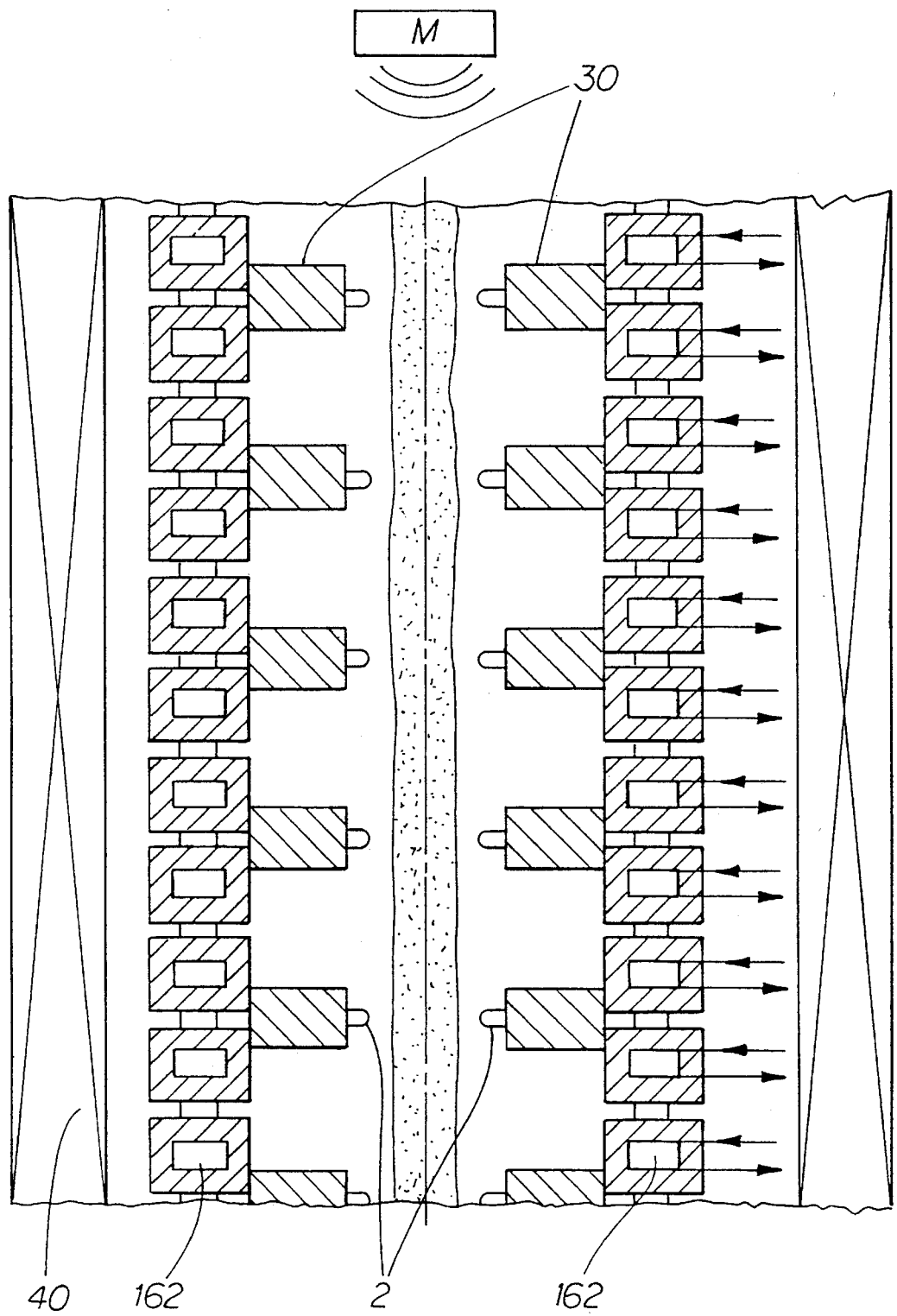
FIG. 18c is a cross section of a variation of the substrate holders of FIG. 17 in a microwave-assisted reactor.

Another means of enhancing deposition utilizes a microwave generator M injecting a 1 GHz to 300 GHz signal into either the upstream end or the downstream end of the tube 10, as illustrated in FIG. 5. A further variation of this embodiment is illustrated in FIG. 18c, in which the tube 10 is formed from copper with a silver coating, to act as a microwave waveguide. The inner wall of the tube 10 should be provided with a liner of dielectric material, such as boron nitride, to insulate the tube 10 from the charged plasma. The injection of microwave energy in this fashion has an effect similar to that described above with respect to the injection of RF and LF energy. If the reactor tube 10 has a very large diameter in comparison to the wavelength of the microwave pulse ($\lambda \ll D_t$), provided the liner 11 is formed of a dielectric material the arc column should itself act as a waveguide. Dielectric substrates 2 are preferred in this embodiment to avoid losses from microwave absorption.

The optimum condition for depositing diamond and related materials, such as cubic boron nitride, in a low pressure range (i.e. less than 1 Torr) requires a longitudinal magnetic field satisfying the electron cyclotron resonance (ECR) condition in the plasma column where the electron gyration frequency is equal to that of the microwave. Thus, for a microwave frequency of 2.45 GHz, a longitudinal magnetic field of 1,000 Gauss is required for a pressure of 0.01 Torr. For pressures ranging between 0.001 and 10 Torr, a longitudinal magnetic field ranging from 100 to 10,000 Gauss is required for a microwave frequency in the range of 100 MHz to 10 GHz.

The deposition process can be enhanced as well by injecting light, preferably from a laser L, into either the upstream end or the downstream end of the tube, as illustrated in FIG. 6. The coherent light generated by the laser activates atoms and molecules through excitation of electron states, rendering them more susceptible to reaction and adding energy to the plasma column. This can be accomplished particularly effectively using a laser resonator, such as that illustrated in FIG. 19. The ends of the tube 10 are transparent, and mirrors 85 are positioned so as to reflect light from the laser L axially along the plasma column. By resonating the laser light in this fashion a low power laser will suffice to achieve the desired enhancement.

The optimum condition for laser enhancement requires that the gas composition be such as to be selectively excited by the coherent laser radiation, so that one of the components of the plasma chemical reaction—excited atoms, molecules or radicals—will accumulate the light energy of the determined wavelength by selective excitation. In this case the reaction gas mixture can be adjusted to serve both as a chemical reaction environment and as a lasing medium, with the tube 10 acting as a laser cavity. With the injection of laser light (optical pumping) and appropriate resonance a population inversion will result. It is also possible to use laser excitation of the reaction gas simultaneously with a pulse arc discharge to dissociate and ionize excited atoms and molecules. This variation of the method is especially suitable for elemental and/or isotope separation.

Figure 22:
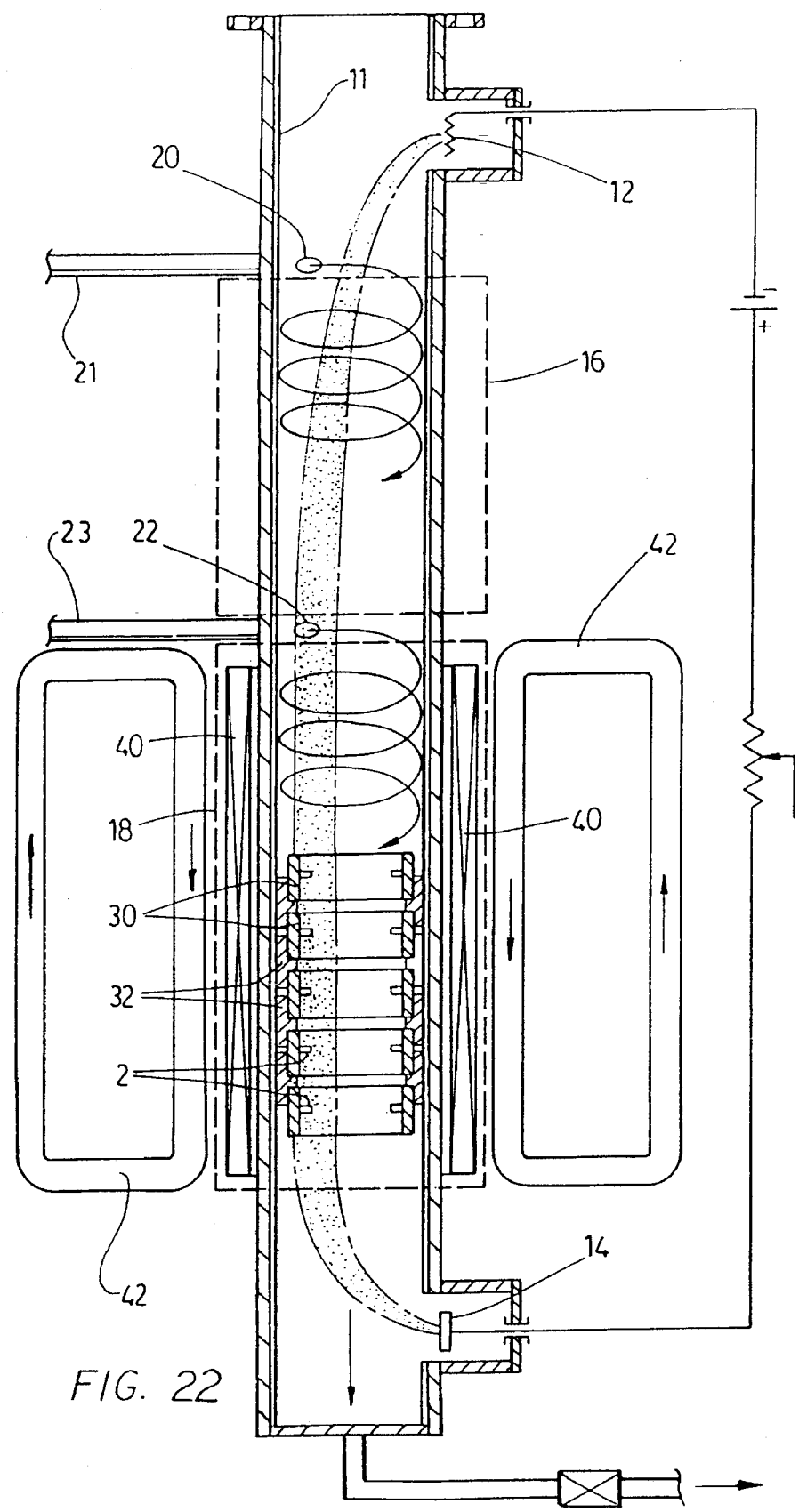
FIG. 22 is a cross section of a further embodiment of the invention in which the reaction tube is sealed during the arc coating process.

Because the apparatus of the invention allows the deposition process to occur at atmospheric pressure, in a preferred embodiment there is no need for any means for reducing pressure in the reaction zone 18. FIG. 22 illustrates such an embodiment, which is essentially identical to the embodiment illustrated in FIGS. 1 to 4 except that the ends of the tube 10 are sealed. In this embodiment the plasma creating gas, for example hydrogen, is merely a transport agent for the coating material, for example graphite particles, in a "transport chemical reaction" similar to the diamond coating process described for example in "Diamond Coating from a Solid Carbon Source" by Jou, Doerr and Bunshah, Thin Solid Films 253 (1994) 95–102, which is incorporated herein by reference. Carbon atoms, which may be produced by a hot cathode composed of graphite or carbon inserts distributed homogeneously within the tube, form weak chemical bonds (CH radicals) with the hydrogen, and are carried to the substrate 2 by natural movement of the gas within the tube. Rotation of the tube wall or the substrate holder liner improves the deposition rate. In this embodiment the tube 10 must be periodically or continuously blown through to keep the reaction zone 18 clear of accumulated hydrocarbons.

The source of the reaction species gas may be provided inside the sealed reaction tube in this embodiment. For example, graphite particles or tablets for the emission of carbon atoms can be situated inside the tube, preferably outside of the reaction zone 18, which act as an absorber or an emitter of the reaction species. Thus, so called "getters", which are hybrids of metals such as titanium alloys (e.g. TiFe, TiZr) that when heated to an absorption temperature of about 200° C. attract and absorb hydrogen atoms, and when heated to a higher emission temperature such as 500° C. emit hydrogen atoms, can be used as a source of gas for the deposition process.

$H_2$ saturated tablets can be heated by the arc in the reaction zone 18, or by a separate heating source outside of the reaction zone 18, and will emit hydrogen atoms during the heating process. In fact, positioning such "getters" at one ("inlet") end of the reaction zone 18 and heating these to the emission temperature, and positioning a non sputtering getter such as TiZr, ZrAl or the like at the other ("outlet") end of the reaction zone 18 and heating them to the absorption temperature, will result in a flow of hydrogen gas through the reaction zone 18, without any actual injection or removal of gas from the tube 10. With this configuration $H_2$ gas and the reaction gases (for example $C_mH_n$, $C_mH_nO_p$, etc.) will flow through the reaction zone 18.

It will be apparent that in this sealed embodiment it is also possible to use an AC or pulse arc. For independent control of the substrate temperature it is possible to dispose the reaction zone 18 of the sealed reactor in a conventional furnace 450, as shown in FIG. 35. In this case the DC, AC or pulse arc is used for ionization and activation of the reaction gases, but the temperature of the substrates 2 is controlled by additional heat flow from the furnace 450.

Figure 22A:
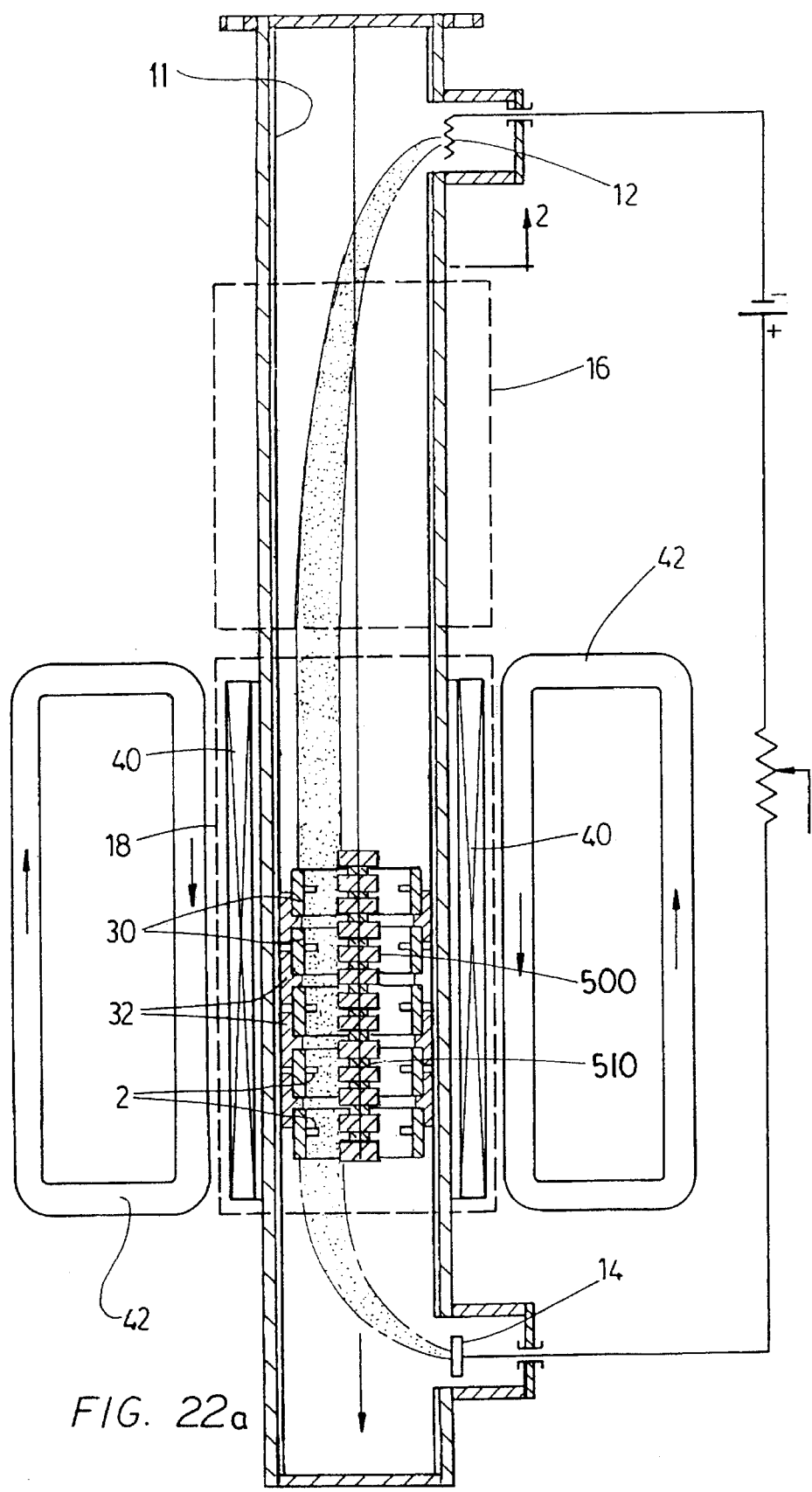
FIG. 22a is a longitudinal cross section of the embodiment of the embodiment of FIG. 22 in which graphite tablets are suspended along the axis of the reaction zone.

A further embodiment which is shown in FIG. 22a is particularly well suited for both sealed and open reactor tubes. Valves 21a and 23a are provided for sealing the reactor tube 10. In this embodiment the reaction species is in the form of solid tablets 500 suspended along the axis of the reaction zone 18 while the substrates 2 are disposed along the wall of the reaction zone 18. For example, for diamond film deposition graphite tablets 500 may be suspended along the axis, separated by alumina discs 510. In a process of diamond film deposition using this method the temperature of the graphite tablets 500 was 200°–300° C. greater than the temperature of the substrates 2. Under the influence of hydrogen contained in a plasma, carbon atoms were transformed into the gaseous phase and then transported toward the substrates where diamond film deposition occurred. This embodiment provides improved conditions for a transport reaction for the deposition of diamond and related materials. Another way to dispose a solid evaporate species such as graphite in the reaction zone 18 is to dispose both the reaction species (eg. graphite blocks) and the substrates 2 along the inner wall of the reaction tube 10.

This embodiment is also particularly well suited for use in microgravity conditions, and for use with a powdered reaction species such as graphite particles. The graphite particles will float freely and distribute evenly throughout the reaction zone. The substrates 2 similarly float freely throughout the plasma, and the coating process occurs through the transport chemical reaction as the substrate encounters CH radicals and displaces carbon atoms therefrom. In this condition, the wall of the tube 10 itself actually acts as a substrate holder, confining the free floating substrates within the plasma contained in the tube 10.

Figure 33A:
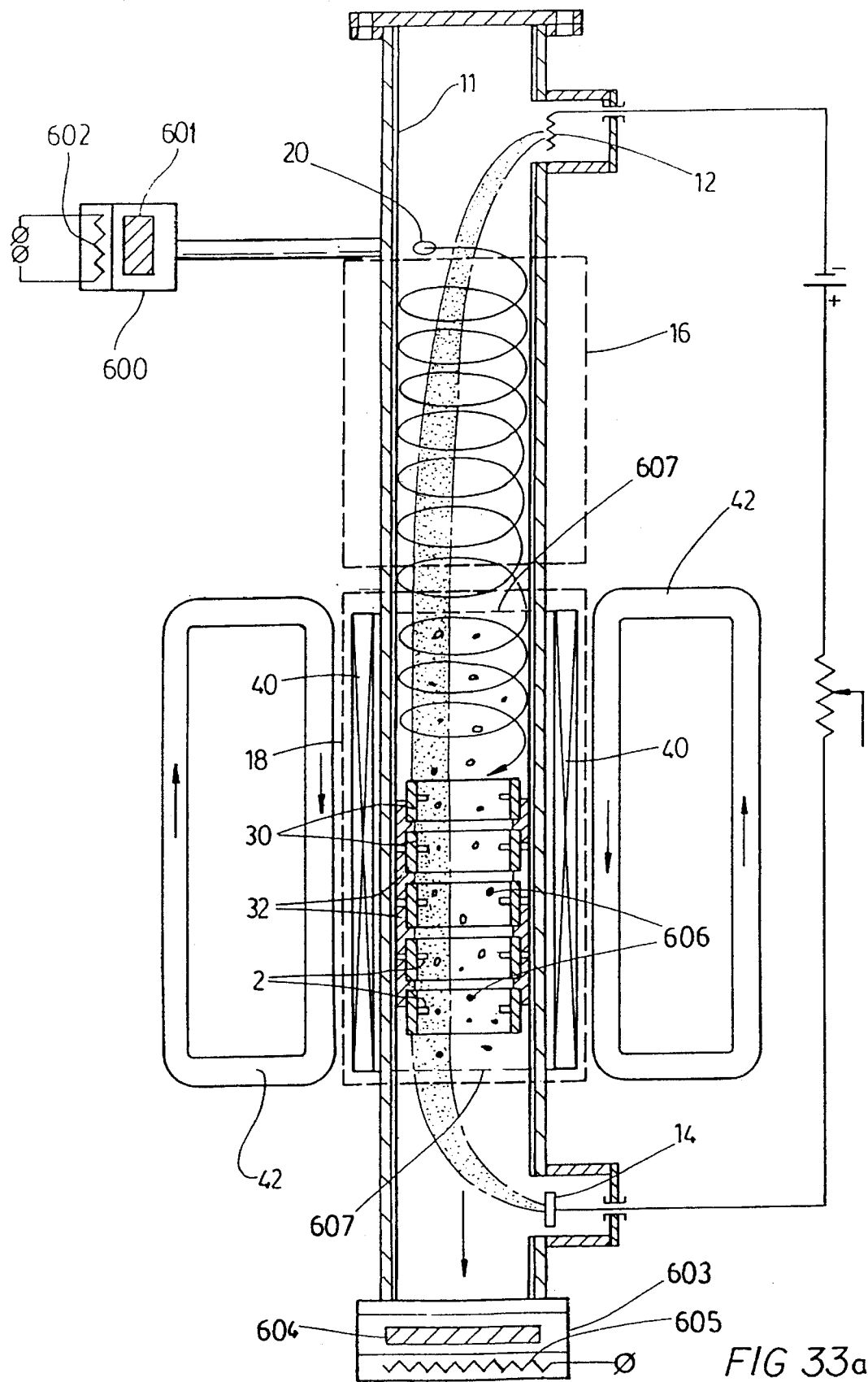
FIG. 33a is a schematic cross section of an apparatus embodying the invention for simultaneously coating free-floating and stationary substrates.

In the embodiment illustrated in FIG. 33a an apparatus of the invention is adapted to simultaneously coat free-floating and stationary substrates mounted on the substrate holders 30. A hydrogen source 600, consisting of a tablet 601 composed of a hydride metal (eg. titanium hydride) and a heater 602 to activate the tablet 601, injects hydrogen into the sealed tube 10. A getter container 603 disposed downstream of the anode 14 contains a non-sputtering getter 604 and a heater 605 for activating the getter 604. Substrates 606 of powder or small articles free-floating under microgravity conditions are immersed in the flow of hydrogen under constant Ar pressure. Screens 607 formed from refractory materials confine the free-floating substrates within containers 608 in the reaction zone 18.

Figure 33B:
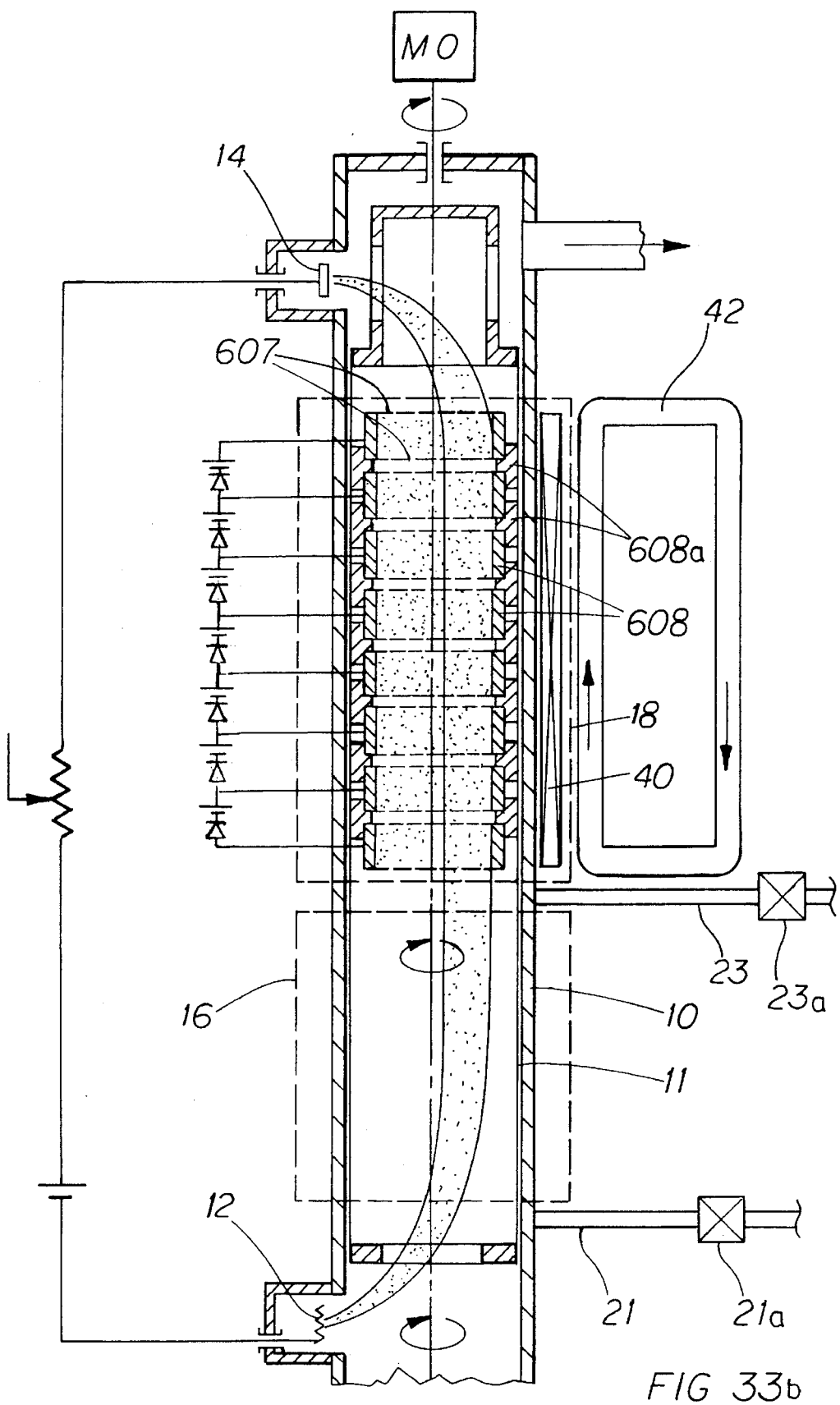
FIG. 33b is a cross sectional partial elevation of an embodiment of the invention adapted for plasma treatment of a powder or small articles in a plurality of aligned containers.
Figure 33D:
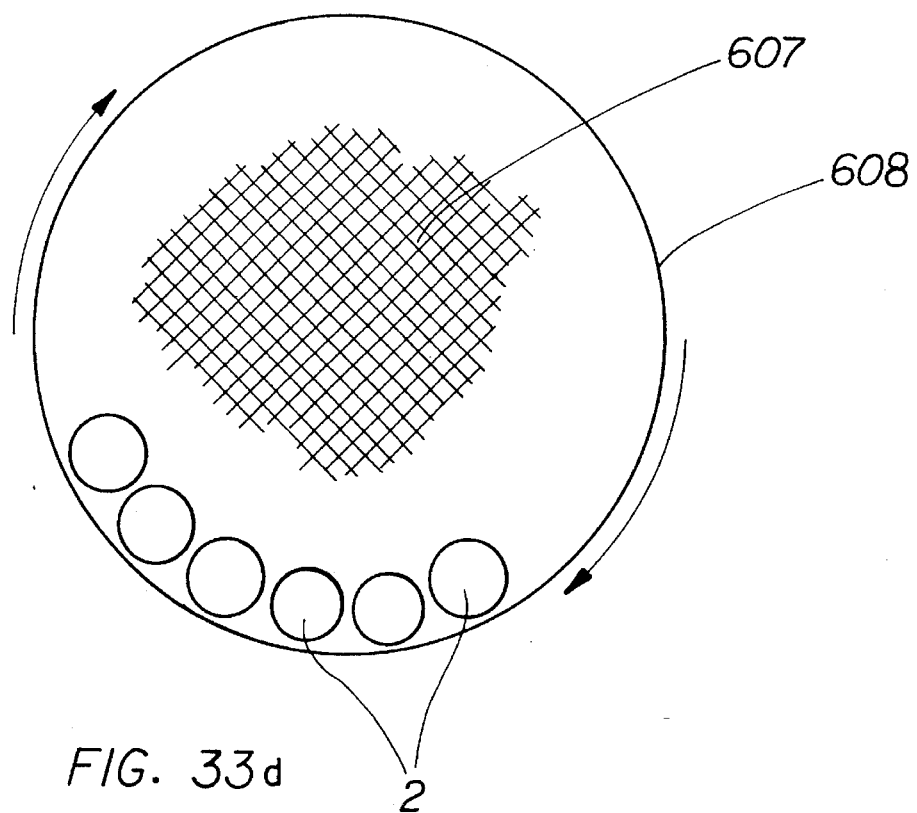
FIG. 33d is a plan view of a further preferred container for the apparatus of FIG. 33b.
Figure 33C:
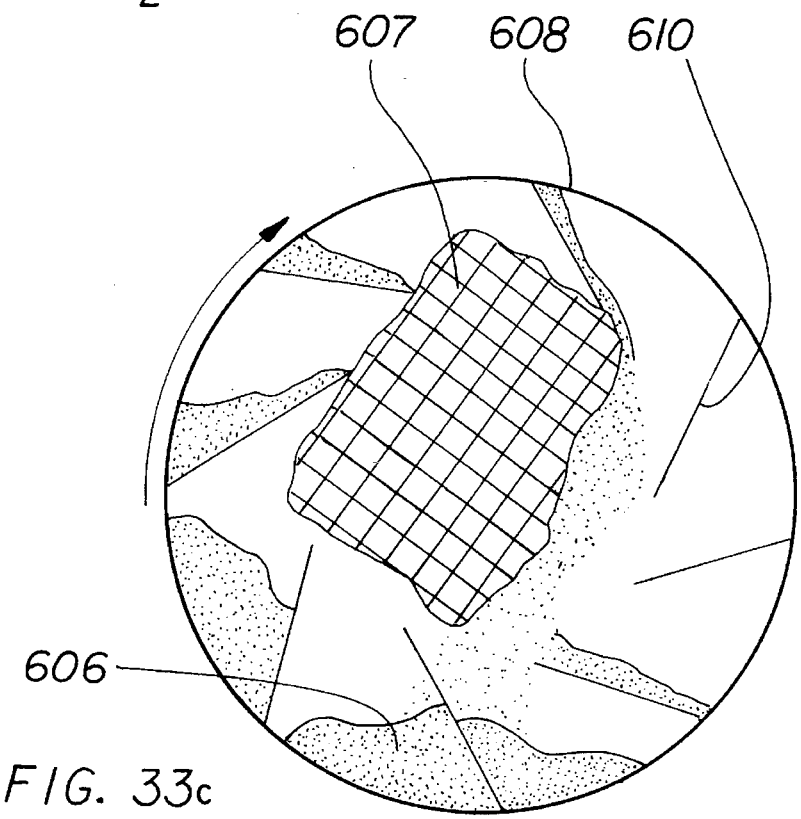
FIG. 33c is a plan view of a preferred container for the apparatus of FIG. 33b.

To create free-floating conditions under normal (Earth) gravity conditions this embodiment of the invention may be disposed in a horizontal position, as shown in FIG. 33b, and the liner 11 (or the entire tube 10) may be rotated as for example by a motor MO. Refractory screens 607 serve to contain or encapsulate the continuously free-falling substrate powder within the containers 608. As shown in FIG. 33c, longitudinal fins 609 extending obliquely into the reaction zone 18 may be provided to toss the powder during each revolution of the tube 10. In the coating of small balls, cylinders or like articles, it is possible to allow the substrates to roll along the inner wall of the reactor as shown in FIG. 33d. These embodiments are particularly suitable for coating powder or small articles because encapsulation of the substrates in this fashion is similar to rendering the substrates stationary. As in the earlier embodiments, the axial length $1_s$ of each substrate holder or "container" 608 must satisfy the formula $$E_c \times l_s < V_c + V_a$$

where
$E_c$ is the charge of the electric field created by the arc,
$l_s$ is the effective length of the substrate container 608,
$V_c$ is the voltage of the cathode, and
$V_a$ is the voltage of the anode.

In addition, the size of each open cell in the refractory screens 607 should be greater than 5 Debye radius, to allow passage of the arc through the "container", and of course less than the characteristic diameter of the powder particles or small articles.

To improve the productivity of this embodiment or adapt it for the treatment of a conductive powder or the application of a conductive coating, a plurality of substrate containers 608 defined between the transverse screens 607 can be aligned along the reaction zone 18 and separated by dielectric spacers 608a, as shown in FIG. 33b. The length of each container 608 must satisfy the "critical length" formula as stated above, and the flow rate of the reaction gases should be sufficient to achieve a fluidization condition of powder in the container(s).

In this embodiment it is possible for the containers 608 to form self-contained reaction sections by applying a current between adjacent containers 608, as illustrated in FIG. 33b. In this embodiment, once the refractory screen 607 reaches the thermionic temperature threshold it essentially acts as a thermionic filament. Therefore, as in the multiple-filament embodiment of FIG. 17c, the "anode" screen 607 must be kept at a floating potential in order to prevent short circuiting of the main arc discharge through the refractory screen 607.

Figure 34A:
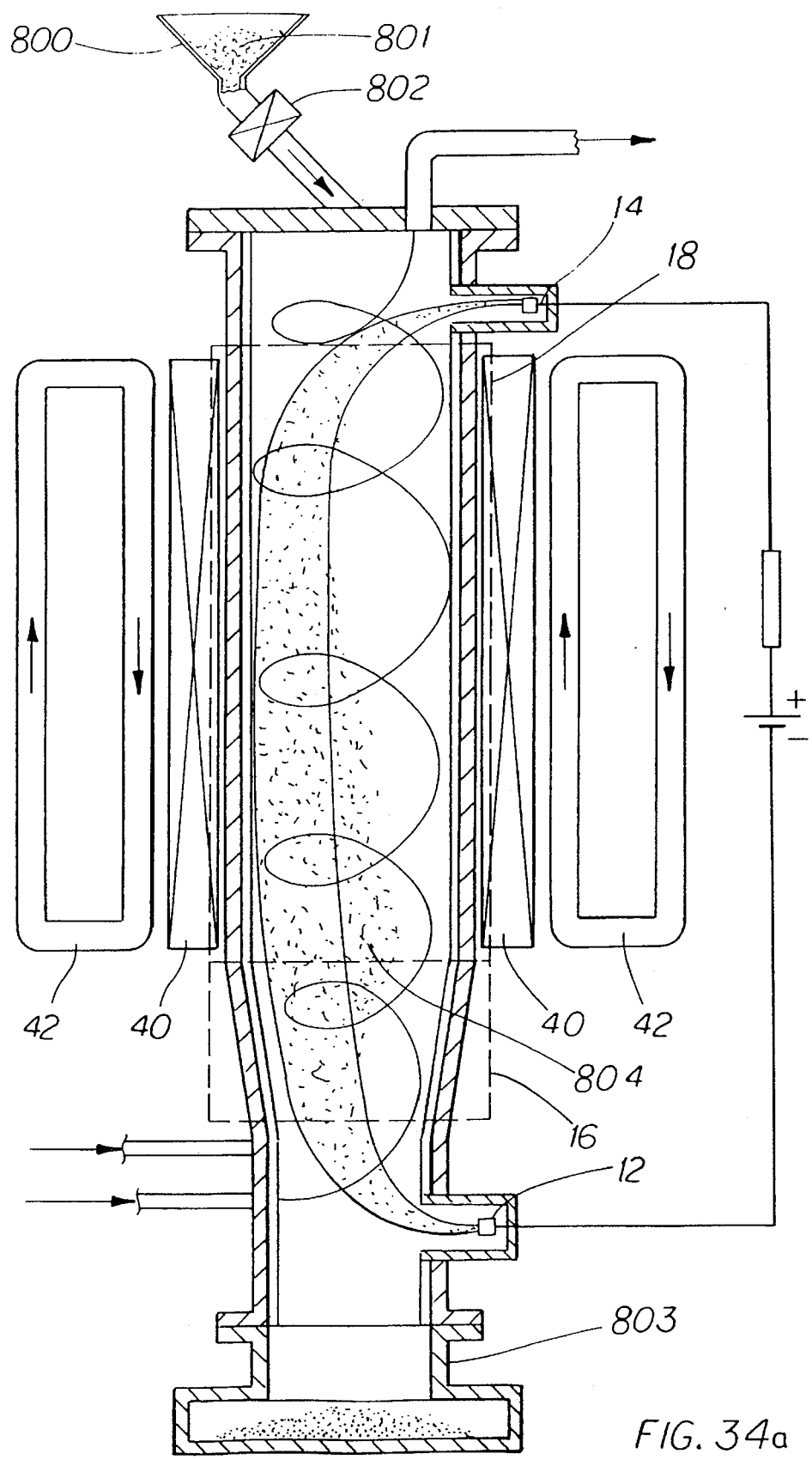
FIG. 34a is a cross sectional partial elevation of an embodiment of the invention adapted for plasma treatment of a powder.

A further embodiment of the invention, illustrated in FIG. 34a, is adapted for plasma treatment of powder as a substrate. In this embodiment the powder 801 is injected into arc column through a funnel 800 controlled by a valve 802 and is treated in the arc plasma during its "free fall" through the reaction zone 18 or, in the case of very light powders, suspended in the rising plasma flow in the reaction zone 18 to form a "boiling layer" similar to that described in Wurster U.S. Pat. No. 3,253,944. Ebulition within the powder cloud 804 in the plasma column treats the powder by uniformly removing impurities. In the latter case the cathode 12 should be disposed at the bottom and the anode 14 at the top of the reactor, to maintain a rising plasma flow.

It is also important to have expansion of the powder cloud 804 beginning in the stabilizing zone 16 and extending into the reaction zone 18. The diameter of the reaction zone 18 must therefore be greater than the diameter of the stabilizing zone 16, as shown in FIG. 34a.

Figure 34B:
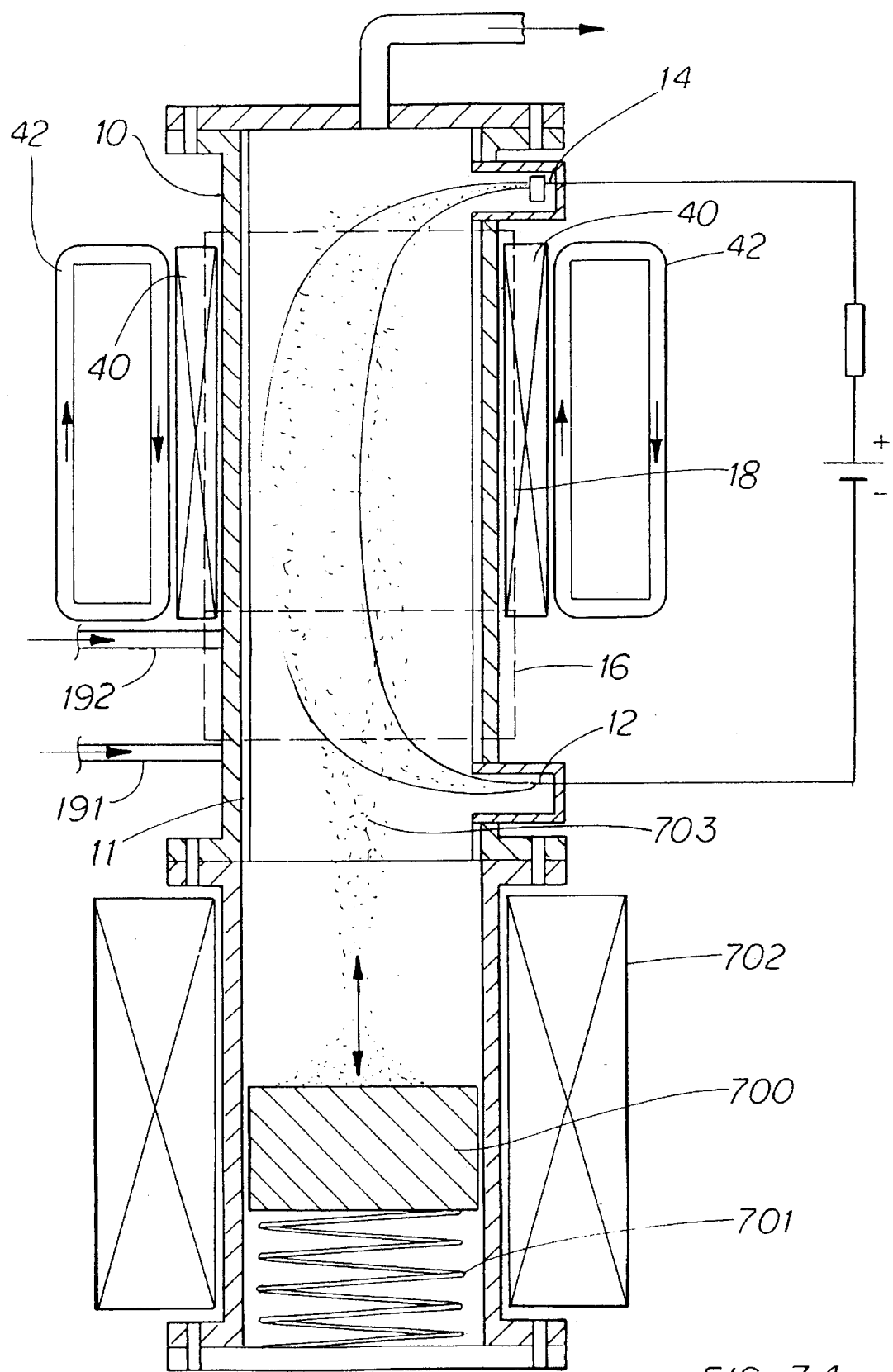
FIG. 34b is a cross sectional partial elevation of the embodiment of FIG. 34a adapted for prolonged plasma treatment of a powder.

For "free fall" embodiments the treatment time may be extended indefinitely by deploying a "pulse pusher" in the form of an oscillating or reciprocating piston 700 downstream of the lower electrode (cathode 12), as shown in FIG. 34b. In the embodiment shown the piston 700 is borne on a compression spring 701 and reciprocated by a pulse solenoid 702 to maintain the powder 703 in the reaction zone 18. The time between pulses of the piston 700 must be less than the free fall time of the powder 703, to keep the powder airborne above the piston 700. This variation is most suitable for very low pressure (p<100 Torr) conditions, in which aerodynamic forces are too small to suspend the particles in the rising plasma flow. Other mechanical systems may be used in place of the piston, for example a reciprocating membrane or pulse gas gun.

It will be apparent that in these embodiments for powder treatment the inner wall of the liner 11 acts as a "substrate holder", confining the powder substrate in the arc column. In the case of diamond and related materials the temperature of the liner 11 should be maintained at the optimal synthesis temperature. Periodic or preferably continuous vibration of the liner 11 using a conventional vibrator (not shown) will help to keep powder from accumulating on the liner 11 and will thus keep the powder in the arc column.

Figure 34C:
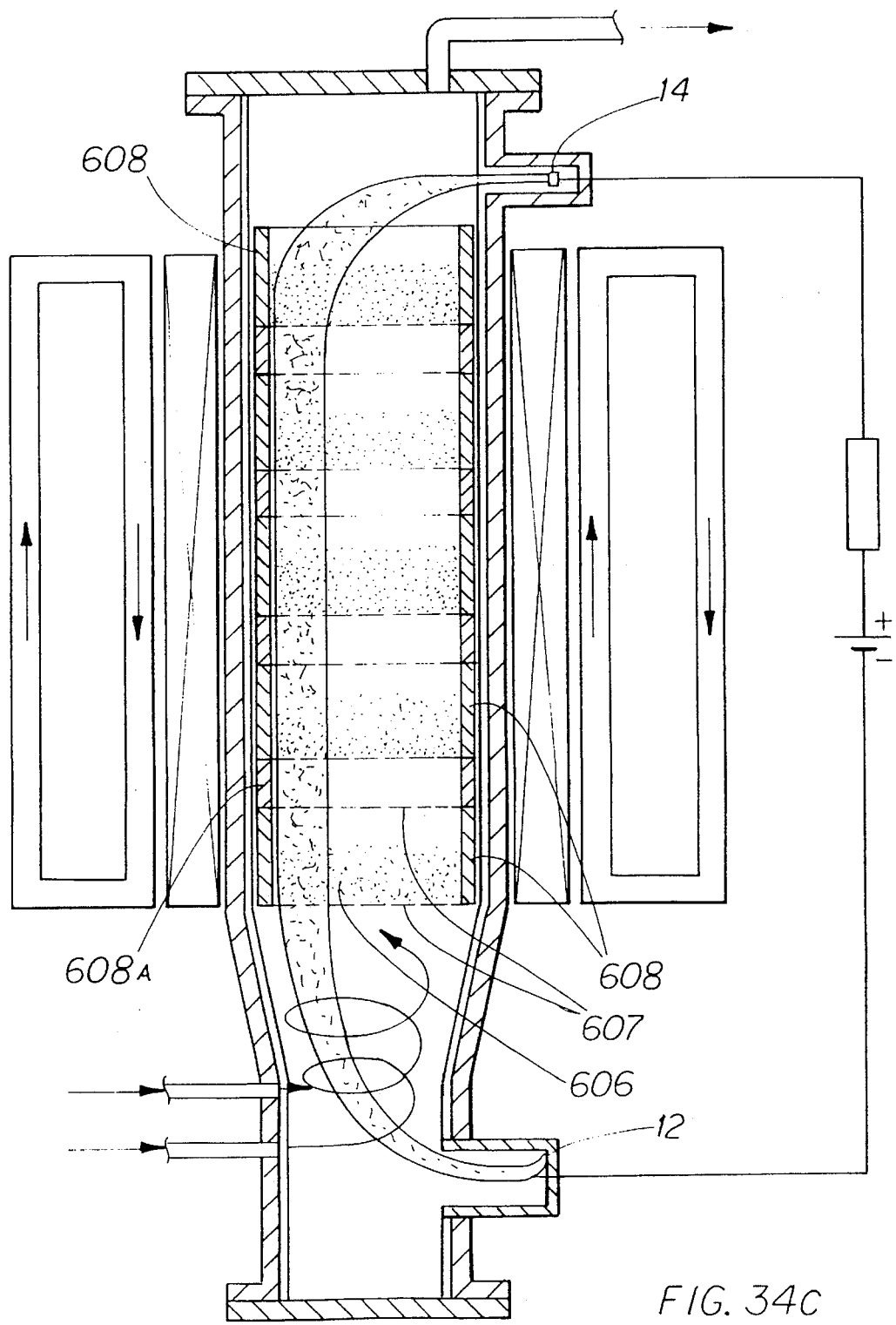

In the embodiment of FIG. 34c containers 608 are aligned to form a series of separate reaction chambers within the reaction zone 18. In this embodiment the tube 10 is preferably positioned with the anode 14 at the top and the cathode 12 at the bottom, and the powder 606 is tossed in the rising plasma flow.

Figure 34D:
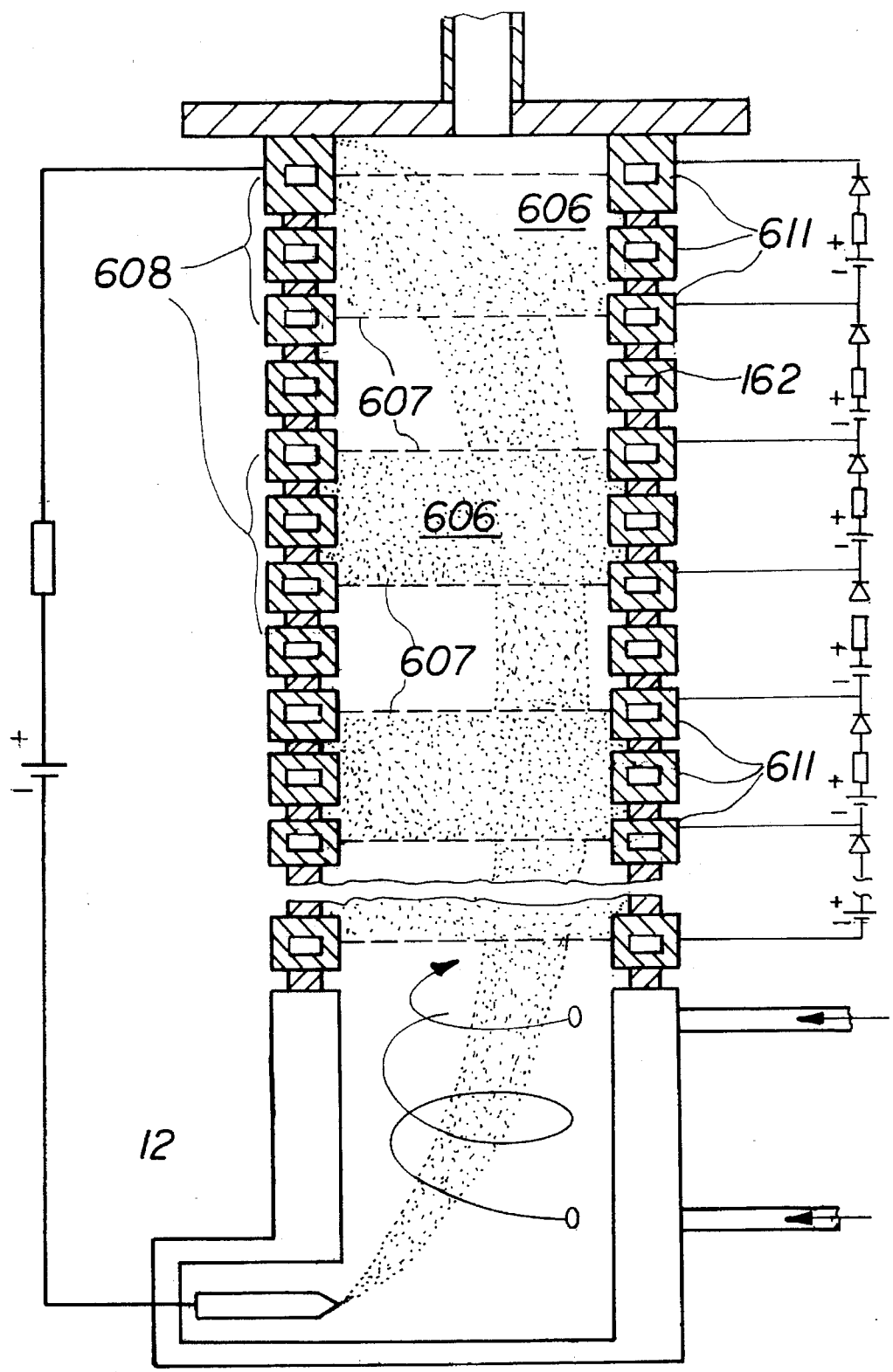
FIG. 34d is a cross sectional partial elevation of a further variation of the embodiment of FIG. 34a using water-cooled substrate holders.

As illustrated in FIG. 34d, it is also possible to provide cathode/anode rings 611 combining the functions of cathode and anode, by arranging a series of independent circuits such that each refractory net 607 functions as a cathode for a downstream arc and an anode for an upstream arc, similar to the filament embodiment illustrated in FIG. 17c. The containers 608 for treatment of powder 606 are defined between adjacent cathode/anode rings 611.

EXAMPLE 1

In this example the apparatus shown in FIG. 1 was used. Cemented carbide inserts WC-6% Co 10×10×3 mm as substrates 2 were positioned on silicon fibre substrate holders 30 along the axis of the tube 10 in the reaction zone 18. The tube 10 was sealed and inside pressure reduced to $10^{-4}$ Torr. The method of the invention was carried out as follows:

1. The substrate holders 30 were rotated;

2. Ar as a carrier gas and $H_2$ as plasma-creating gas were injected into the first inlet 20 with sufficient flow rate to increase the pressure in the tube 10 to between $1\times10^{-2}$ and $1.2\times10^{-2}$ Torr;

3. A DC arc was ignited between the cathode 12 and the anode 14;

4. Magnetic coils 40 and 42 were activated, creating a longitudinal magnetic field and a rotating transverse magnetic field, respectively;

5. The flow rate of carrier gas was increased to 2 slm and flow rate of plasma-creating gas was increased to 200 sccm, increasing pressure in the tube 10 to 30 Torr;

6. The arc current was adjusted to increase the temperature of the substrates to the range of 1000°–1050° C.;

7. These parameters were maintained for 30 minutes for cleaning and uncarburisation of the carbide surfaces;

8. $CH_4$ was injected as a reaction species through the second inlet 22 with a flow rate of 4 sccm;

9. The arc current was adjusted to decrease the temperature of the substrates to the range of 930°–970° C.;

10. These parameters were maintained and the substrates were processed for 600 minutes for deposition of a 10 µm diamond film over the substrates;

11. Injection of the reaction species was discontinued;

12. Rotation of the magnetic field was halted;

13. The DC arc was extinguished and the magnetic fields were deactivated;

14. Injection of the carrier and plasma-creating gases was discontinued; and

15. The apparatus was opened and discharged.

Figure 11:
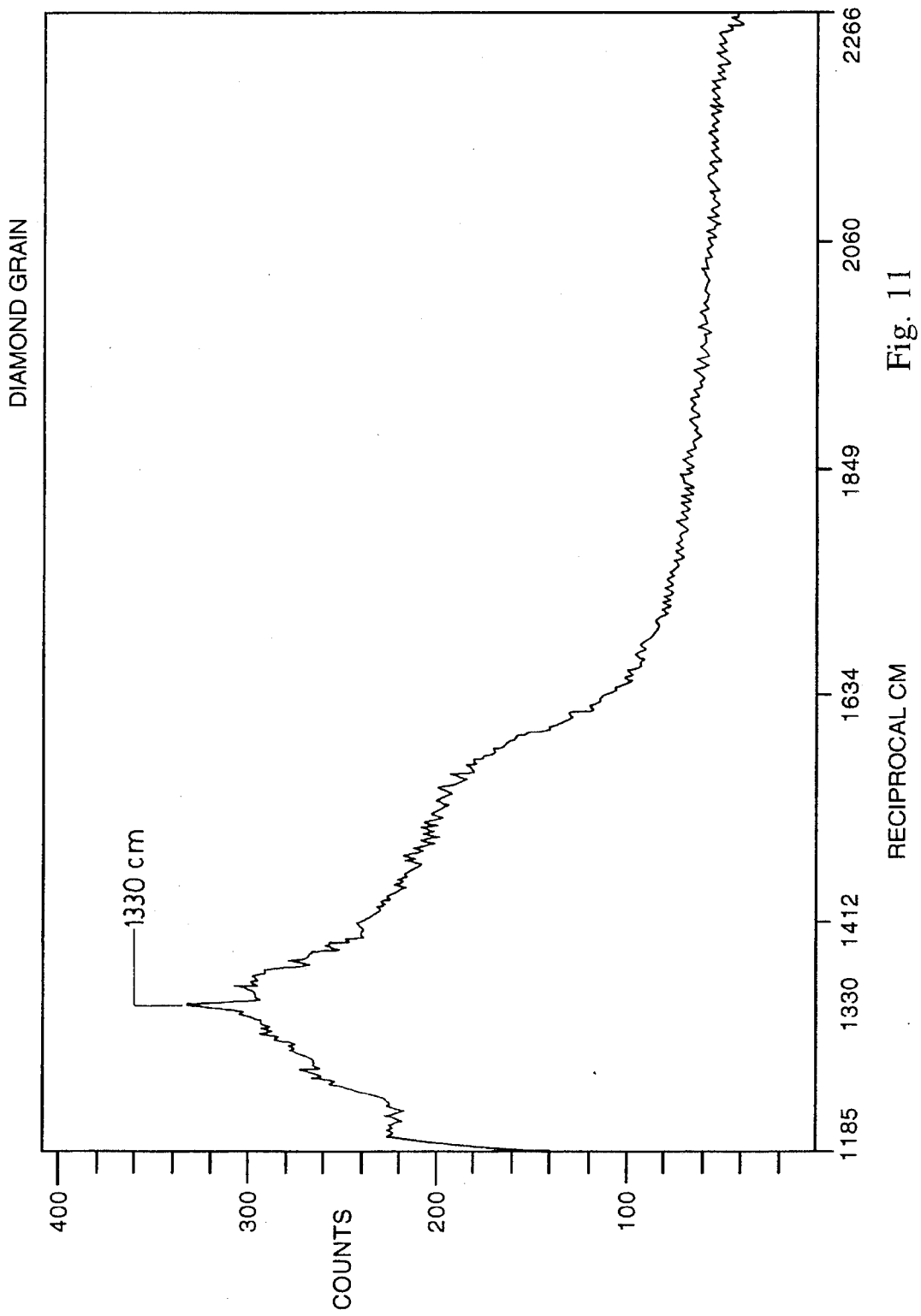
FIG. 11 is an overlay of Raman spectra of the deposit of diamond grains produced by the process of Example 1.

The Raman spectra of the 10 µm diamond films produced is illustrated in FIG. 11, showing a sharp peak at a wavelength of 1330 cm 1 corresponding to the diamond phase. The results obtained are shown below in Table 1.

EXAMPLE 2

In a second example, the apparatus illustrated in FIG. 4 was used. Cemented carbide drills WC-6% Co dimension 20×1 mm as substrates 2 were positioned along the wall of the tube 10 on the steel ring substrate holders 30, separated by alumina rings 32. The tube 10 was sealed and inside pressure reduced to $10^{-4}$ Torr. The method of the invention was carried out as follows:

1. Ar as a carrier gas and $H_2$ as plasma-creating gas were injected into the first inlet 20 with sufficient flow rate to increase the pressure in the tube 10 to between $1\times10^{-2}$ and $1.2\times10^{-2}$ Torr;

2. A DC arc was ignited between the cathode 12 and the anode 14;

3. Magnetic coils 40 and 42 were activated, creating a longitudinal magnetic field and a rotating transverse magnetic field, respectively;

4. The flow rate of carrier gas was increased to 2 slm and flow rate of plasma-creating gas was increased to 200 sccm, increasing pressure in the tube 10 to 60 Torr;

5. The arc current was adjusted to increase the temperature of the substrates to the range of 1000°–1050° C.;

6. These parameters were maintained for 30 minutes for cleaning and uncarburisation of the carbide surfaces;

7. $CH_4$ was injected as a reaction species through the second inlet 22 with a flow rate of 4 sccm;

8. The arc current was adjusted to decrease the temperature of the substrates to the range of 930°–970° C.;

9. Oscillation of the longitudinal magnetic field was initiated in the range of 10 Hz to 100 KHz, and the arc current Ic was oscillated with an amplitude of $\Delta I \approx 0.1 I_c$.

10. These parameters were maintained and the substrates were processed for 180 minutes for deposition of a 3 µm diamond film over the substrates;

11. Injection of the reaction species was discontinued;

12. Rotation of the magnetic field was halted;

13. The DC arc was extinguished and the magnetic fields were deactivated;

14. Injection of the carrier and plasma-creating gasses was discontinued; and

15. The apparatus was opened and discharged.

Figure 14A:
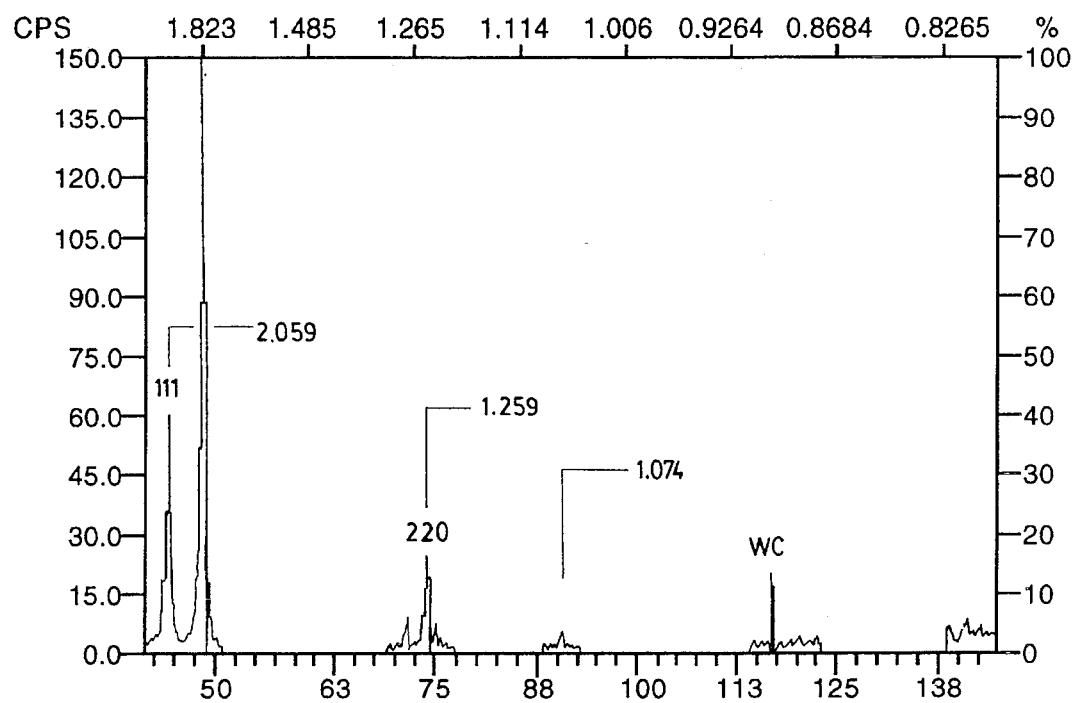
FIG. 14a is a graph illustrating the distribution of elements in the coating produced by the process of Example 2 as provided by X ray diffraction.
Figure 14B:
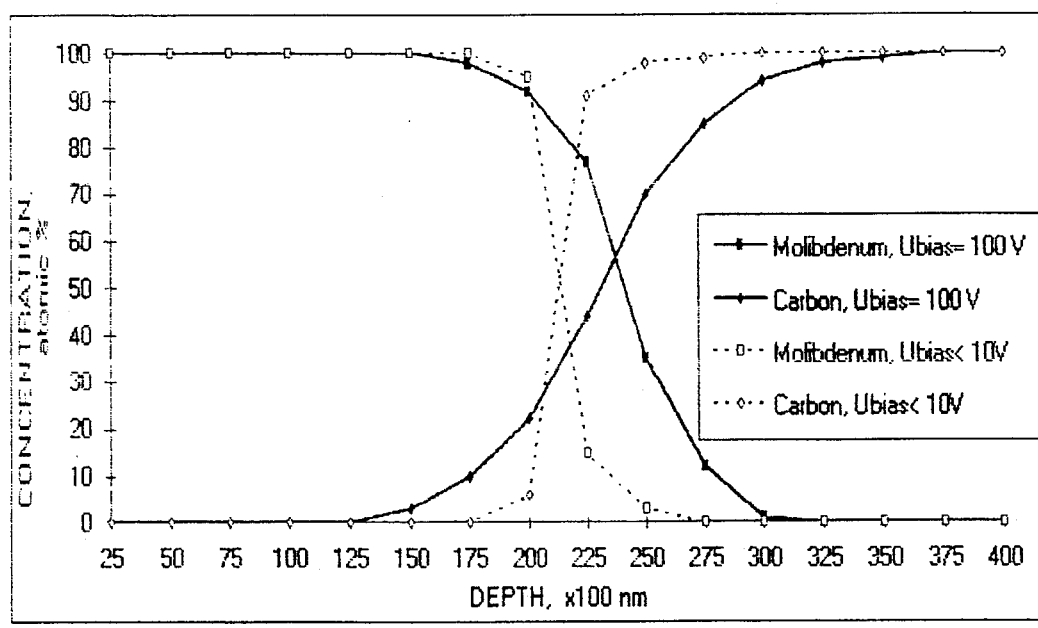
FIG. 14b is a graph illustrating the distribution of carbon in an intermediate layer between a negative-biased molybdenum substrate and a diamond coating.

The results obtained are shown below in Table 2. FIG. 14 shows the pattern of X ray diffraction produced by the resulting diamond film. The line denoted "111" in FIG. 14 is the characteristic line for pure diamond phase.

EXAMPLE 3

In a third example, the apparatus illustrated in FIG. 5 was used. Cemented carbide drills WC-6% Co dimension 20×1 mm as substrates 2 were positioned along the wall of the tube 10 on the steel ring substrate holders 30, separated by alumina rings 32. The tube 10 was sealed and inside pressure reduced to $10^{-4}$ Torr. The method of the invention was carried out as follows:

1. Ar as a carrier gas and $H_2$ as plasma-creating gas were injected into the first inlet 20 with sufficient flow rate to increase the pressure in the tube 10 to between $1\times10^{-2}$ and $1.2\times10^{-2}$ Torr;

2. A DC arc was ignited between the cathode 12 and the anode 14;

3. Magnetic coils 40 and 42 were activated, creating a longitudinal magnetic field and a rotating transverse magnetic field, respectively;

4. The flow rate of carrier gas was increased to 2 slm and flow rate of plasma-creating gas was increased to 200 sccm, increasing pressure in the tube 10 to 20 Torr;

5. A bias AC voltage of 100 V was applied to the substrate holders 30 from generator G through capacitors 27. The voltage was oscillated with a frequency range of 1 kHz to 100 kHz.

6. The arc current was adjusted to increase the temperature of the substrates to the range of 1000°–1050° C.;

7. These parameters were maintained for 30 minutes for cleaning and uncarburisation of the carbide surfaces;

8. $CH_4$ was injected as a reaction species through the second inlet 22 with a flow rate of 4 sccm;

9. The arc current was adjusted to decrease the temperature of the substrates to the range of 930°–970° C.;

10. These parameters were maintained and the substrates were processed for 180 minutes for deposition of a 3 μm diamond film over the substrates;

11. Injection of the reaction species was discontinued;

12. Rotation of the magnetic field was halted;

13. The DC arc was extinguished and the magnetic fields and bias voltage were deactivated;

14. Injection of the carrier and plasma-creating gases was discontinued; and

15. The apparatus was opened and discharged.

The results obtained are shown below in Table 3.

EXAMPLE 4

In a fourth example, the laser assisted apparatus illustrated in FIG. 6 was used. Silicon wafers dimension 20×10×1 mm as substrates 2 were positioned along axial substrate holders 50. The tube 10 was sealed and inside pressure was reduced to $10^{-4}$ Torr. The method of the invention was carried out exactly the same as in Example 3, except in Step 5 rather than applying an oscillating AC voltage an Ar+ laser was activated with a wavelength of 488 nm.

Figure 12:
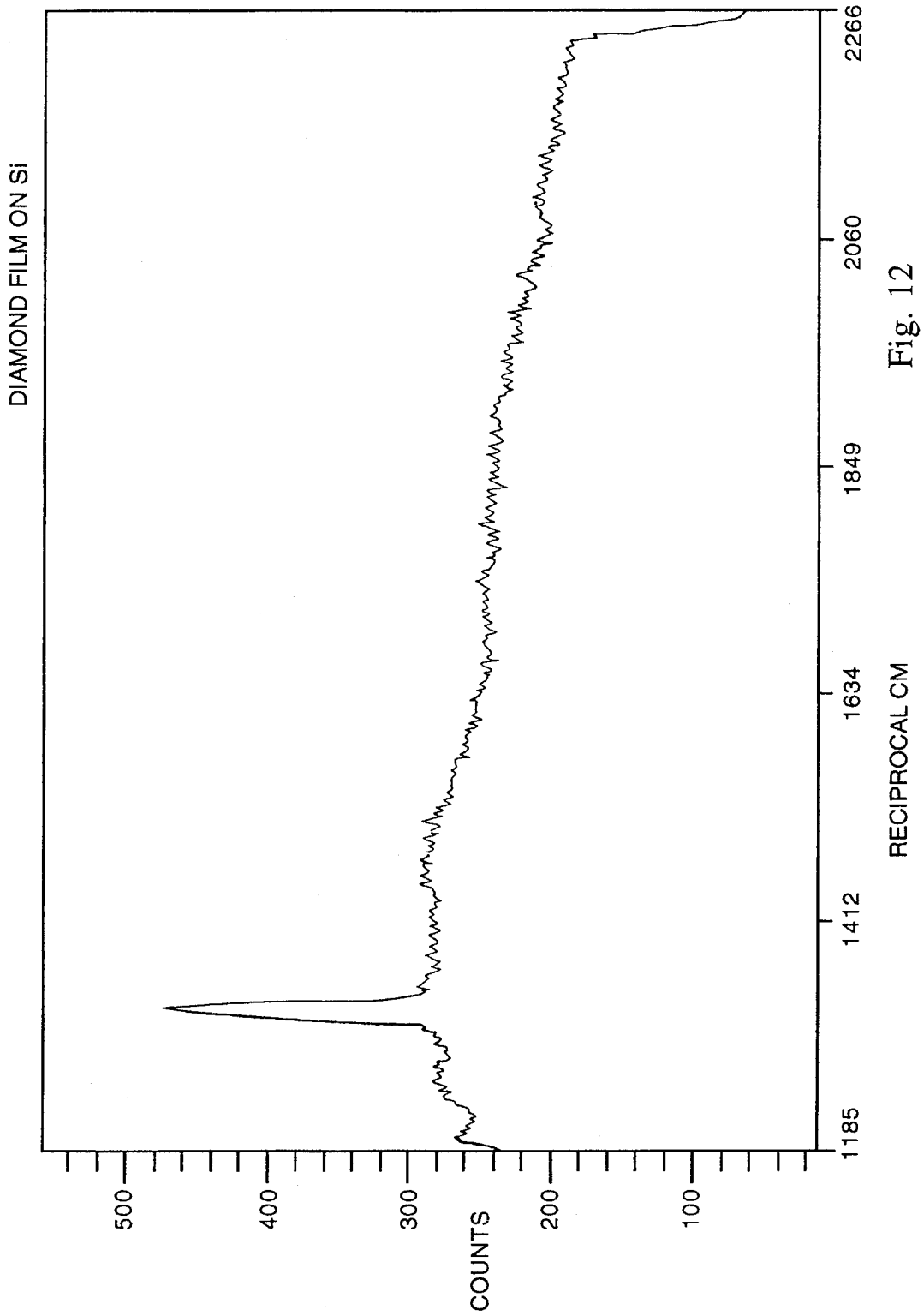
FIG. 12 is an overlay of Raman spectra of the deposit of diamond films produced by the process of Example 4.

The Raman spectra of the 10 μm diamond films produced is illustrated in FIG. 12, showing a sharp peak at a wavelength of 1330 cm 1 corresponding to the diamond phase.

In certain applications, the reaction species must be injected as a solid powder or as liquid droplets. In such cases the powder or droplets may be injected into the stabilizing zone 16 either through the first inlet 20 or through a third inlet 44 (shown in FIG. 5) positioned so that the distance between the third inlet 44 and the beginning of the reaction zone 18 is sufficient to evaporate the solid powder or liquid droplet particles into a gaseous phase. The following five examples illustrate this variant of the process.

EXAMPLE 5

This process is based on the following reaction:

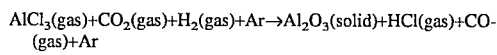

In this process the $AlCl_3$ gas phase was produced by sublimation of $AlCl_3$ crystals in a $CO_2+H_2+Ar$ plasma. The Ar was injected into inlet 20 at the beginning of the stabilizing zone, and the mixture of $AlCl_3$ powder with $CO_2+H_2$ into the inlet 44 in the middle of the stabilizing zone 16. The characteristic parameters of this process were:

pressure—200 Torr temperature of substrates—950°–1000° C.

$AlCl_3$ (gas)—3 sccm $CO_2$—10 sccm $H_2$—800 sccm

Ar—12 slm time of deposition—3 hr.

This process produced a 20 μm $Al_2O_3$ coating on the cemented carbide inserts.

EXAMPLE 6

This process was based on the following reaction:

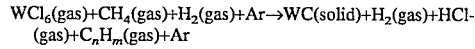

In this example the $WCl_6$ gas phase was produced by sublimation of $WCl_6$ crystals in a $CH_4+H_2+Ar$ plasma. The Ar was injected into the inlet 20 and the mixture of $WCl_6$ powder and $CO_2+H_2$ was injected into the inlet 44 in the middle of the stabilizing zone 16. The characteristic parameters of this process were:

pressure—200 Torr temperature of substrates—600°–650° C.

$WCl_6$ (gas)—5 sccm $CH_4$—3 sccm $H_2$—800 sccm

Ar—12 slm time of deposition—1 hr.

This process produced 5 μm WC coatings on the free surface of diamond grains.

EXAMPLE 7

This process was based on the same reaction as Example 6, but diamond powder with grain sizes in the range between 5 to 10 μm was coated by tungsten during a 2 hour exposure in the arc column in the vertical rising plasma flow in which the powder was suspended. The diamond particles were injected through inlet 44 and after exposure in the arc plasma column the DC arc was extinguished and the particles were collected in the hermetic container 803 disposed under the cathode 12. The characteristic parameters of this process were similar to Example 6, but the total pressure was 10 Torr, and the flow rates of the gases were:

$WCl_6$ (gas)—5 sccm $CH_4$—3 sccm $H_2$—400 sccm

Ar—3 slm

This process produced 1 μm WC coatings on the surface of diamond grains.

EXAMPLE 8

In this process synthetic diamond powder with grain sizes in the range 250–315 μm was treated in the arc plasma column during free fall of the diamond particles. The length of reaction zone was 1 m. The gas composition was 80% Ar+20% $H_2$ with total pressure p=25 Torr and flow rate of 8 slm. The diamond particles were injected through inlet 44 and collected in the hermetic container 803 disposed under the cathode 12. In the process of arc plasma treatment the weak grains were broken and the catalyst metals were extracted from the surface of the grains. After chemical etching and ultrasonic treatment the grains were separated by size. It was determined that after arc plasma treatment the fraction with the largest size of grains was diminished by destruction of weak grains in the plasma. The concentration of metal impurities in the powder was reduced more than 10 times and thermal strength was improved about 2.5 times.

EXAMPLE 9

Natural diamond seed crystal powder with grain sizes in the range between 300 and 315 μm was coated by diamond during 5 hours exposure in the plasma column, in the vertical rising plasma flow of the reactor of FIG. 34d. The pressure was 200 Torr and total gas flow rate was 4 slm. The gas composition was: flow rate of Ar—3.8 slm, flow rate of $H_2$—200 sccm, flow rate of $CH_4$—5 sccm, flow rate of CO—1 sccm. In addition the vapours of a 50% KCl+50% LiCl mixture with equivalent flow rate of 10 sccm were injected into the arc column through a quartz capillary disposed in the opening of the reactor tube wall in the stabilizing zone. During exposure the concentration of methane was periodically reduced to 0 for etching the non-diamond phase. The diamond particles were enclosed in a container section 608 enclosed by screens 607 at either end. After deposition the diamond powder was released by discharge of the respective containers 608. A mass of 100 diamond grains after exposure to the arc plasma was more than 30% greater compared with the initial weight of the 100 diamond seed grains.

EXAMPLE 10

In this experiment the reactor of Example 3 was used. Cubic boron nitride (cBN) films were deposited on a Si substrate disposed on the liner wall in the reaction zone of the reactor in a Ar—H—N—B DC arc plasma column. The total pressure was 25 Torr, the gas composition was: flow rate of Ar—6 slm, flow rate of $H_2$—200 sccm, flow rate of diborane $B_2H_6$—2 sccm, flow rate of ammonia $NH_3$—5 sccm. In addition vapours of CsCl with equivalent flow rate 1 sccm were injected into the arc column through a quartz capillary disposed in the opening of the reactor tube wall in the stabilizing zone. The specific arc power per unit plasma volume was 4 $W/cm^3$, the specific side power flow was 8 $W/cm^2$ which resulted in the substrate temperature in the range 700°–750° C. The time of deposition was 5 hours. In this experiment the rate of deposition of polycrystalline BN films containing cubic and turbostratic BN phases with the volume fraction of cBN phase up to 30% was reached 0.3 μm/hour (the concentration of cBN in BN film was measured by the IR absorption ratio).

The invention having been thus described with reference to its preferred embodiments, it will be apparent to those skilled in the art that certain modifications and adaptations may be made without departing from the scope of invention. For example, the apparatus of the invention may be used equally effectively for sintering reactions, with the parameters of current, pressure etc. adjusted accordingly. It will also be apparent that the method and apparatus described herein can be applied to many other types of coatings beyond the examples given, for example ceramics, tungsten-carbide and other hard metals and hard films which are used for coating substrates, and the invention is in no way limited to the specific uses described.

TABLE 1

Experimental conditions for diamond coating deposition on carbide inserts.

| SAMPLE # | $G_{Ar}$, slm | $G_{H2}$, sccm | $G_{CH4}$, sccm | Total gas pressure, Torr | $T_{sub}$, C | $I_{arc}$, A | $N_{arc}$, W/cm | Time, min. | Rate, μm/hr | Coefficient of the increase in strength* |
|---|---|---|---|---|---|---|---|---|---|---|
| 1 | 2 | 200 | 5 | 40 | 930 | 24 | 48 | 120 | 0.8 | 2.8 |
| 2 | 2 | 200 | 5 | 40 | 970 | 24 | 50 | 240 | 0.8 | 3.5 |
| 3 | 2 | 200 | 5 | 40 | 960 | 24 | 50 | 240 | 0.8 | 4 |
| 4 | 1 | 150 | 5 | 20 | 920 | 23 | 47 | 240 | 0.6 | 4.8 |
| 5 | 1 | 150 | 5 | 20 | 1010 | 26 | 54 | 240 | 0.6 | 5.4 |
| 6 | 3 | 200 | 5 | 30 | 1050 | 28 | 58 | 240 | 0.7 | 2.2 |
| 7 | 3 | 200 | 5 | 30 | 990 | 25 | 49 | 240 | 0.7 | 2.9 |
| 8 | 2 | 200 | 5 | 30 | 1020 | 27 | 55 | 600 | 0.7 | 7.1 |
| 9 | 2 | 200 | 5 | 40 | 1040 | 28 | 58 | 600 | 1 | 8.8 |
| 10 | 2 | 200 | 5 | 40 | 1050 | 28 | 58 | 600 | 1 | 9.3 |

*For testing these inserts the material treated was Al— 18% Si alloy.

TABLE 2

Experimental conditions for diamond coating deposition on carbide drills with oscillating power assistant.

| SAMPLE # | $G_{Ar}$, slm | $G_{H2}$, sccm | $G_{CH4}$, sccm | Total gas pressure, Torr | $T_{sub}$, C | $I_{arc}$, A | $N_{arc}$, W/cm | $N_\sim$, W/cm* | Time, min. | Coefficient of the increase in strength* |
|---|---|---|---|---|---|---|---|---|---|---|
| 1 | 2 | 200 | 5 | 25 | 1000 | 24 | 48 | — | 120 | 1.8 |
| 2 | 2 | 200 | 5 | 25 | 1000 | 24 | 48 | — | 240 | 2.5 |
| 3 | 2 | 200 | 5 | 25 | 1030 | 24 | 48 | 3 | 240 | 3 |

TABLE 2-continued

Experimental conditions for diamond coating deposition on carbide drills with oscillating power assistant.

| SAMPLE # | $G_{Ar}$, slm | $G_{H2}$, sccm | $G_{CH4}$, sccm | Total gas pressure, Torr | $T_{sub}$, C | $I_{arc}$, A | $N_{arc}$, W/cm | $N_-$, W/cm* | Time, min. | Coefficient of the increase in strength* |
|---|---|---|---|---|---|---|---|---|---|---|
| 4  | 2 | 200 | 5 | 25 | 1030 | 24 | 48 | 7  | 240 | 3.8 |
| 5  | 2 | 200 | 5 | 25 | 1050 | 24 | 48 | 12 | 240 | 4.4 |
| 6  | 2 | 150 | 5 | 25 | 920  | 20 | 42 | —  | 120 | 2.2 |
| 7  | 2 | 150 | 5 | 25 | 920  | 20 | 42 | —  | 240 | 2.9 |
| 8  | 2 | 150 | 5 | 25 | 940  | 27 | 42 | 3  | 240 | 4.1 |
| 9  | 2 | 150 | 5 | 25 | 950  | 28 | 42 | 5  | 240 | 4.8 |
| 10 | 2 | 150 | 5 | 25 | 950  | 28 | 42 | 10 | 240 | 5.3 |

*For testing these drills the material treated were bases for printed circuit boards made of glass fabric resin foil with protective lac coating.
**The specific oscillating power was calculated from the ratio $c = (<I_->/I_{arc})^2$, where $<I_->$ is mean amplitude of the oscillating part of arc current with frequency in the range 10 Hz–100 kHz. Then $N_- = cN_{arc}$.

TABLE 3

Experimental conditions for diamond coating deposition on carbide drills with AC bias power assistant.

| SAMPLE # | $G_{Ar}$, slm | $G_{H2}$, sccm | $G_{CH4}$, sccm | Total gas pressure, Torr | $T_{sub}$, C | $I_{arc}$, A | $N_{arc}$, W/cm | $V_{bias}$, V** | Time, min. | Coefficient of the increase in strength* |
|---|---|---|---|---|---|---|---|---|---|---|
| 1  | 2 | 200 | 5 | 25 | 1000 | 24 | 48 | —   | 120 | 1.8 |
| 2  | 2 | 200 | 5 | 25 | 1000 | 24 | 48 | —   | 240 | 2.5 |
| 3  | 2 | 200 | 5 | 25 | 1050 | 24 | 48 | 20  | 240 | 3.4 |
| 4  | 2 | 200 | 5 | 25 | 1040 | 24 | 48 | 50  | 240 | 4   |
| 5  | 2 | 200 | 5 | 25 | 1060 | 24 | 48 | 100 | 240 | 4.6 |
| 6  | 2 | 150 | 5 | 25 | 920  | 20 | 42 | —   | 120 | 2.2 |
| 7  | 2 | 150 | 5 | 25 | 920  | 20 | 42 | —   | 240 | 2.9 |
| 8  | 3 | 150 | 5 | 25 | 960  | 27 | 42 | 20  | 240 | 3.8 |
| 9  | 2 | 150 | 5 | 25 | 990  | 28 | 42 | 50  | 240 | 5.1 |
| 10 | 2 | 150 | 5 | 25 | 990  | 28 | 42 | 100 | 240 | 5.8 |

*For testing these drills the material treated were bases for printed circuit boards made of glass fabric resin foil with protective lac coating.
**The frequency for bias potential was 50 kHz.

I claim:

1. An arc assisted coating apparatus comprising a tube having a reaction zone and at least one inlet for injection of a carrier gas, a plasma-creating gas and a reaction species,
   one or more cathodes located upstream of the reaction zone,
   one or more anodes located downstream of the reaction zone,
   means for controlling temperature in the reaction zone, and
   a plurality of substrate holders positioned within the reaction zone for supporting a substrate to be coated, whereby each of the plurality of substrate holders includes a wall which acts as a liner to confine an arc discharge created between a cathode and an anode,
   wherein a plurality of axially aligned arcs or a plurality of transversely distributed parallel arcs or both are generated with a main arc burning between one of the one or more cathodes and one of the one or more anodes.

2. The apparatus of claim 1 including a plurality of substrate holders distributed coaxially along the reaction zone or transversely about the reaction zone, defining a plurality of channels for confining a plurality of arc discharges between the one or more cathodes and the anode.

3. The apparatus of claim 2 in which the substrate holders are annular and aligned coaxially to form a plasma channel for confining the arc within the substrate holders.

4. The apparatus of claim 3 wherein the substrate holders form self contained reaction sections each section being provided with a cathode and anode.

5. The apparatus of claim 4 wherein the self contained reaction sections are further provided with an inlet and an outlet.

6. The apparatus of claim 4 wherein the self contained reaction sections are further provided with means for preventing short circuiting of the arc discharge.

7. The apparatus of claim 3 including at least one magnetic coil for creating a transverse magnetic field to bias a plasma column toward the periphery of reaction zone.

8. The apparatus of claim 7 wherein the transverse magnetic field is varied to rotate the plasma column around a periphery of the reaction zone.

9. The apparatus of claim 2 in which the substrate holders are electrically conductive and the axial length $l_s$ of each substrate holder is governed by the formula $$E_c \times l_s < V_c + V_a$$

where
$E_c$ is the charge of the electric field created by the arc,
$l_s$ is the effective length of the substrate,
$V_c$ is the voltage of the cathode, and
$V_a$ is the voltage of the anode.

10. The apparatus of claim 9 wherein the substrate holders are separated by dielectric spacers.

11. The apparatus of claim 2 wherein the characteristic diameter of an arc column is within a range between 0.1 and 1 times the size of a gap between adjacent substrates.

12. The apparatus of claim 2 including means for applying a bias potential to substrate holders supporting the substrates.

13. The apparatus of claim 2 including generating means for injecting an oscillating electromagnetic field into a plasma column created within the tube.

14. The apparatus of claim 13 in which the ends of the tube are transparent and including a laser resonator comprising a laser and a pair of mirrors disposed on the upstream and downstream ends of the tube, respectively, to reflect light along the axis of the tube.

15. The apparatus of claim 13 including an electrode for injecting an RF electromagnetic signal into the tube.

16. The apparatus of claim 13 including a microwave generator, wherein the tube is provided with a dielectric liner to protect an inner wall of the tube, and wherein the arc channels formed within the substrate holders serve as microwave waveguides.

17. The apparatus of claim 13 including means for simultaneously injecting laser radiation and a pulse arc into the reaction zone.

18. The apparatus of claim 13 including means for simultaneously injecting laser radiation and a DC arc into the reaction zone.

19. The apparatus of claim 2 wherein one or more substrate holders is provided with a thermionic filament composed of a refractory material.

20. The apparatus of claim 19 wherein the substrate holders form self contained reaction sections each section being provided with an thermionic filament as a cathode, an anode, and means for preventing a short circuit between each filament/anode pair.

21. The apparatus of claim 20 in which the thermionic filaments form nets which encapsulate the substrates in one or more containers defined between adjacent nets, the nets having openings in the range between a characteristic size of the substrates and 5 Debye radius of the plasma column.

22. The apparatus of claim 21 in which the containers are provided with fins to toss the substrates when the containers are rotated.

23. The apparatus of claim 1 wherein the substrate holders are distributed transversely about the reaction zone such that a gap created between adjacent substrate holders is in alignment with the one or more cathodes.

24. The apparatus of claim 23 in which a plurality of cathode members are disposed at regular intervals in a pattern corresponding to a 3, 4, 5, or 6 sided regular polygon.

25. The apparatus of claim 23 including:

an arc cathode member comprising a target of material to be evaporated having a working surface, means for establishing an arc on the target surface for evaporating the target material, the arc being characterized by the presence of charged particles and generating one or more cathode spots which migrate over the working surface, and means for confining the cathode spots within the periphery of the working surface.

26. The apparatus of claim 25 including at least one linear anode disposed adjacent to the working surface for evaporating the target material.

27. The apparatus of claim 26 having plurality of linear anodes.

28. The apparatus of claim 27 in which the target is provided with a plurality of holes and linear anodes extend through the holes perpendicular to the working surface for evaporating the target material, the linear anodes being isolated from the target and coupled to a conductor downstream of the target for supplying a voltage to the linear anodes.

29. The apparatus of claim 28 in which the plurality of linear anodes are disposed at regular intervals about the cathode plate in a pattern of a 3, 4, 5, or 6 sided regular polygon, and the linear anodes are adapted to be activated sequentially.

30. The apparatus of claim 26 in which at least one linear anode is disposed parallel to said working surface for evaporating the target material which creates a closed-loop path for the migration of the cathode spot.

31. The apparatus of claim 30 in which the linear anode is hollow and encases a linear conductor forming a closed-loop magnetic coil.

32. The apparatus of claim 30 including means for controlling a pattern of movement of the cathode spot including magnetic field source means for establishing at least one closed-loop path on said working surface, said closed-loop path being defined by a closed-loop magnetic field generated by said magnetic field source means.

33. The apparatus of claim 32 in which the linear anode is disposed in the vicinity of said closed-loop path.

34. The apparatus of claim 30 in which the linear anode is provided with a heater.

35. The apparatus of claim 30 in which the diaphragm is composed of a refractory material.

36. The apparatus of claim 26 in which disposed between the auxiliary anode and the substrate holder is at least one diaphragm provided with a plurality of openings for penetration of plasma therethrough, said openings being distributed such that a gap created between adjacent substrates is in alignment with the openings.

37. The apparatus of claim 36 in which the diaphragm is annular and surrounds the cathode.

38. The apparatus of claim 37 in which the diaphragm and the target surround the at least one linear anode.

39. The apparatus of claim 37 in which at least one linear anode is disposed through an opening in the diaphragm and insulated from said diaphragm.

40. The apparatus of claim 36 having a plurality of diaphragms.

41. The apparatus of claim 36 in which the openings in the diaphragm are provided around their peripheries with cylindrical screens.

42. The apparatus of claim 36 in which said diaphragm is provided with a heater.

43. The apparatus of claim 36 including a plurality of diaphragms and a plurality of heaters interspersed between the diaphragms to control temperature in the reaction zone.

44. The apparatus of claim 1 including a furnace surrounding the reaction zone to heat the substrates.

45. The apparatus of claim 1 including a gas-cooling liner disposed in the reaction zone forming a gap between the gas-cooling liner and the tube wall for injection of a cooling gas with high breakdown voltage and a high arc voltage between the substrate holders and the tube wall.

46. The apparatus of claim 1 including an auxiliary anode disposed downstream or upstream of the cathode.

47. The apparatus of claim 1 including a solid reaction species disposed along the axis of the tube and substrates disposed on an inner wall of the substrate holder.

48. A method of depositing a coating on a substrate, comprising the steps of positioning a substrate in a cylindrical reaction zone within a tube and reducing pressure in the tube, injecting a carrier gas and a plasma-creating gas into the tube upstream of the reaction zone, injecting a reaction species into the tube upstream of the reaction zone and downstream of the injection of the carrier and plasma-creating gases, creating a plurality of electric arcs between one or more cathodes upstream of the reaction zone and one or more anodes, and activating a magnetic field to bias a plasma column created by the arcs toward the substrate, wherein a plurality of axially aligned arcs or a plurality of transversely distributed parallel arcs or both are generated simultaneously with the one or more arcs.

49. The method of claim 48 for synthesizing a coating of diamond, cubic boron nitride or a like material, wherein the carrier gas is argon or another inert gas, the reaction gas comprises hydrogen plus a chemical species including carbon for creating a diamond film or including hydrogen and boron plus nitrogen for creating a cubic boron nitride film, the pressure in the tube being reduced to the range of 10 to 1000 Torr and the specific power of the electric arc being between 0.1 W/cm$^3$ and 50 W/cm$^3$.

50. The method of claim 49 in which the specific power flow from the arc plasma to the substrate is between 0.5 W/cm$^2$ and 100 W/cm$^2$.

51. The method of claim 48 including injecting an alkali metal into the arc plasma to lower the ionization potential of the arc plasma.

52. The method of claim 48 including the step of maintaining a temperature of gas within the reaction zone to a range between one and ten times a temperature of the substrate and an electron temperature between 1 eV and 100 eV.

53. The method of claim 48 for use in the coating of powders.

54. The method of claim 48 in which the substrate is a fibre.

55. The method of claim 48 including the step of creating a plurality of sequential auxiliary arcs each burning in the direction of the main arc.

56. The method of claim 48 including the step of injecting oscillating electromagnetic power into the tube.

57. The method of claim 56 in which the oscillating electromagnetic power comprises repeating momentary pulses with a pulse repetition frequency in the range of 10 Hz to 10 kHz and a pulse signal frequency in the range of 10 kHz to 1 GHz.

58. The method of claim 56 in which the oscillating electromagnetic power comprises negative and/or positive pulses to create a bias voltage at the substrates.

59. The method of claim 56 in which the oscillating electromagnetic power comprises an AC, RF or LF signal with a frequency in the range of 10 Hz to 1 GHz.

60. The method of claim 56 in which the oscillating electromagnetic power comprises a microwave signal with a frequency in the range of 1 GHz to 300 GHz.

61. The method of claim 60 in which a gyration frequency of electrons is equal to the frequency of the microwave signal.

* * * * *